(12) United States Patent
Park et al.

(10) Patent No.: US 12,453,142 B2
(45) Date of Patent: Oct. 21, 2025

(54) SEMICONDUCTOR DEVICE

(71) Applicant: Samsung Electronics Co., Ltd., Suwon-si (KR)

(72) Inventors: Junmo Park, Seoul (KR); Yeonho Park, Seoul (KR); Wangseop Lim, Cheonan-si (KR); Kyubong Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 577 days.

(21) Appl. No.: 17/704,185

(22) Filed: Mar. 25, 2022

(65) Prior Publication Data

US 2023/0066341 A1 Mar. 2, 2023

(30) Foreign Application Priority Data

Aug. 27, 2021 (KR) .......................... 10-2021-0113952

(51) Int. Cl.
*H10D 62/10* (2025.01)
*H10D 62/13* (2025.01)
(Continued)

(52) U.S. Cl.
CPC ......... *H10D 62/115* (2025.01); *H10D 62/151* (2025.01); *H10D 62/235* (2025.01); *H10D 64/691* (2025.01)

(58) Field of Classification Search
CPC ............. H01L 29/0649; H01L 29/0847; H01L 29/1033; H01L 29/517; H01L 29/41766; H01L 21/823807; H01L 21/823814; H01L 21/823821; H01L 21/823842; H01L 27/0924; H01L 29/0673; H01L 29/42392; H01L 29/66439; H01L 29/165; H01L 29/4966; H01L 29/7848; H01L 29/66545; H01L 29/775; H01L 29/78696; H01L 21/823828; H01L 21/823857; H01L 21/823878; H01L 27/092; B82Y 10/00
(Continued)

(56) References Cited

U.S. PATENT DOCUMENTS 9,917,085 B2 3/2018 Lin et al.
9,997,519 B1 * 6/2018 Bao ...................... H10D 30/014
(Continued)

*Primary Examiner* — Eva Y Montalvo
*Assistant Examiner* — Nicholas B Michaud
(74) *Attorney, Agent, or Firm* — Harness, Dickey & Pierce, P.L.C.

(57) ABSTRACT

A semiconductor device includes a substrate including first and second active regions, first and second active patterns on the first and second active regions, and a gate electrode crossing the first and second active patterns. The gate electrode may include first and second electrode portions on the first and second active regions. The first electrode portion may include a first metal pattern and a second metal pattern on the first metal pattern. The second electrode portion may include a third metal pattern and a fourth metal pattern on the third metal pattern. The first metal pattern may include a first line portion and a first vertical portion extended from the first line portion, and the third metal pattern may include a second line portion and a second vertical portion extended from the second line portion. The first and second vertical portions may be in contact with each other.

19 Claims, 37 Drawing Sheets

(51) Int. Cl.
*H10D 62/17* (2025.01)
*H10D 64/68* (2025.01)

(58) Field of Classification Search
USPC .......................................................... 257/30
See application file for complete search history.

(56) References Cited

U.S. PATENT DOCUMENTS

| | | |
|---|---|---|
| 10,103,065 B1 | 10/2018 | Mochizuki et al. |
| 10,177,041 B2 | 1/2019 | Xie et al. |
| 10,410,933 B2 | 9/2019 | Xie et al. |
| 10,566,245 B2 | 2/2020 | Kwon et al. |
| 10,607,896 B2 | 3/2020 | Ragnarsson et al. |
| 10,629,495 B2 | 4/2020 | Seshadri et al. |
| 10,727,067 B2 | 7/2020 | Zang et al. |
| 2007/0075351 A1* | 4/2007 | Schulz ................ H01L 27/1211 257/E21.639 |
| 2015/0349073 A1* | 12/2015 | Kang ................ H01L 29/66621 257/330 |
| 2017/0330801 A1* | 11/2017 | Ragnarsson ...... H01L 21/76895 |
| 2018/0308766 A1* | 10/2018 | Mochizuki ............. B82Y 10/00 |
| 2020/0035605 A1* | 1/2020 | Tsai .................... H01L 23/5226 |
| 2021/0118743 A1 | 4/2021 | Lallement et al. |

\* cited by examiner

SEMICONDUCTOR DEVICE

CROSS-REFERENCE TO RELATED APPLICATIONS

This U.S. non-provisional patent application claims priority under 35 U.S.C. § 119 to Korean Patent Application No. 10-2021-0113952, filed on Aug. 27, 2021, in the Korean Intellectual Property Office, the entire contents of which are hereby incorporated by reference.

BACKGROUND OF THE INVENTION

The present disclosure relates to a semiconductor device, and in particular, to a semiconductor device including a field effect transistor.

Semiconductor devices may include an integrated circuit comprising of metal-oxide-semiconductor field-effect transistors (MOSFETs). To meet an increasing demand for semiconductor devices with a small pattern size and/or a reduced design rule, the MOSFETs are being aggressively scaled down. The scale-down of the MOSFETs may lead to deterioration in operational properties of the semiconductor device. A variety of studies are being conducted to overcome technical limitations associated with the scale-down of the semiconductor device and to realize high-performance semiconductor devices.

SUMMARY

Example embodiments of the inventive concepts provide a semiconductor device with improved electric characteristics.

According to an embodiment of the inventive concepts, a semiconductor device may include a substrate including a first active region, a second active region adjacent to the first active region, and trench between the first active region and the second active region; a device isolation layer filling the trench; a first active pattern on the first active region; a second active pattern on the second active region; and a gate electrode extending to cross the first active pattern and the second active pattern, the gate electrode comprising a first electrode portion on the first active region and a second electrode portion on the second active region. The first electrode portion may comprise a first metal pattern covering the first active pattern and a second metal pattern on the first metal pattern. The second electrode portion may comprise a third metal pattern covering the second active pattern and a fourth metal pattern on the third metal pattern. The first metal pattern may comprise a first line portion and a first vertical portion, the first line portion extending parallel to a top surface of the device isolation layer, and the first vertical portion extending vertically from the first line portion. The third metal pattern may comprise a second line portion and second vertical portion, the second line portion extending parallel to the top surface of the device isolation layer, and the second vertical portion extending vertically from the second line portion. The first vertical portion may contact the second vertical portion.

According to an embodiment of the inventive concepts, a semiconductor device may include a first active pattern and a second active pattern on a substrate; a device isolation layer filling a trench between the first and second active patterns; a first source/drain pattern on the first active pattern; a second source/drain pattern on the second active pattern; a first channel pattern connected to the first source/drain pattern; a second channel pattern connected to the second source/drain pattern; and a gate electrode extending to cross the first and second channel patterns, the gate electrode comprises a first electrode portion on the first active pattern and a second electrode portion on the second active pattern. The first electrode portion many comprise a first metal pattern covering the first active pattern and a second metal pattern on the first metal pattern. The second electrode portion may comprise a third metal pattern covering the second active pattern and a fourth metal pattern on the third metal pattern. The first metal pattern may comprise a first line portion, a first vertical portion, and a protruding portion, the first line portion extending parallel to a top surface of the device isolation layer, the first vertical portion extending vertically from the first line portion, and the protruding portion protruding from the first line portion toward the third metal pattern. The third metal pattern may comprise a second line portion, a second vertical portion, and a stepwise portion, the second line portion extending parallel to the top surface of the device isolation layer, the stepwise portion covering the protruding portion, and the second vertical portion extending vertically from the stepwise portion and vertically overlapping the protruding portion.

According to an embodiment of the inventive concepts, a semiconductor device may include a substrate including a first active region, a second active region adjacent to the first active region in a first direction, and a trench between the first active region and the second active region; a device isolation layer filling the trench; a first active pattern on the first active region; a second active pattern on the second active region; a first source/drain pattern on the first active pattern; a second source/drain pattern on the second active pattern; a first channel pattern connected to the first source/drain pattern, the first channel pattern comprising a first semiconductor pattern, a second semiconductor pattern, and a third semiconductor pattern vertically spaced apart from each other; a second channel pattern connected to the second source/drain pattern, the second channel pattern comprising a first semiconductor pattern, a second semiconductor pattern, and a third semiconductor pattern which are vertically spaced apart from each other; a gate electrode extending in the first direction to cross the first and second channel patterns, the gate electrode comprising a first electrode portion on the first active region, and a second electrode portion on the second active region, the gate electrode comprising, for at least one of the first or second channel patterns, a first portion between the substrate and the first semiconductor pattern, a second portion between the first semiconductor pattern and the second semiconductor pattern, a third portion between the second semiconductor pattern and the third semiconductor pattern, and a fourth portion on the third semiconductor pattern; a gate insulating layer interposed between the first channel pattern and the gate electrode and between the second channel pattern and the gate electrode; a gate spacer on a side surface of the gate electrode; a gate capping pattern on a top surface of the gate electrode; a first interlayer insulating layer on the gate capping pattern; active contacts penetrating the first interlayer insulating layer and coupled to the first and second source/drain patterns, respectively; a gate contact penetrating the first interlayer insulating layer and coupled to the gate electrode; a second interlayer insulating layer on the first interlayer insulating layer; a first metal layer in the second interlayer insulating layer, the first metal layer comprising lower interconnection lines electrically connected to the active contacts and the gate contact, respectively; a third interlayer insulating layer on the second interlayer insulating layer; and a second metal layer provided in the third interlayer insulating layer, the second metal layer comprising upper interconnection lines electrically connected to the lower interconnection lines. The first electrode portion may comprise a first metal pattern covering the first active pattern and a second metal pattern on the first metal pattern. The second electrode portion may comprise a third metal pattern covering the second active pattern and a fourth metal pattern on the third metal pattern. The first metal pattern may comprise a first line portion and first vertical portion, the first line portion extending parallel to a top surface of the device isolation layer, and the first vertical portion extending vertically from the first line portion. The third metal pattern may comprise a second line portion and a second vertical portion, the second line portion extending parallel to the top surface of the device isolation layer, and the second vertical portion extending vertically from the second line portion. The first vertical portion and the second vertical portion may be in contact with each other.

BRIEF DESCRIPTION OF THE DRAWINGS

FIGS. 3A to 16C are sectional views illustrating a method of fabricating a semiconductor device, according to some example embodiments.

FIGS. 3A, 4A, 5A, 6A, 7A, 8A, 9A, 10A, 11A, 12A, 13A, 14A, 15A, and 16A are sectional views taken along the line A-A' of FIG. 1.

FIGS. 3B, 4B, 5D, 6D, 7D, 8D, 9C, 10C, 11C, 12C, 13C, 14C, 15C, and 16C are sectional views taken along the line D-D' of FIG. 1.

DETAILED DESCRIPTION

Some example embodiments will now be described more fully with reference to the accompanying drawings, wherein like reference indicators and/or numerals refer to like elements throughout. Although terms such as "first," "second," and "third" may be used herein to describe various members, components, regions, layers, or sections, these terms are only used to distinguish one member, component, region, layer, or section from another member, component, region, layer, or section. The use of these terms, therefore, does not indicate a specific order and/or orientation, unless indicated otherwise. Thus, a first member, component, region, layer, or section referred to in examples described herein may also be referred to as a second member, component, region, layer, or section without departing from the teachings of the examples.

Spatially relative terms such as "top," "bottom," "vertically," "under," etc. may be used herein for ease of description to describe one element's relationship to another element, e.g., as shown in the figures. Such spatially relative terms are intended to encompass different orientations of the device in use or operation in addition to the orientation depicted in the figures. For example, the device may also be oriented in other ways (for example, turned over, and/or rotated 90 degrees and/or at other orientations), and the spatially relative terms used herein are to be interpreted accordingly.

When the terms "about" or "substantially" are used in this specification in connection with a numerical value, it is intended that the associated numerical value includes a manufacturing and/or operational tolerance (e.g., ±10%) around the numerical value. Thus, while the term "same," "identical," or "equal" is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

Figure 1:
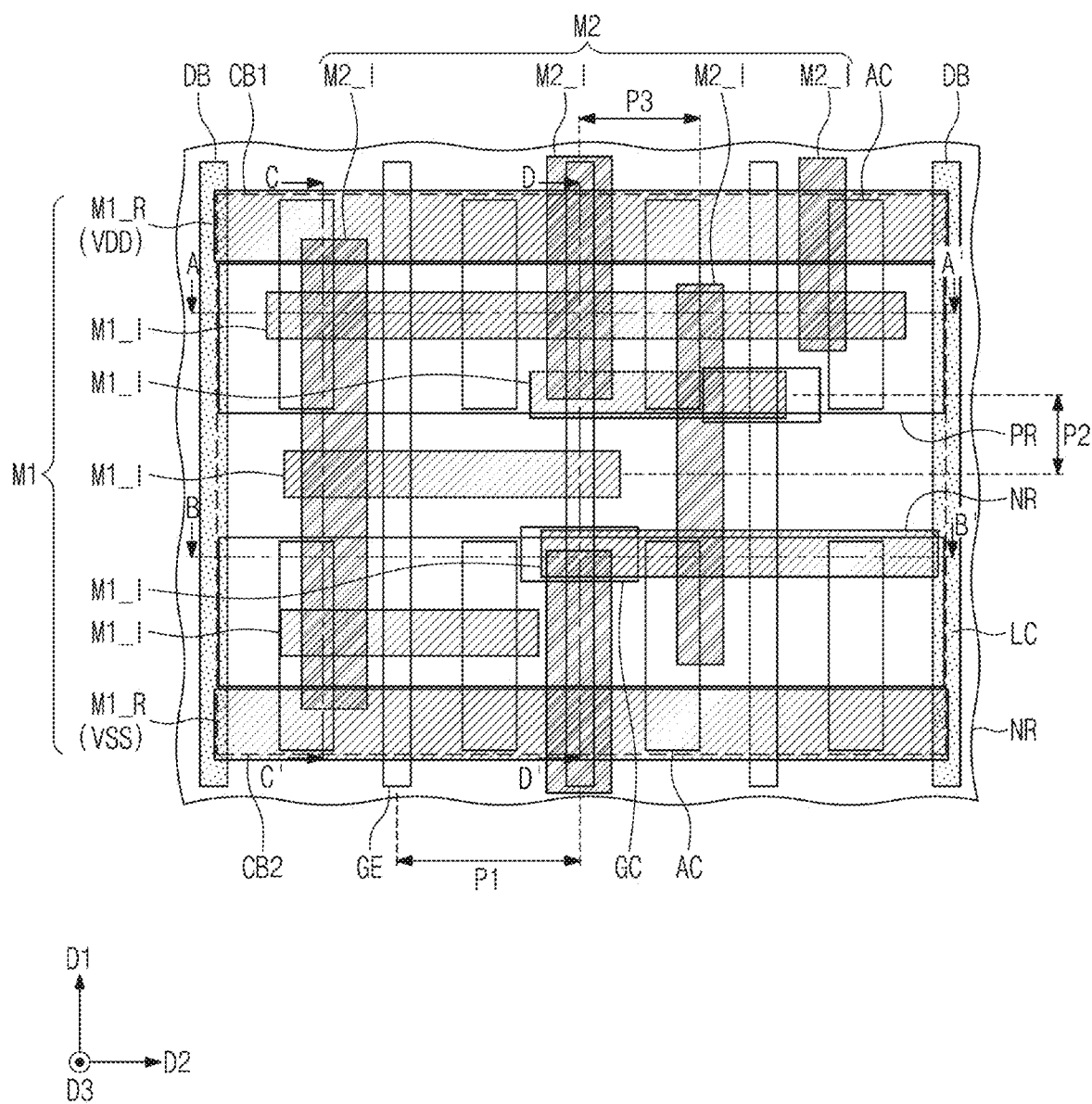
FIG. 1 is a plan view illustrating a semiconductor device according to some example embodiments.

FIG. 1 is a plan view illustrating a semiconductor device according to some example embodiments. FIGS. 2A to 2D are sectional views taken along lines A-A', B-B', C-C', and D-D', respectively, of FIG. 1.

Referring to FIGS. 1 and 2A to 2D, a logic cell LC may be provided on a substrate 100. In the present specification, the logic cell LC may represent (and/or include) a logic device (e.g., an inverter, a flip-flop, and/or the like), which is configured to execute a specific function. For example, the logic cell LC may include transistors constituting the logic device and interconnection lines connecting the transistors to each other.

The substrate 100 may include a first active region PR and a second active region NR. As described below in further detail, in some embodiments, the first active region PR may be a p-type MOSFET (PMOSFET) region, and the second active region NR may be an n-type MOSFET (NMOSFET) region. In some example embodiment, the substrate 100 may be a semiconductor substrate including at least one of silicon, germanium, silicon germanium, a compound semiconductor material, and/or the like. In some example embodiments, the substrate 100 may be a silicon wafer.

The first and second active regions PR and NR may be defined by a second trench TR2, which is formed in an upper portion of the substrate 100. For example, The second trench TR2 may be located between the first and second active regions PR and NR. The first and second active regions PR and NR may be spaced apart from each other, in a first direction D1, with the second trench TR2 interposed therebetween. Each of the first and second active regions PR and NR may be extended in a second direction D2 that is different from the first direction D1.

A first active pattern AP1 and a second active pattern AP2 may be defined by a first trench TR1, which is formed in an upper portion of the substrate 100. The first and second active patterns AP1 and AP2 may be provided on the first and second active regions PR and NR, respectively. The first trench TR1 may be formed on top of the second trench TR2. In some example embodiment, the first trench TR1 may be shallower than the second trench TR2. In some example embodiments, a width the second trench TR1 in the first direction D1 may be smaller than a width of the first trench TR1 in the first direction D1. The first and second active patterns AP1 and AP2 may be extended in the second direction D2. The first and second active patterns AP1 and AP2 may be vertically-protruding portions of the substrate 100.

A device isolation layer ST may be provided to fill the first and second trenches TR1 and TR2. The device isolation layer ST may include an insulator material. For example, the device isolation layer ST may include a silicon oxide layer. Upper portions of the first and second active patterns AP1 and AP2 may protrude vertically above the device isolation layer ST (e.g., see FIG. 2D). For example, the device isolation layer ST may not cover the upper portions of the first and second active patterns AP1 and AP2 (e.g., the upper portions of the first and second active patterns AP1 and AP2 protruding vertically above the device isolation layer ST). The device isolation layer ST may cover lower side surfaces of the first and second active patterns AP1 and AP2.

The first active pattern AP1 may include an upper portion serving as a first channel pattern CH1. The second active pattern AP2 may include an upper portion serving as a second channel pattern CH2. Each of the first and second channel patterns CH1 and CH2 may include a plurality of semiconductor patterns (e.g., a first semiconductor pattern SP1, a second semiconductor pattern SP2, and a third semiconductor pattern SP3), which are sequentially stacked. Though the plurality of semiconductor patterns is illustrated as including three semiconductor patterns, the example embodiments are not limited thereto. For example, the plurality of semiconductor patterns may include more or less than three semiconductor patterns. The plurality of semiconductor patterns (e.g. first to third semiconductor patterns SP1, SP2, and SP3) may be spaced apart from each other in a vertical direction (e.g., a third direction D3).

Each of the plurality of semiconductor patterns (e.g., the first to third semiconductor patterns SP1, SP2, and SP3) may be formed of and/or include an elemental and/or compound semiconductor material (e.g., silicon (Si), germanium (Ge), silicon germanium (SiGe), and/or the like). In some example embodiments, each of the plurality of semiconductor patterns (e.g., the first to third semiconductor patterns SP1, SP2, and SP3) may be formed of and/or include crystalline silicon.

A plurality of first recesses RS1 may be formed in an upper portion of the first active pattern AP1. First source/drain patterns SD1 may be provided in the first recesses RS1, respectively. The first source/drain patterns SD1 may be impurity regions of a first conductivity type (e.g., the p-type). The first channel pattern CH1 may be interposed between each pair of the first source/drain patterns SD1. For example, pairs of the first source/drain patterns SD1 may be connected to each other by the plurality of stacked semiconductor patterns (e.g., the first to third semiconductor patterns SP1, SP2, and SP3).

A plurality of second recesses RS2 may be formed in the upper portion of the second active pattern AP2. Second source/drain patterns SD2 may be provided in the second recesses RS2, respectively. The second source/drain patterns SD2 may be impurity regions of a second conductivity type (e.g., the n-type). The second channel pattern CH2 may be interposed between each pair of the second source/drain patterns SD2. For example, pairs of the second source/drain patterns SD2 may be connected to each other by the plurality of stacked semiconductor patterns (e.g., the first to third semiconductor patterns SP1, SP2, and SP3).

The first and second source/drain patterns SD1 and SD2 may be epitaxial patterns, which are formed by a selective epitaxial growth (SEG) process. As an example, each of the first and second source/drain patterns SD1 and SD2 may have a top surface that is located at substantially the same level as a top surface of the third semiconductor pattern SP3. However, in some example embodiments, the top surface of each of the first and second source/drain patterns SD1 and SD2 may be higher than the top surface of the third semiconductor pattern SP3.

The first source/drain patterns SD1 may include a semiconductor material (e.g., SiGe) having a lattice constant greater than that of the substrate 100. In this case, the pair of the first source/drain patterns SD1 may exert a compressive stress on the first channel patterns CH1 therebetween.

In some example embodiments, the second source/drain patterns SD2 may be formed of and/or include the same semiconductor material (e.g., Si) as the substrate 100. In other example embodiments, the second source/drain patterns SD2 may be formed of and/or include a material containing both of silicon (Si) and carbon (C). For example, the second source/drain patterns SD2 may be formed of or include silicon carbide (SiC). In the case where the second source/drain pattern SD2 is formed of silicon carbide (SiC), a carbon content in the second source/drain pattern SD2 may range from 10 at % to 30 at %. The pair of the second source/drain patterns SD2 containing the silicon carbide (SiC) may exert a tensile stress on the second channel pattern CH2 therebetween.

Each of the first source/drain patterns SD1 may include a first semiconductor layer SEL1 and a second semiconductor layer SEL2, which are sequentially stacked. A sectional shape of the first source/drain pattern SD1 taken parallel to the second direction D2 will be described with reference to FIG. 2A. The first semiconductor layer SEL1 may have a 'U'-shaped section. The first semiconductor layer SEL1 may have a decreasing thickness in an upward direction. The second semiconductor layer SEL2 may be provided on the first semiconductor layer SEL1. A volume of the second semiconductor layer SEL2 may be larger than a volume of the first semiconductor layer SEL1. For example, a ratio of a volume of the second semiconductor layer SEL2 to a total volume of the first source/drain pattern SD1 may be greater than a ratio of a volume of the first semiconductor layer SEL1 to the total volume of the first source/drain pattern SD1.

Each of the first and second semiconductor layers SEL1 and SEL2 may be formed of and/or include the same material (e.g., silicon germanium (SiGe)) but with different compositions. For example, the first semiconductor layer SEL1 may be provided to have a relatively low germanium concentration. However, in some example embodiments, the first semiconductor layer SEL1 may be provided to contain only silicon (Si) and not germanium (Ge). The germanium concentration of the first semiconductor layer SEL1 may range from 0 at % to 10 at %.

The second semiconductor layer SEL2 may be provided to have a relatively high germanium concentration. As an example, the germanium concentration of the second semiconductor layer SEL2 may range from 30 at % to 70 at %. The germanium concentration of the second semiconductor layer SEL2 may increase in the third direction D3. For example, the germanium concentration of the second semiconductor layer SEL2 may be about 40 at % near the first semiconductor layer SEL1 but may be about 60 at % at its top level. Though illustrated as distinct elements, a boundary between the first and second semiconductor layers SEL1 and SEL2 may appear to be indistinct.

The first and second semiconductor layers SEL1 and SEL2 may include p-type impurities (e.g., boron), allowing the first source/drain pattern SD1 to have the p-type conductivity. In some example embodiments, a concentration of impurities in the second semiconductor layer SEL2 (in at %) may be greater than that in the first semiconductor layer SEL1.

The first semiconductor layer SEL1 may prevent a stacking fault from occurring between the substrate 100 and the second semiconductor layer SEL2 and between the first to third semiconductor patterns SP1, SP2, and SP3 and the second semiconductor layer SEL2. The stacking fault may lead to an increase in channel resistance, but due to the first semiconductor layer SEL1, it may be possible to prevent and/or reduce the potential for the stacking fault and thereby improve the reliability and/or electric characteristics of the semiconductor device.

The first semiconductor layer SEL1 may protect the second semiconductor layer SEL2, in a process of replacing sacrificial layers SAL, which will be described below, with first to third portions PO1, PO2, and PO3 of a gate electrode GE. For example, the first semiconductor layer SEL1 may prevent the second semiconductor layer SEL2 from being undesirably etched by an etching material, which is used to remove the sacrificial layers SAL.

The gate electrodes GE may be provided to cross the first and second active patterns AP1 and AP2 and to extend in the first direction D1. The gate electrodes GE may be arranged with a first pitch P1 in the second direction D2. Each of the gate electrodes GE may be overlapped with the first and second channel patterns CH1 and CH2, when viewed in a plan view.

The gate electrode GE may include a first electrode portion GEP1 on the first active region PR and a second electrode portion GEP2 on the second active region NR. Each of the first and second electrode portions GEP1 and GEP2 of the gate electrode GE may include a first portion PO1 interposed between the substrate 100 and the first semiconductor pattern SP1, a second portion PO2 interposed between the first semiconductor pattern SP1 and the second semiconductor pattern SP2, a third portion PO3 interposed between the second semiconductor pattern SP2 and the third semiconductor pattern SP3, and a fourth portion PO4 on the third semiconductor pattern SP3.

Referring back to FIG. 2A, the first to third portions PO1, PO2, and PO3 of the first electrode portion GEP1 may have different widths from each other. For example, the largest width of the third portion PO3 in the second direction D2 may be larger than the largest width of the second portion PO2 in the second direction D2, and/or the largest width of the first portion PO1 in the second direction D2 may be larger than the largest width of the third portion PO3 in the second direction D2.

Figure 2A:
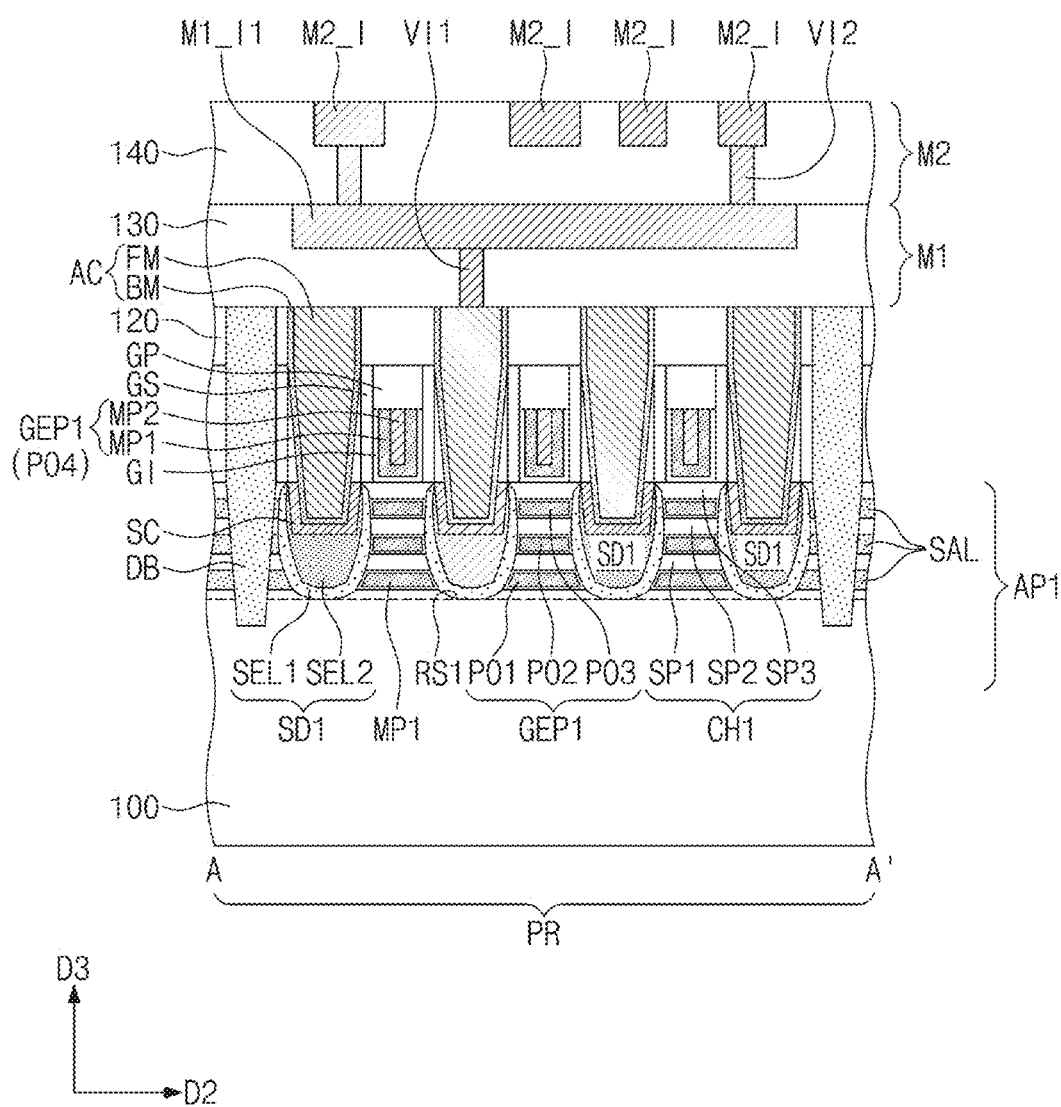
FIGS. 2A to 2D are sectional views taken along lines A-A', B-B', C-C', and D-D', respectively, of FIG. 1.
Figure 2B:
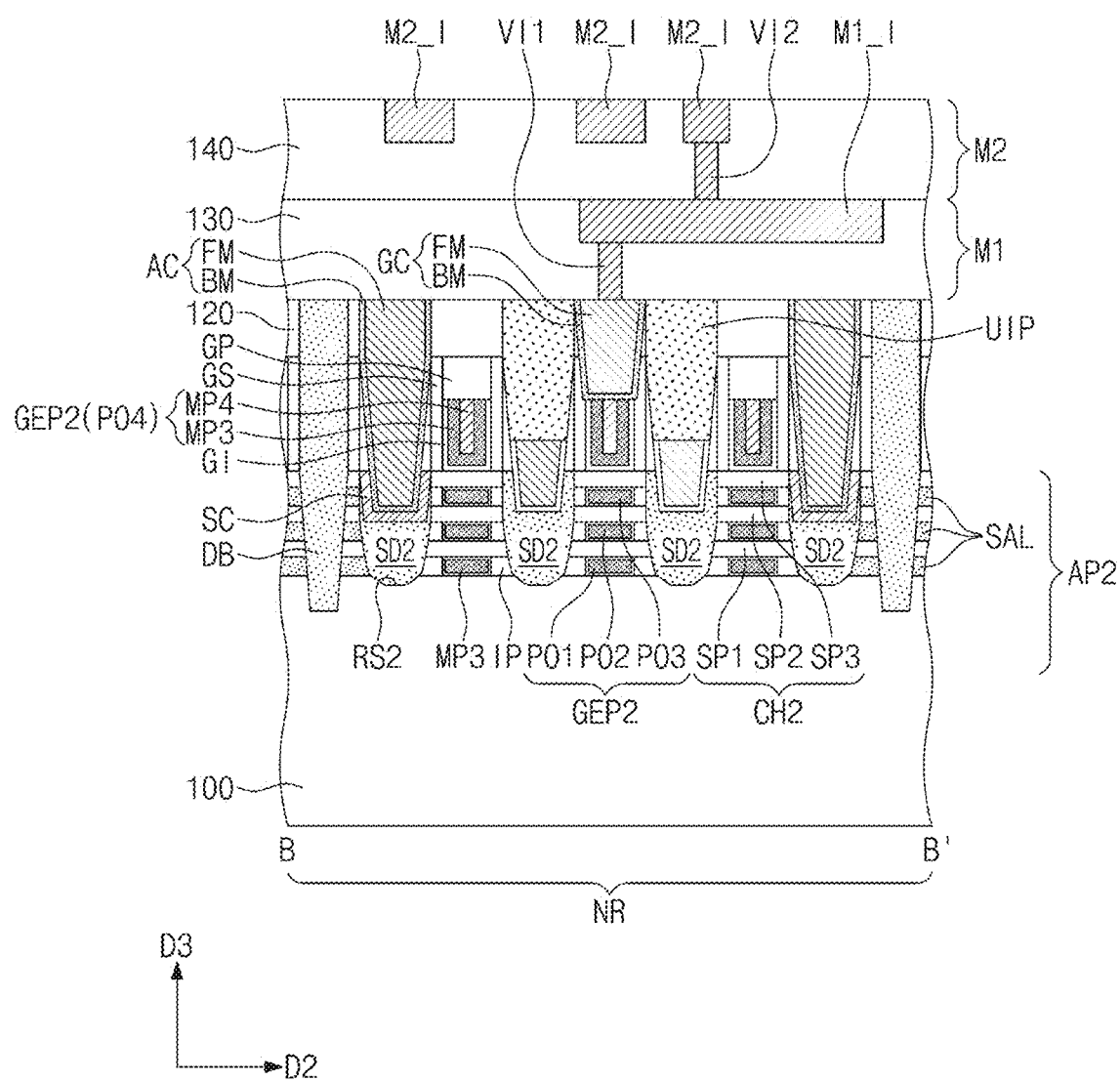
Figure 2C:
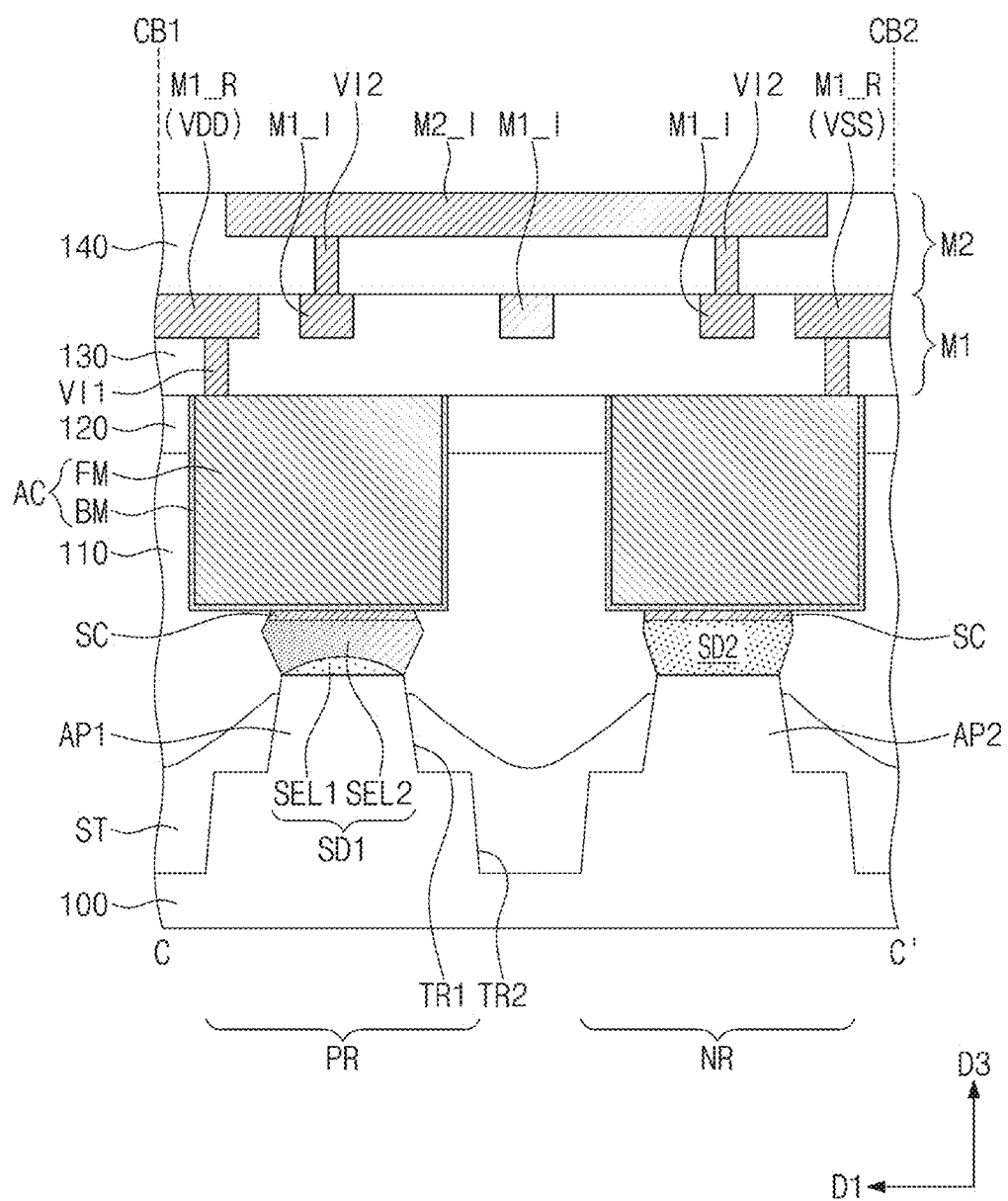
Figure 2D:
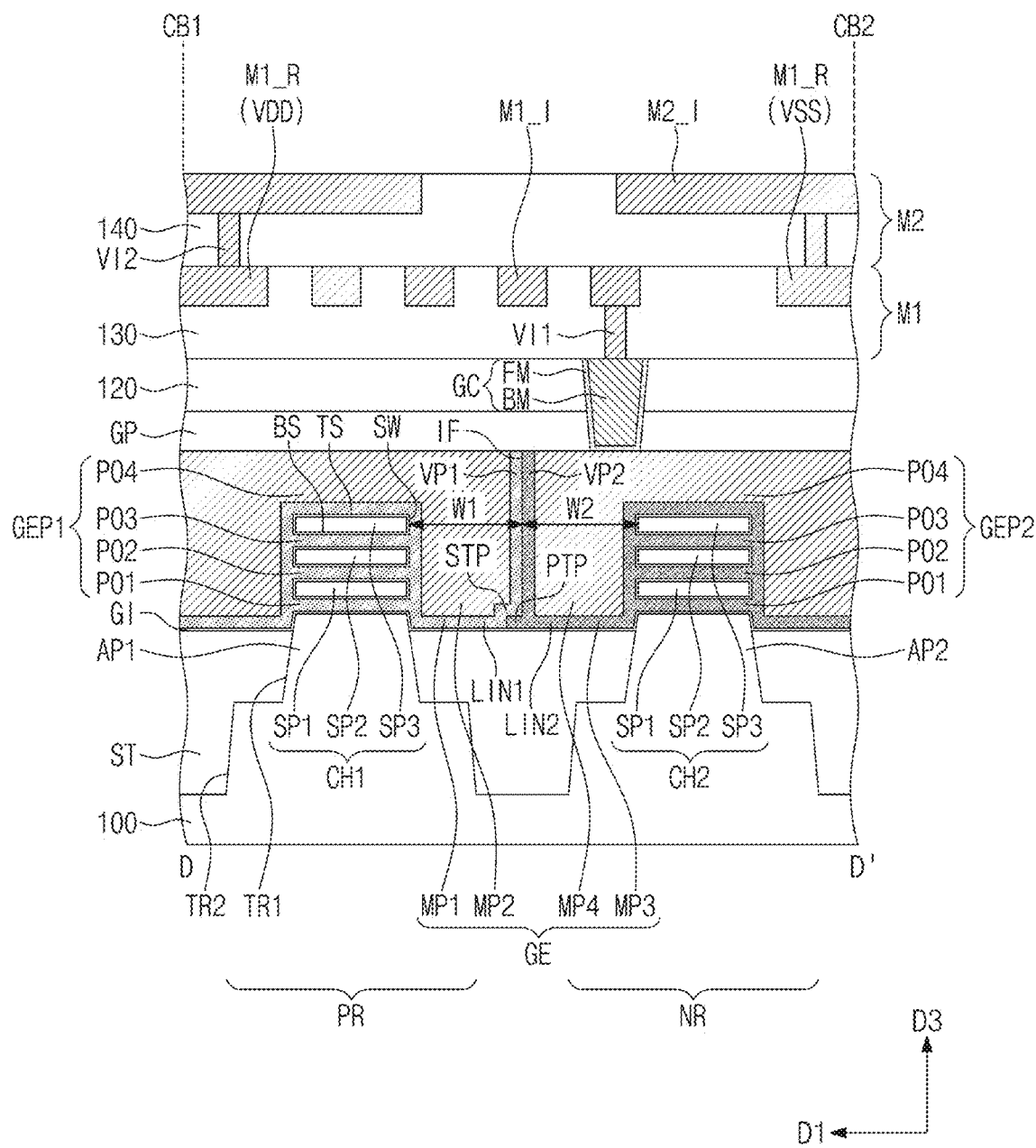

Referring to FIG. 2D, the gate electrode GE may be provided on a top surface TS, a bottom surface BS, and opposite side surfaces SW of each of the plurality of semiconductor patterns (e.g., the first to third semiconductor patterns SP1, SP2, and SP3). For example, the logic transistor may be a three-dimensional field-effect transistor (e.g., a multi-bridge channel field-effect transistor (MBCFET)), in which the gate electrode GE is provided to three-dimensionally surround the channel pattern.

Referring back to FIGS. 1 and 2A to 2D, a pair of gate spacers GS may be respectively disposed on opposite side surfaces of the fourth portion PO4 of the gate electrode GE. The gate spacers GS may be extended along the gate electrode GE and in the first direction D1. Top surfaces of the gate spacers GS may be higher than a top surface of the gate electrode GE. The top surfaces of the gate spacers GS may be coplanar with a top surface of a first interlayer insulating layer 110, which will be described below. The gate spacers GS may be formed of and/or include an insulating material such as at least one of SiCN, SiCON, and/or SiN. In some example embodiments, the gate spacers GS may have a multi-layered structure including at least two layers, each of which is made of the insulating material (e.g., SiCN, SiCON, SiN, and/or the like).

A gate capping pattern GP may be provided on the gate electrode GE. The gate capping pattern GP may be extended along the gate electrode GE and in the first direction D1. The gate capping pattern GP may be formed of and/or include a material having an etch selectivity with respect to first and second interlayer insulating layers 110 and 120, which will be described below. For example, the gate capping patterns GP may be formed of and/or include at least one of SiON, SiCN, SiCON, and/or SiN.

A gate insulating layer GI may be interposed between the gate electrode GE and the first channel pattern CH1 and between the gate electrode GE and the second channel pattern CH2. The gate insulating layer GI may cover the top surface TS, the bottom surface BS, and the opposite side surfaces SW of each of the first to third semiconductor patterns SP1, SP2, and SP3. The gate insulating layer GI may cover the top surface of the device isolation layer ST below the gate electrode GE (e.g., see FIG. 2D).

In some embodiment, the gate insulating layer GI may be formed of and/or include an insulating material such SiO, SiON, a high-k dielectric material, and/or the like. For example, the gate insulating layer GI may include a silicon oxide layer, a silicon oxynitride layer, and/or a high-k dielectric layer. The high-k dielectric layer may be formed of and/or include at least one high-k dielectric material whose dielectric constant is higher than that of silicon oxide. As an example, the high-k dielectric materials may be formed of and/or include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, and/or the like.

In some example embodiments, the semiconductor device may include a negative capacitance (NC) FET using a negative capacitor. For example, the gate insulating layer GI may include a ferroelectric layer exhibiting a ferroelectric material property and a paraelectric layer exhibiting a paraelectric material property.

The ferroelectric layer may have a negative capacitance. The paraelectric layer may have a positive capacitance. In the case where two or more capacitors are connected in series and each capacitor has a positive capacitance, a total capacitance may be less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), e.g., less than 60 mV/decade, at the room temperature.

The ferroelectric layer may have a ferroelectric material property. The ferroelectric layer may be formed of and/or include a material having the ferroelectric material property. The material having the ferroelectric material property may be at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be a compound composed of hafnium (HD, zirconium (Zr), and/or oxygen (O).

The ferroelectric layer may further include dopants. The dopant may be selected based on the effect of the dopant on, e.g., at least one characteristic of the material (e.g., stability, polarity etc.) and/or to promote a material phase having the ferroelectric characteristics. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

For example, in the case where the ferroelectric layer includes hafnium oxide, the dopants in the ferroelectric layer may include at least one of gadolinium (Gd), silicon (Si), zirconium (Zr), aluminum (Al), and/or yttrium (Y).

The amount of dopant may be less than the amount of another constituent and/or constituents. For example, in the case where the compound is hafnium oxide (HfO) and the dopant is (and/or includes) aluminum (Al), a content of aluminum in the ferroelectric layer may range from 3 to 8 at % (atomic percentage). Here, the content of the dopants may be a ratio of the number of dopant (e.g., aluminum) atoms to the number of hafnium and dopant (e.g., aluminum) atoms.

In the case where the dopant is (and/or includes) silicon (Si), a content of silicon in the ferroelectric layer may range from 2 at % to 10 at %. In the case where the dopants are yttrium (Y), a content of yttrium in the ferroelectric layer may range from 2 at % to 10 at %. In the case where the dopants are gadolinium (Gd), a content of gadolinium in the ferroelectric layer may range from 1 at % to 7 at %. In the case where the dopants are zirconium (Zr), a content of zirconium in the ferroelectric layer may range from 50 at % to 80 at %.

The paraelectric layer may have a paraelectric material property. For example, the paraelectric layer may be formed of and/or include a material having the paraelectric material property. The material having the paraelectric material property may include at least one of, for example, silicon oxide and/or high-k metal oxides. The metal oxides, which can be used as the paraelectric layer, may include at least one of, for example, hafnium oxide, zirconium oxide, and/or aluminum oxide, but the example embodiments are not limited to these examples.

The ferroelectric layer and the paraelectric layer may be formed of and/or include some of the same materials. For example, although the ferroelectric material layer and the paraelectric material layer may include the same material, the ferroelectric layer may have the ferroelectric material property, but the paraelectric layer may not have the ferroelectric material property. For example, in the case where the ferroelectric and paraelectric layers both contain hafnium oxide, a crystal structure of the hafnium oxide in the ferroelectric layer may be different from a crystal structure of the hafnium oxide in the paraelectric layer. The difference in crystal structures may be, for example, a result of the type of dopants included in the ferroelectric layer and/or the paraelectric layer and/or a result of different stresses and/or strains induced by (and/or with) neighboring structures.

The ferroelectric layer may exhibit the ferroelectric material property, only when it is in a specific range of thickness. For example, the ferroelectric layer may have a thickness within a threshold thickness range for the ferroelectric characteristics. In some example embodiments, for example, the ferroelectric layer may have a thickness ranging from 0.5 to 10 nm, but the example embodiments are not limited to this example. For example, since a critical thickness associated with the occurrence of the ferroelectric material property varies depending on the kind of the ferroelectric material, the thickness of the ferroelectric layer may be changed depending on the kind of the ferroelectric material.

In some example embodiments, the gate insulating layer GI may include a single ferroelectric layer and/or a plurality of ferroelectric layers spaced apart from each other. The gate insulating layer GI may have a multi-layered structure, in which a plurality of ferroelectric layers and a plurality of paraelectric layers are alternately stacked.

The first electrode portion GEP1 of the gate electrode GE may include a first metal pattern MP1 and a second metal pattern MP2 on the first metal pattern MP1. The first metal pattern MP1 may cover the first active pattern AP1. For example, the first metal pattern MP1 may be provided on the gate insulating layer GI and may be adjacent to the first to third semiconductor patterns SP1, SP2, and SP3. The first metal pattern MP1 may include a work-function metal, which can be used to adjust a threshold voltage of the transistor. By adjusting a thickness and/or composition of the first metal pattern MP1, it may be possible to tune a transistor to a desired threshold voltage. For example, the first to third portions PO1, PO2, and PO3 of the first electrode portion GEP1 may be composed of the first metal pattern MP1 and/or the work function metal.

The first metal pattern MP1 may be formed of and/or include at least one metal nitride. For example, the first metal pattern MP1 may be formed of and/or include as nitrogen and, as the metallic material, at least one titanium (Ti), tantalum (Ta), aluminum (Al), tungsten (W), and/or molybdenum (Mo). Furthermore, the first metal pattern MP1 may further include carbon (C). The first metal pattern MP1 may include a plurality of work function metal layers which are stacked.

The second metal pattern MP2 may be formed of and/or include a metallic material whose resistance is lower than that of the first metal pattern MP1. For example, the second metal pattern MP2 may be formed of and/or include at least one metallic material, such as tungsten (W), aluminum (Al), titanium (Ti), tantalum (Ta), and/or the like. For example, the fourth portion PO4 of the first electrode portion GEP1 may include the first metal pattern MP1 and the second metal pattern MP2 on the first metal pattern MP1.

The second electrode portion GEP2 of the gate electrode GE may include a third metal pattern MP3 and a fourth metal pattern MP4 on the third metal pattern MP3. The third metal pattern MP3 may cover the second active pattern AP2. For example, the third metal pattern MP3 may be provided on the gate insulating layer GI and may be adjacent to the first to third semiconductor patterns SP1, SP2, and SP3. The third metal pattern MP3 may include a work function metal, which adjusts a threshold voltage of a transistor. As described above, by adjusting a thickness and/or composition of the third metal pattern MP3, it may be possible to tune a transistor to a desired threshold voltage. For example, the first to third portions PO1, PO2, and PO3 of the second electrode portion GEP2 may be composed of the third metal pattern MP3 and/or the work function metal.

The third metal pattern MP3 may be formed of or include at least one of metal nitride. The metal nitride of the third metal pattern MP3 may be the same and/or different from the metal nitride of the first metal pattern MP1. For example, the third metal pattern MP3 may be formed of and/or include nitrogen (N) and, as a metallic material, at least one of titanium (Ti), tantalum (Ta), aluminum (Al), tungsten (W) and/or molybdenum (Mo). Furthermore, the third metal pattern MP3 may further include carbon (C). The third metal pattern MP3 may include a plurality of work-function metal layers, which are stacked.

The fourth metal pattern MP4 may be formed of and/or include a metallic material whose resistance is lower than that of the third metal pattern MP3. The metallic material of the fourth metal pattern MP4 may be the same and/or different from the metallic material of the second metal pattern MP2. For example, the fourth metal pattern MP4 may be formed of and/or include at least one of tungsten (W), aluminum (Al), titanium (Ti), and/or tantalum (Ta). For example, the fourth portion PO4 of the second electrode portion GEP2 may include the third metal pattern MP3 and the fourth metal pattern MP4 on the third metal pattern MP3.

The first metal pattern MP1 may include a first line portion LIN1, which is extended to a region on the device isolation layer ST between the first and second active regions PR and NR. The first line portion LIN1 may be extended parallel to the top surface of the device isolation layer ST. The first line portion LIN1 may be interposed between a bottom surface of the second metal pattern MP2 and the gate insulating layer GI.

The third metal pattern MP3 may include a second line portion LIN2, which is extended to a region on the device isolation layer ST between the first and second active regions PR and NR. The second line portion LIN2 may be extended parallel to the top surface of the device isolation layer ST. The second line portion LIN2 may be interposed between a bottom surface of the fourth metal pattern MP4 and the gate insulating layer GI.

The third metal pattern MP3 may further include a protruding portion PTP, which protrudes from the second line portion LIN2 toward the first metal pattern MP1. The protruding portion PTP may be in contact with the first line portion LIN1. The protruding portion PTP may be in contact with the gate insulating layer GI.

The first metal pattern MP1 may further include a stepwise portion STP covering the protruding portion PTP. The stepwise portion STP may be extended from the first line portion LIN1 to cover the protruding portion PTP. The stepwise portion STP may be located at a level higher than the first line portion LIN1. The protruding portion PTP may be interposed between the stepwise portion STP and the gate insulating layer GI.

The first metal pattern MP1 may further include a first vertical portion VP1 which is extended from the first line portion LIN1 and the stepwise portion STP vertically (e.g., in the third direction D3). Each of the first vertical portion VP1 and the stepwise portion STP may be vertically overlapped with the protruding portion PTP.

The third metal pattern MP3 may include a second vertical portion VP2 which is extended from the second line portion LIN2 vertically (e.g., in the third direction D3). The first vertical portion VP1 may be in contact with the second vertical portion VP2. The first vertical portion VP1 and the second vertical portion VP2 may be interposed between the second metal pattern MP2 and the fourth metal pattern MP4. For example, the second metal pattern MP2 may be spaced apart from the fourth metal pattern MP4 by the first vertical portion VP1 and the second vertical portion VP2. The first vertical portion VP1 may be interposed between the second metal pattern MP2 and the second vertical portion VP2. The second vertical portion VP2 may be interposed between the fourth metal pattern MP4 and the first vertical portion VP1.

A distance, in the first direction D1, between the first channel pattern CH1 and an interface IF between the first vertical portion VP1 and the second vertical portion VP2 may be a first distance W1. A distance, in the first direction D1, between the interface IF and the second channel pattern CH2 may be a second distance W2. The first distance W1 may be the smallest distance between the first channel pattern CH1 and the second vertical portion VP2. The second distance W2 may be the smallest distance between the second channel pattern CH2 and the first vertical portion VP1. The first distance W1 may be substantially equal to the second distance W2. As an example, a ratio of the second distance W2 to the first distance W1 may range from 0.9 to 1.1.

When a work function metal is formed on each of the first and second active regions PR and NR, a wet etching process may be performed to etch a portion of the work function metal. In the case where there is infiltration of an etching solution and/or a patterning failure of an etch mask in this step, the work function metal may be improperly (e.g., excessively and/or insufficiently) etched. Accordingly, a boundary between the work function metals on the first and second active regions PR and NR may not be formed at a desired position, and in this case, it may be difficult to realize a desired threshold voltage of a transistor. In this case, the electric characteristics of the semiconductor device may be deteriorated.

By contrast, according to some example embodiments of the inventive concepts, by using a dummy gate and an etch stop layer, it may be possible to form the work function metal (e.g., the first and third metal patterns MP1 and MP3) in a manner of filling an empty space. In these cases, it may be possible to prevent the afore-described problems. As a result, the semiconductor device may have improved electric characteristics.

The first and third metal patterns MP1 and MP3 may be formed of and/or include different materials from each other. As an example, the first metal pattern MP1 may be formed of or include titanium nitride, and the third metal pattern MP3 may be formed of or include titanium aluminum nitride. As another example, the first and third metal patterns MP1 and MP3 may be formed of or include the same material. For example, both of the first and third metal patterns MP1 and MP3 may include titanium aluminum nitride, but the aluminum concentrations of the first and third metal patterns MP1 and MP3 may be different from each other. In some example embodiments, the first and third metal patterns MP1 and MP3 may have substantially the same thickness. In other example embodiments, the first and third metal patterns MP1 and MP3 may have different thicknesses from each other, as will be described below. In some example embodiments, the second and fourth metal patterns MP2 and MP4 may be formed of and/or include the same material and/or may be formed of and/or include different materials from each other.

According to some example embodiments, the first electrode portion GEP1 and the second electrode portion GEP2 may be independently formed, as will be described below. In this case, it may be possible to easily control a material, composition, a thickness, and/or the like of each of the first and third metal patterns MP1 and MP3 and/or a material, a composition, a thickness, and/or the like of each of the second and fourth metal patterns MP2 and MP4. As a result, the transistors on the first and second active regions PR and NR may be more easily fabricated to have their respective desired threshold voltages.

The first interlayer insulating layer 110 may be provided on the substrate 100. The first interlayer insulating layer 110 may cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS. A second interlayer insulating layer 120 may be disposed on the first interlayer insulating layer 110 to cover the gate capping pattern GP. In some example embodiments, at least one of the first and second interlayer insulating layers 110 and 120 may include an insulating layer, such as a silicon oxide layer.

A pair of division structures DB, which are opposite to each other in the second direction D2, may be provided at both sides of the logic cell LC. The division structure DB may be extended in the first direction D1 to be parallel to the gate electrodes GE. A pitch between the division structure DB and the gate electrode GE adjacent to each other may be equal to the first pitch P1.

The division structure DB may be provided to penetrate the first and second interlayer insulating layers 110 and 120 and may be extended into the first and second active patterns AP1 and AP2. The division structure DB may be provided to penetrate an upper portion of each of the first and second active patterns AP1 and AP2. The division structure DB may separate the first and second active regions PR and NR of the logic cell LC from the active regions of a neighboring logic cell.

The upper portion of each of the first and second active patterns AP1 and AP2 may further include the sacrificial layers SAL which are provided adjacent to the division structure DB. The sacrificial layers SAL may be stacked to be spaced apart from each other. Each of the sacrificial layers SAL may be located at the same level as a corresponding one of the first to third portions PO1, PO2, and PO3 of the gate electrode GE. The division structure DB may be provided to penetrate the sacrificial layers SAL. Inner spacers IP may be interposed between the sacrificial layers SAL and the second source/drain pattern SD2. As an example, the inner spacers IP may be formed of and/or include an insulating material such as silicon nitride.

Active contacts AC may be provided to penetrate the first and second interlayer insulating layers 110 and 120 and may be electrically connected to the first and second source/drain patterns SD1 and SD2, respectively. A pair of the active contacts AC may be respectively provided at both sides of the gate electrode GE. When viewed in a plan view, the active contact AC may be a bar-shaped pattern extending in the first direction D1. The active contact AC may be a self-aligned contact. For example, the active contact AC may be formed by a self-alignment process using the gate capping pattern GP and the gate spacer GS. In some example embodiments, the active contact AC may cover at least a portion of the side surface of the gate spacer GS. Although not shown, the active contact AC may be provided to cover a portion of the top surface of the gate capping pattern GP.

Silicide patterns SC may be respectively interposed between the active contact AC and the first source/drain pattern SD1 and between the active contact AC and the second source/drain pattern SD2. The active contact AC may be electrically connected to the source/drain pattern SD1 or SD2 through the silicide pattern SC. The silicide pattern SC may be formed of and/or include at least one metal silicide material (e.g., titanium silicide, tantalum silicide, tungsten silicide, nickel silicide, cobalt silicide, and/or the like).

A gate contact GC may be provided to penetrate the second interlayer insulating layer 120 and the gate capping pattern GP and may be electrically connected to the gate electrode GE. Referring to FIG. 2B, an upper region of each of the active contacts AC adjacent to the gate contact GC may be filled with an upper insulating pattern UIP. Accordingly, it may be possible to prevent and/or reduce the potential for a process failure (e.g., a short circuit), which may occur when the gate contact GC is in contact with the active contact AC adjacent thereto.

Each of the active and gate contacts AC and GC may include a conductive pattern FM and a barrier pattern BM enclosing the conductive pattern FM. For example, the conductive pattern FM may be formed of or include at least one metallic material (e.g., aluminum, copper, tungsten, molybdenum, cobalt, and/or the like). The barrier pattern BM may be provided to cover side and bottom surfaces of the conductive pattern FM. In some example embodiments, the barrier pattern BM may include a metal layer and a metal nitride layer. The metal layer may be formed of and/or include at least one of titanium, tantalum, tungsten, nickel, cobalt, and/or platinum. The metal nitride layer may be formed of and/or include at least one of titanium nitride (TiN), tantalum nitride (TaN), tungsten nitride (WN), nickel nitride (NiN), cobalt nitride (CoN), and/or platinum nitride (PtN).

A first metal layer M1 may be provided in a third interlayer insulating layer 130. The first metal layer M1 may include first lower interconnection lines M1_R, second lower interconnection lines M1_I, and lower vias VI1. The lower vias VI1 may be provided below the first and second lower interconnection lines M1_R and M1_I.

Each of the first lower interconnection lines M1_R may be extended in the second direction D2 to cross the logic cell LC. Each of the first lower interconnection lines M1_R may be a power line. For example, a drain voltage VDD and/or a source voltage VSS may be applied to the first lower interconnection line M1_R.

Referring to FIG. 1, a first cell boundary CB1 extending in the second direction D2 may be defined in a region of the logic cell LC. A second cell boundary CB2 extending in the second direction D2 may be defined in a region of the logic cell LC opposite to the first cell boundary CB1. The first lower interconnection line M1_R, to which the drain voltage VDD (e.g., a power voltage) is applied, may be disposed on the first cell boundary CB1. The first lower interconnection line M1_R, to which the drain voltage VDD is applied, may be extended along the first cell boundary CB1 and in the second direction D2. The first lower interconnection line M1_R, to which the source voltage VSS (e.g., a ground voltage) is applied, may be disposed on the second cell boundary CB2. The first lower interconnection line M1_R, to which the source voltage VSS is applied, may be extended along the second cell boundary CB2 and in the second direction D2.

The second lower interconnection lines M1_I may be disposed between the first lower interconnection lines M1_R, to which the drain voltage VDD and the source voltage VSS are respectively applied, in the first direction D1. Each of the second lower interconnection lines M1_I may be a line and/or bar-shaped pattern extending in the second direction D2. The second lower interconnection lines M1_I may be arranged with a second pitch P2 in the first direction D1. The second pitch P2 may be smaller than the first pitch P1.

The lower vias VI1 may be provided below the first and second lower interconnection lines M1_R and M1_I of the first metal layer M1. The lower vias VI1 may be respectively interposed between the active contacts AC and the first and second lower interconnection lines M1_R and M1_I. The lower vias VI1 may be respectively interposed between the gate contacts GC and the second lower interconnection lines M1_I.

The lower interconnection line M1_R and/or M1_I of the first metal layer M1 and the lower via VI1 thereunder may be formed by separate processes. For example, each of the lower interconnection line M1_R and/or M1_I and the lower via VI1 may be formed by a single damascene process. The semiconductor device, according to some example embodiments, may be fabricated using a sub-20 nm process.

A second metal layer M2 may be provided in a fourth interlayer insulating layer 140. The second metal layer M2 may include upper interconnection lines M2_I. Each of the upper interconnection lines M2_I may be a line and/or bar-shaped pattern extending in the first direction D1. For example, the upper interconnection lines M2_I may be extended in the first direction D1 to be parallel to each other. When viewed in a plan view, the upper interconnection lines M2_I may be parallel to the gate electrodes GE. The upper interconnection lines M2_I may be arranged with a third pitch P3 in the second direction D2. The third pitch P3 may be smaller than the first pitch P1. The third pitch P3 may be larger than the second pitch P2.

The second metal layer M2 may further include upper vias VI2. The upper vias VI2 may be provided below the upper interconnection lines M2_I. The upper vias VI2 may be respectively interposed between the lower interconnection lines M1_R and M1_I and the upper interconnection lines M2_I.

The upper interconnection line M2_I of the second metal layer M2 and the upper via VI2 thereunder may be formed by the same process and may form a single object. For example, the upper interconnection line M2_I of the second metal layer M2 and the upper via VI2 may be formed together by a dual damascene process.

The lower interconnection lines M1_R and M1_I of the first metal layer M1 and the upper interconnection lines M2_I of the second metal layer M2 may be formed of and/or include the same material and/or different conductive materials. For example, the lower interconnection lines M1_R and M1_I and the upper interconnection lines M2_I may be formed of or include at least one metallic material (e.g., aluminum, copper, tungsten, molybdenum, or cobalt).

In some example embodiments, although not shown, additional metal layers (e.g., M3, M4, M5, and so forth) may be further stacked on the fourth interlayer insulating layer 140. Each of the stacked metal layers may include routing lines.

In the semiconductor device according to some example embodiments, the gate electrode GE, which is disposed to cross both regions (e.g., PR and NR) having different properties, may include the metal patterns MP1 to MP4 which are formed to have materials and structures suitable for required characteristics of each region (e.g., PR or NR), thus, it may be possible to optimize performance of the semiconductor device. Accordingly, it may be possible to improve electric characteristics of the semiconductor device.

FIGS. 3A to 16C are sectional views illustrating a method of fabricating a semiconductor device, according to an embodiment of the inventive concept. FIGS. 3A, 4A, 5A, 6A, 7A, 8A, 9A, 10A, 11A, 12A, 13A, 14A, 15A, and 16A are sectional views taken along the line A-A of FIG. 1. FIGS. 5B, 6B, 7B, 8B, 9B, 10B, 11B, 12B, 13B, 14B, 15B, and 16B are sectional views taken along the line B-B' of FIG. 1. FIGS. 5C, 6C, 7C, and 8C are sectional views taken along the line C-C' of FIG. 1. FIGS. 3B, 4B, 5D, 6D, 7D, 8D, 9C, 10C, 11C, 12C, 13C, 14C, 15C, and 16C are sectional views taken along the line D-D' of FIG. 1.

Figure 3A:
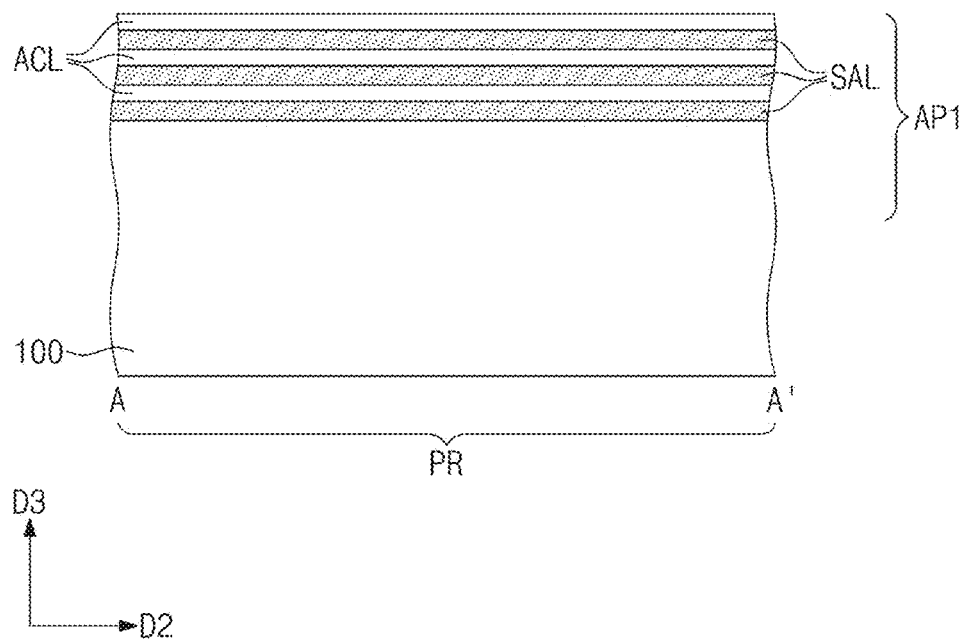
Figure 3B:
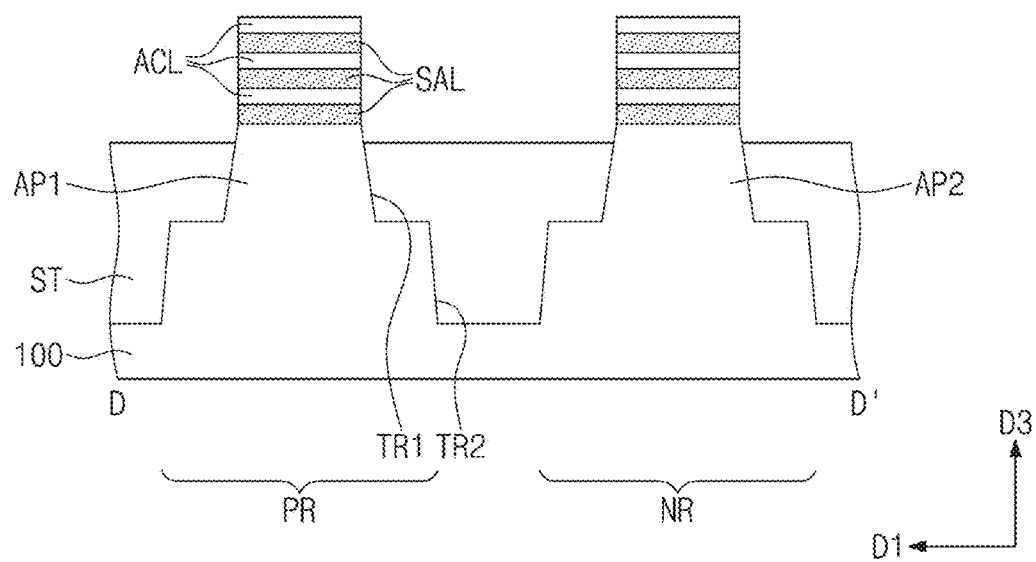

Referring to FIGS. 3A and 3B, the substrate 100 including the first and second active regions PR and NR may be provided. Sacrificial layers SAL and active layers ACL may be alternately stacked on the substrate 100. The sacrificial layers SAL may be formed of and/or include one of silicon (Si), germanium (Ge), and silicon germanium (SiGe), and the active layers ACL may be formed of and/or include another one of silicon (Si), germanium (Ge), and silicon germanium (SiGe).

For example, the sacrificial layers SAL may be formed of and/or include silicon germanium (SiGe), and the active layers ACL may be formed of and/or include silicon (Si).

Mask patterns may be respectively formed on the first and second active regions PR and NR of the substrate 100. The mask pattern may be and/or include a line and/or bar-shaped pattern extending in the second direction D2.

A first patterning process, in which the mask patterns are used as an etch mask, may be performed to form the first trench TR1 defining the first and second active patterns AP1 and AP2. The first and second active patterns AP1 and AP2 may be formed on the first and second active regions PR and NR, respectively. Each of the first and second active patterns AP1 and AP2 may include the sacrificial layers SAL and the active layers ACL, which are alternately stacked in an upper portion thereof.

A second patterning process may be performed on the substrate 100 to form the second trench TR2 defining the first and second active regions PR and NR. The second trench TR2 may be formed to have a depth that is larger than that of the first trench TR1. For example, the second trench TR2 may be formed in a lower surface of and/or under the first trench TR1.

The device isolation layer ST may be formed on the substrate 100 to fill the first and second trenches TR1 and TR2. For example, an insulating layer may be formed on the substrate 100 to cover the first and second active patterns AP1 and AP2, and the device isolation layer ST may be formed from the insulating layer by recessing the insulating layer until the sacrificial layers SAL, and the active layers ACL (and/or a portion of the first and second active patterns AP1 and AP2) are exposed.

The device isolation layer ST may be formed of and/or include at least one insulating material (e.g., silicon oxide). Each of the first and second active patterns AP1 and AP2 may include an upper portion protruding above the device isolation layer ST. For example, the upper portion of each of the first and second active patterns AP1 and AP2 may be a protruding pattern, which is vertically extended above the device isolation layer ST.

Figure 4A:
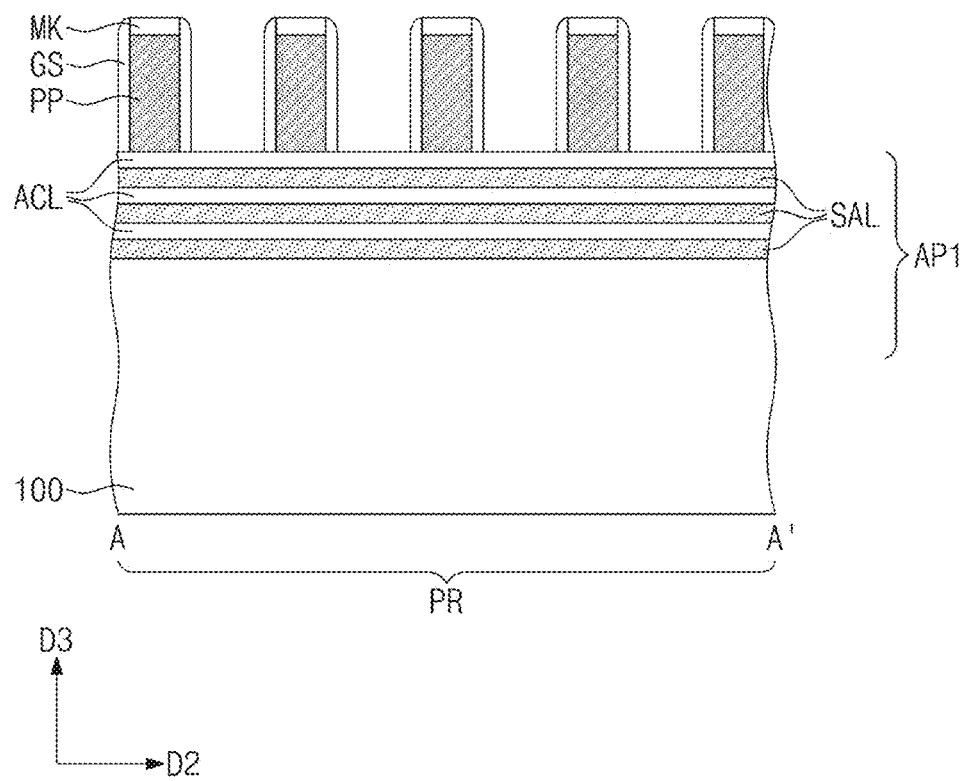
Figure 4B:
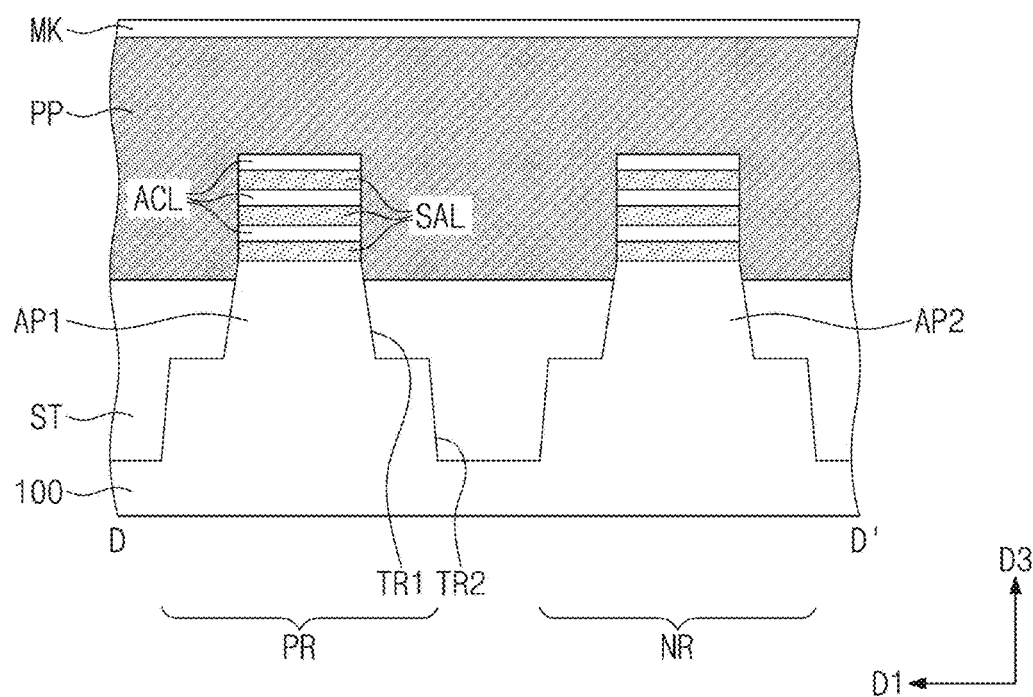
Figure 5A:
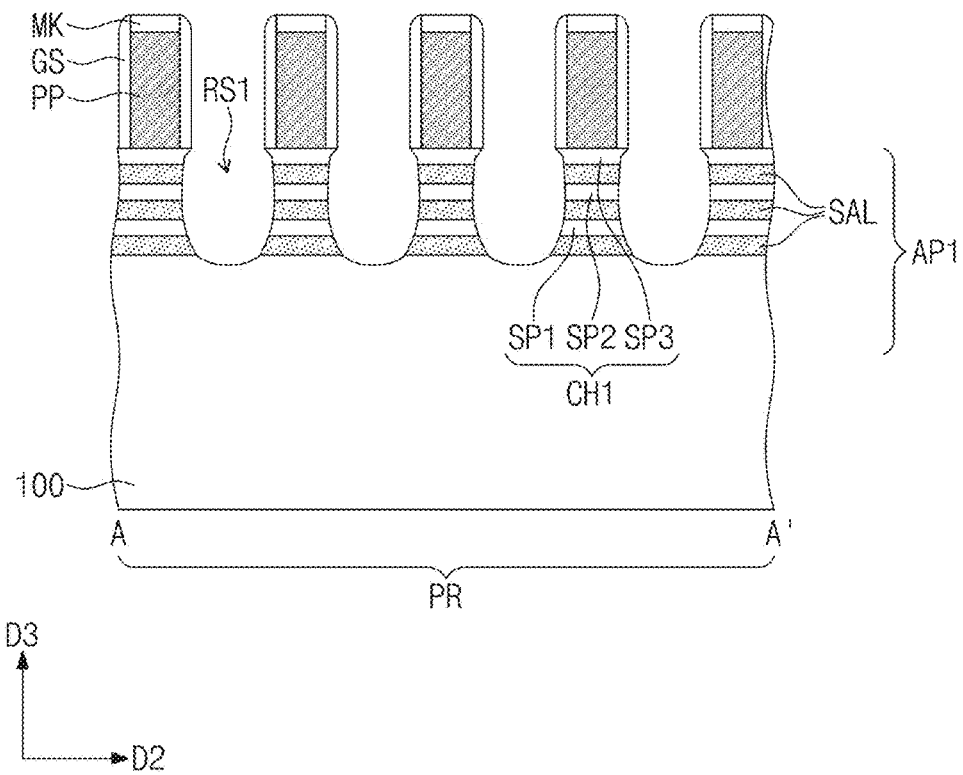
Figure 5B:
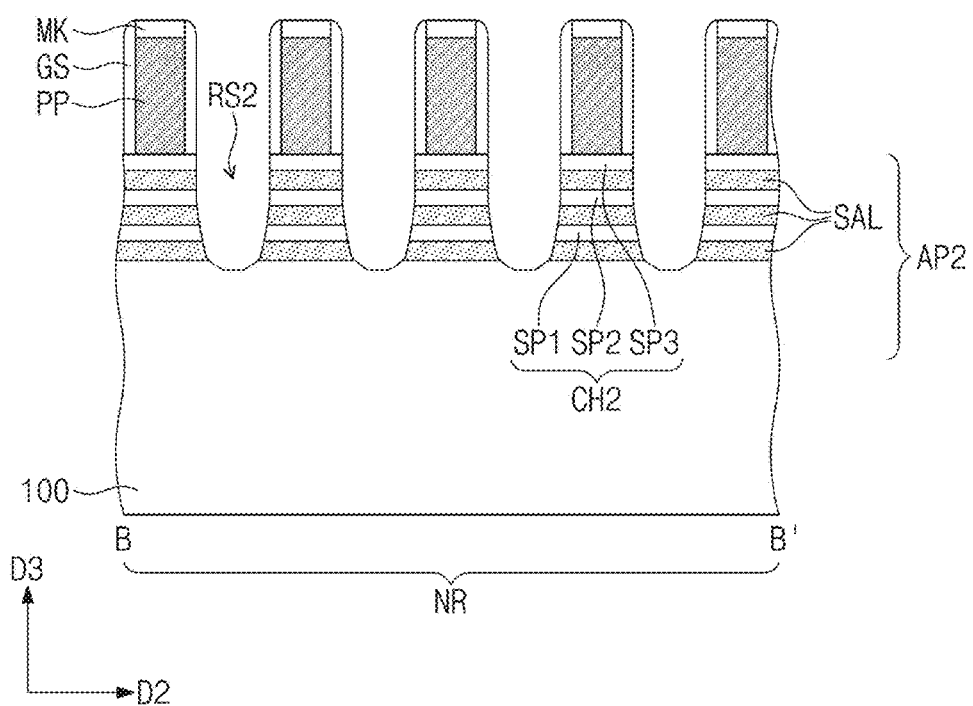
FIGS. 5B, 6B, 7B, 8B, 9B, 10B, 11B, 12B, 13B, 14B, 15B, and 16B are sectional views taken along the line B-B' of FIG. 1.
Figure 5C:
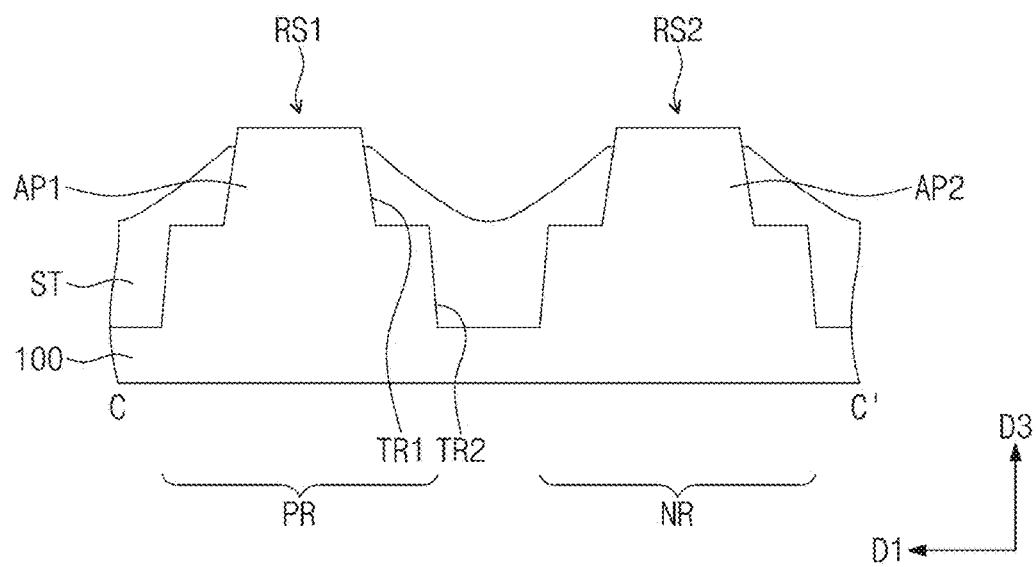
FIGS. 5C, 6C, 7C, and 8C are sectional views taken along the line C-C' of FIG. 1.
Figure 5D:
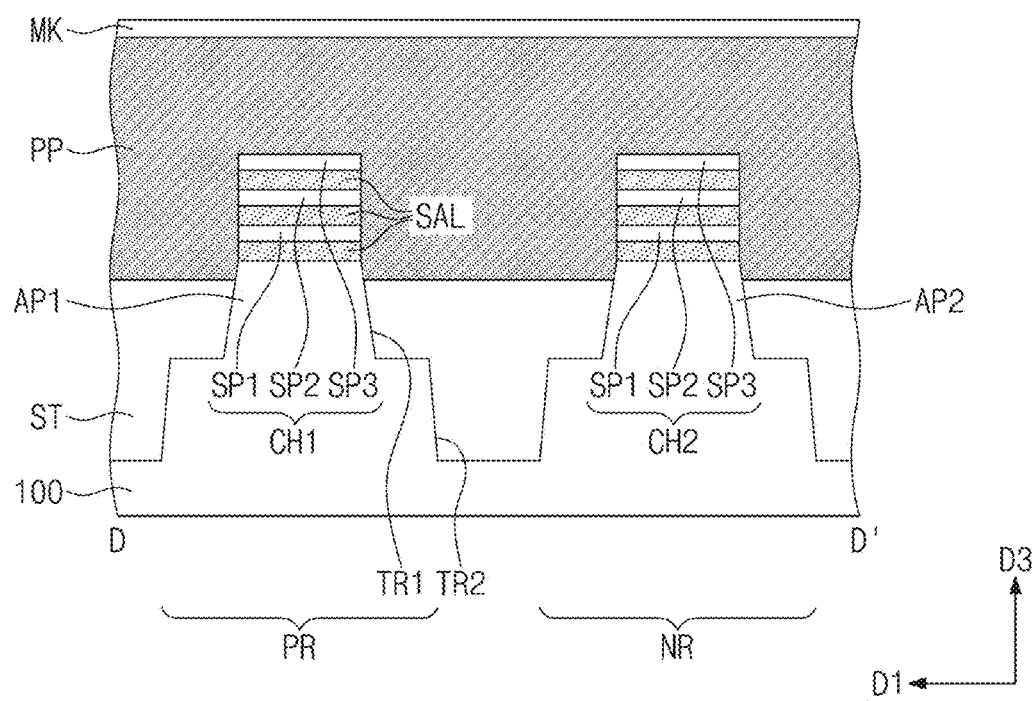
Figure 6A:
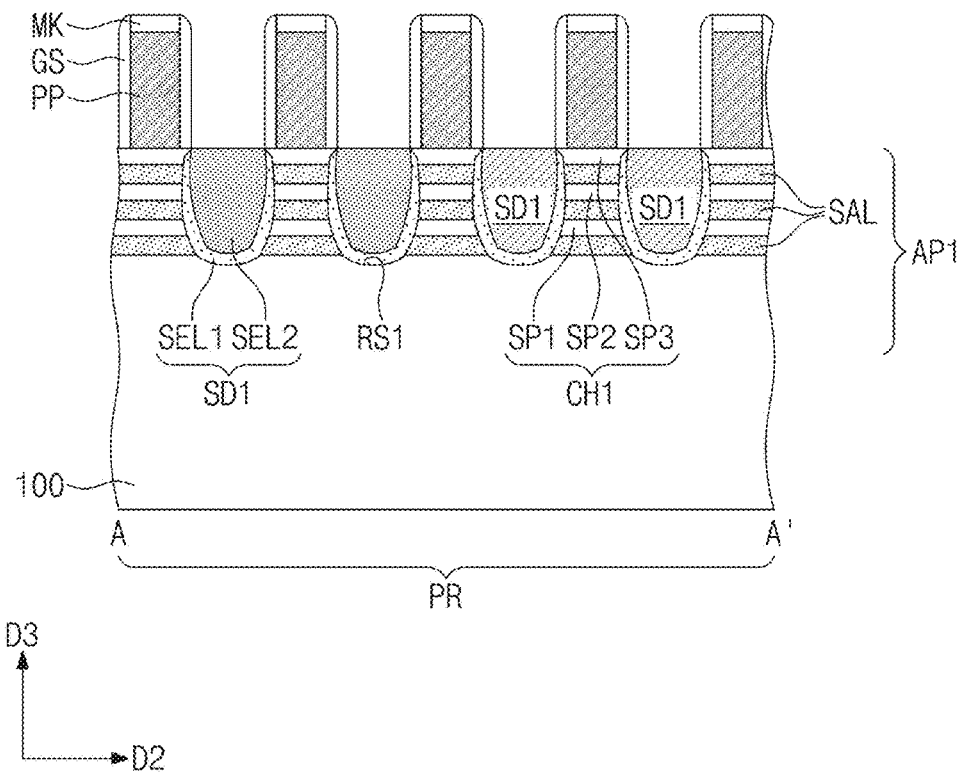
Figure 6B:
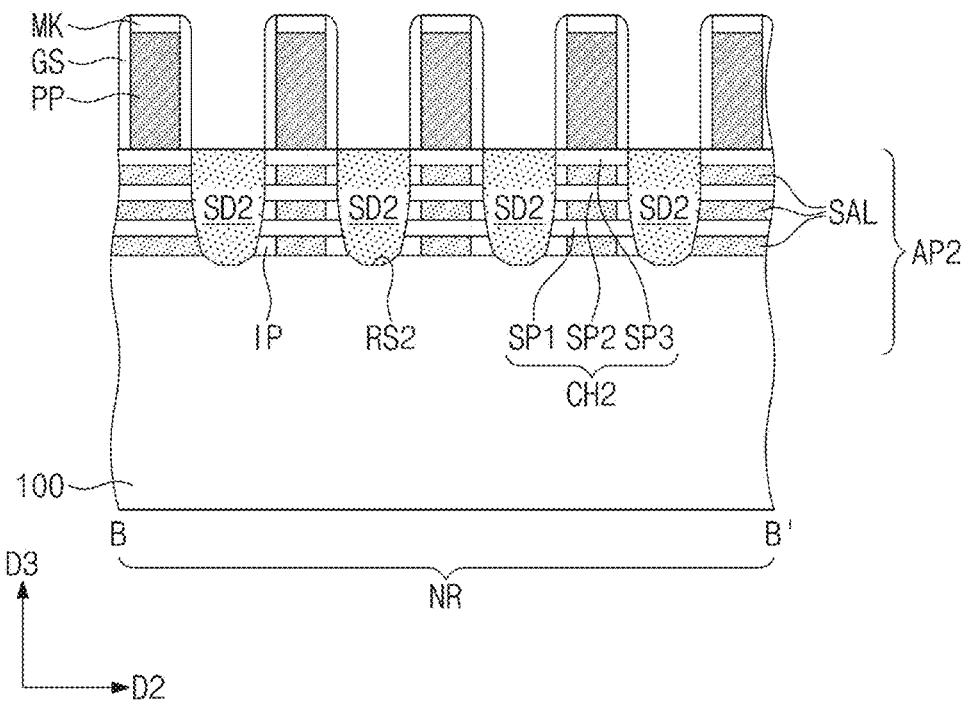
Figure 6C:
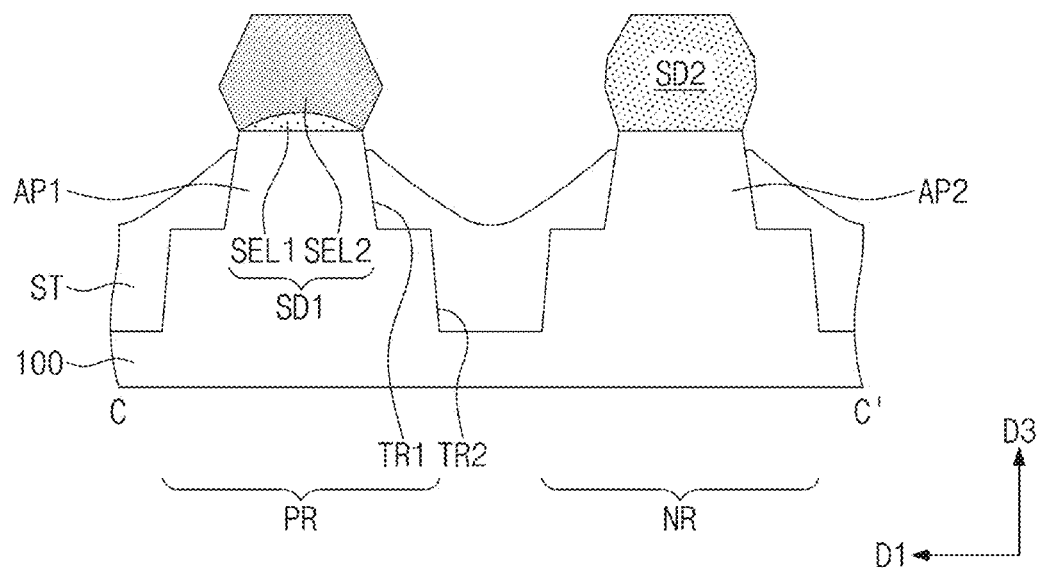
Figure 6D:
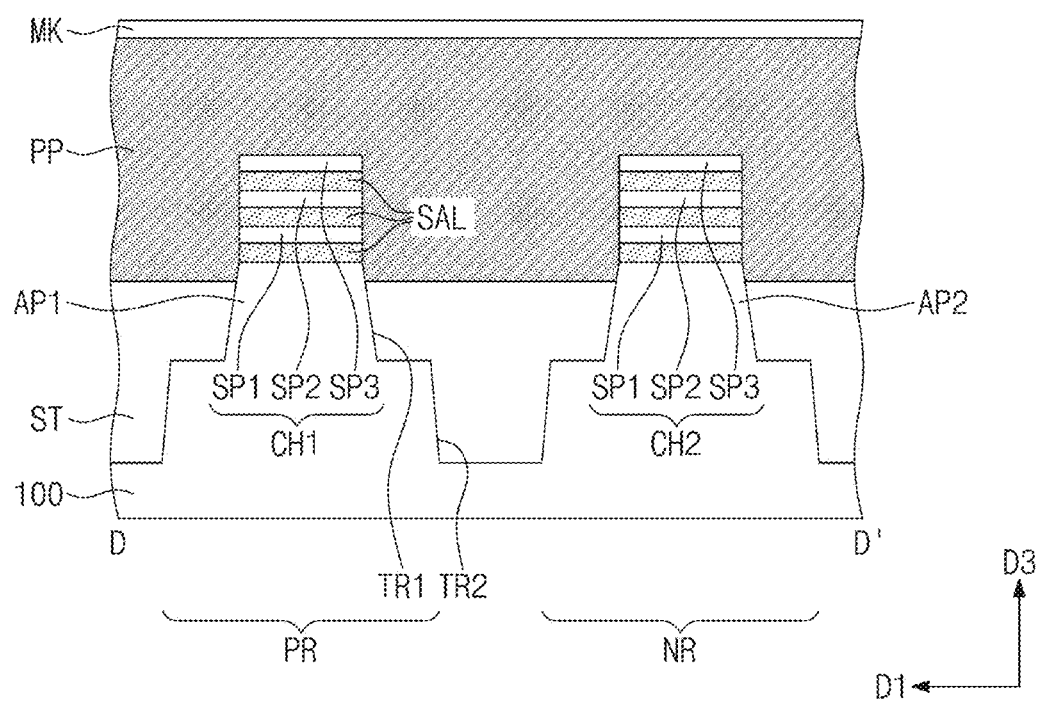
Figure 7A:
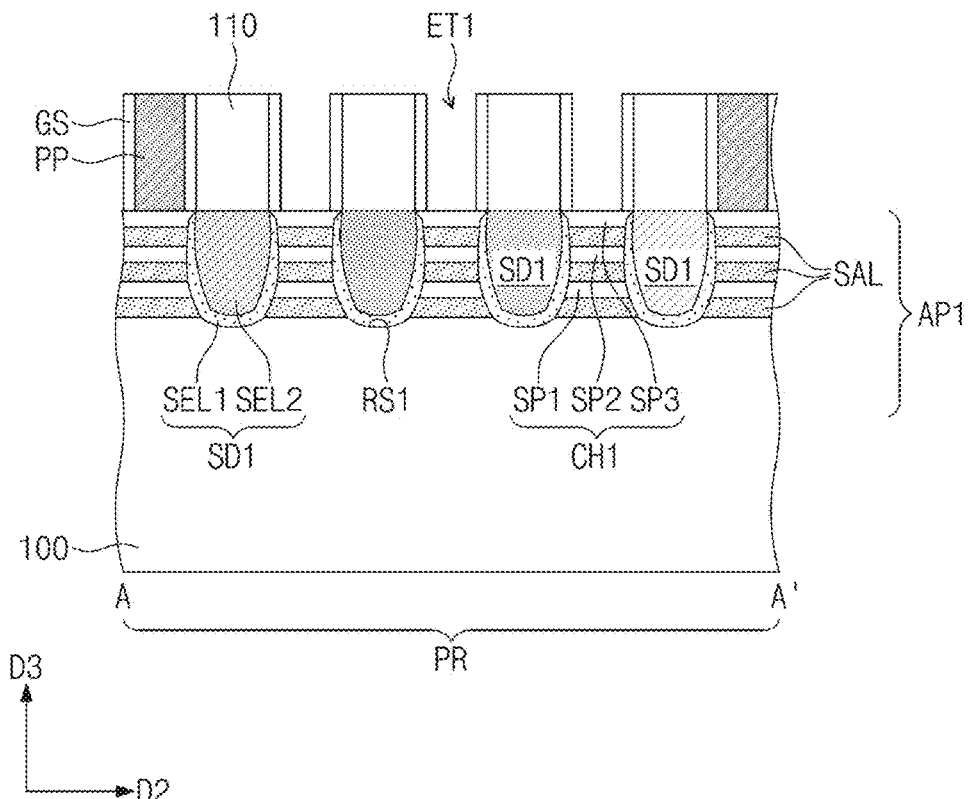
Figure 7B:
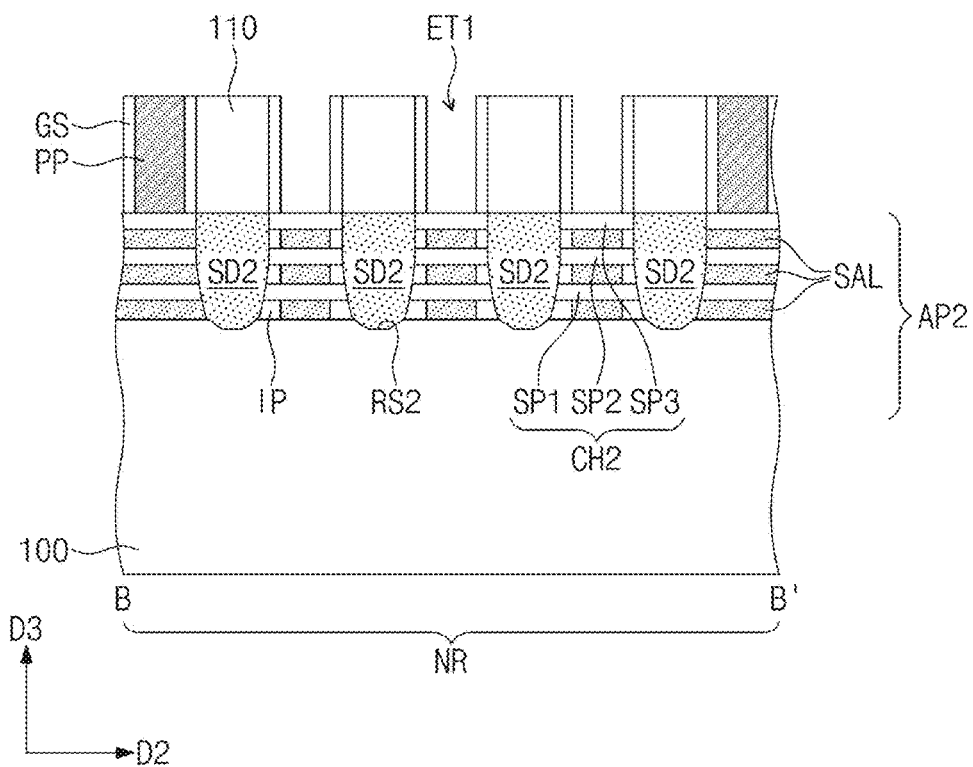
Figure 7C:
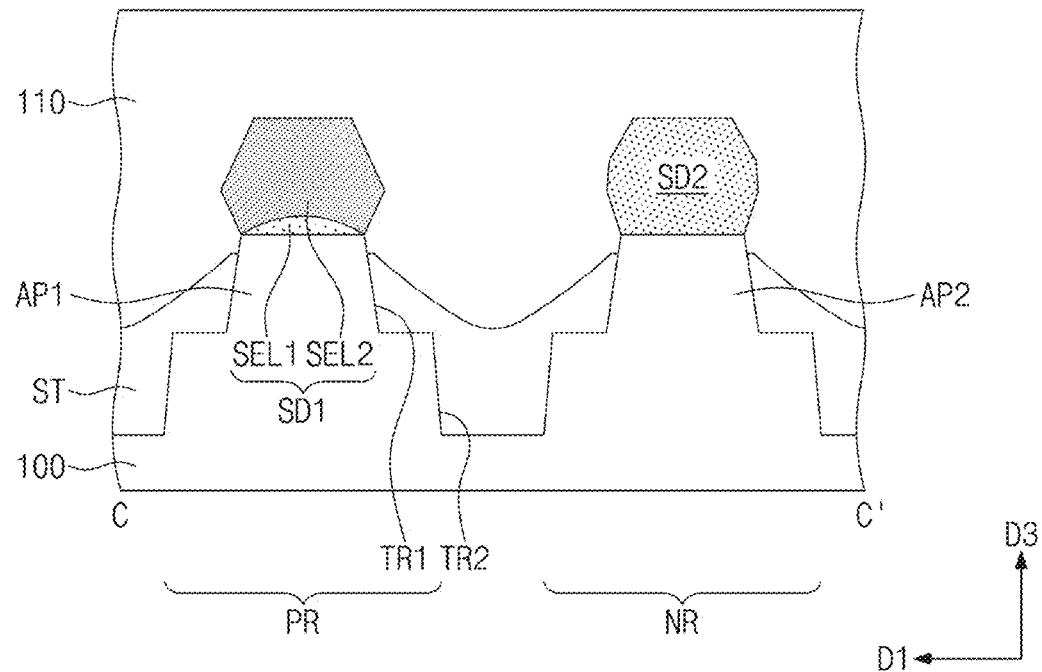
Figure 7D:
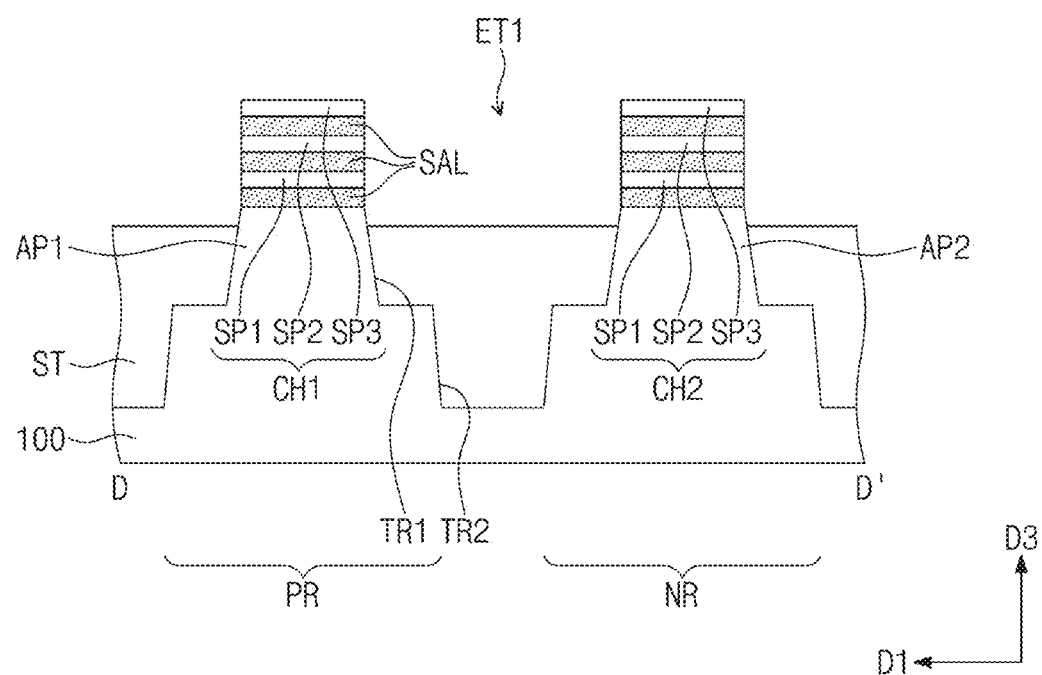
Figure 8A:
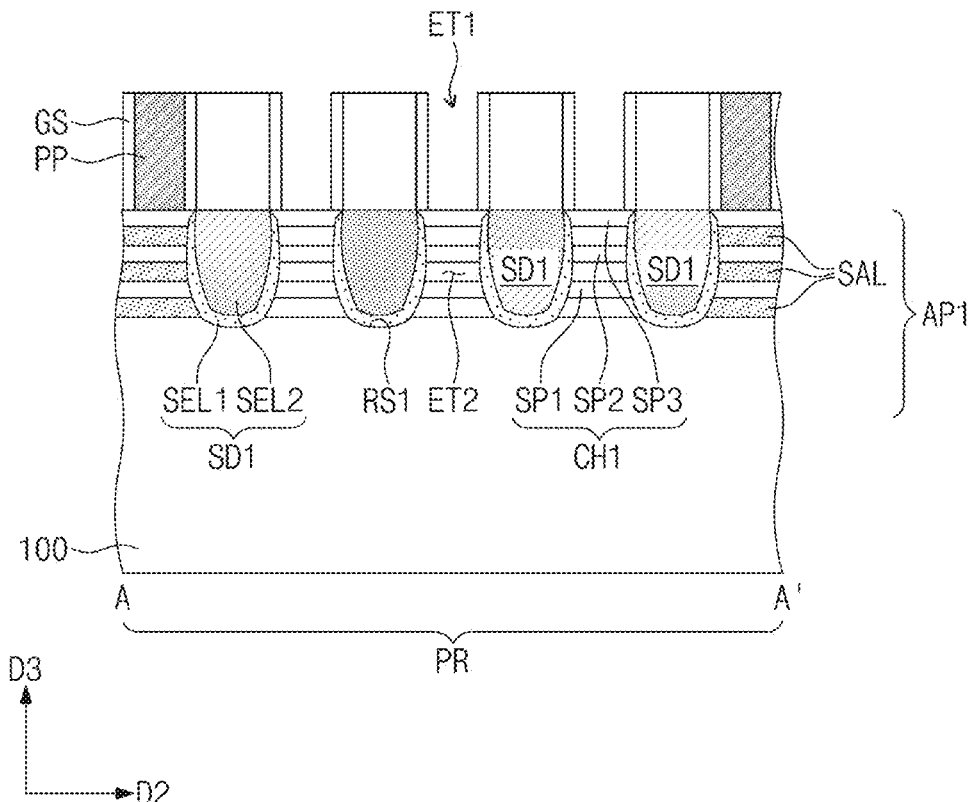
Figure 8B:
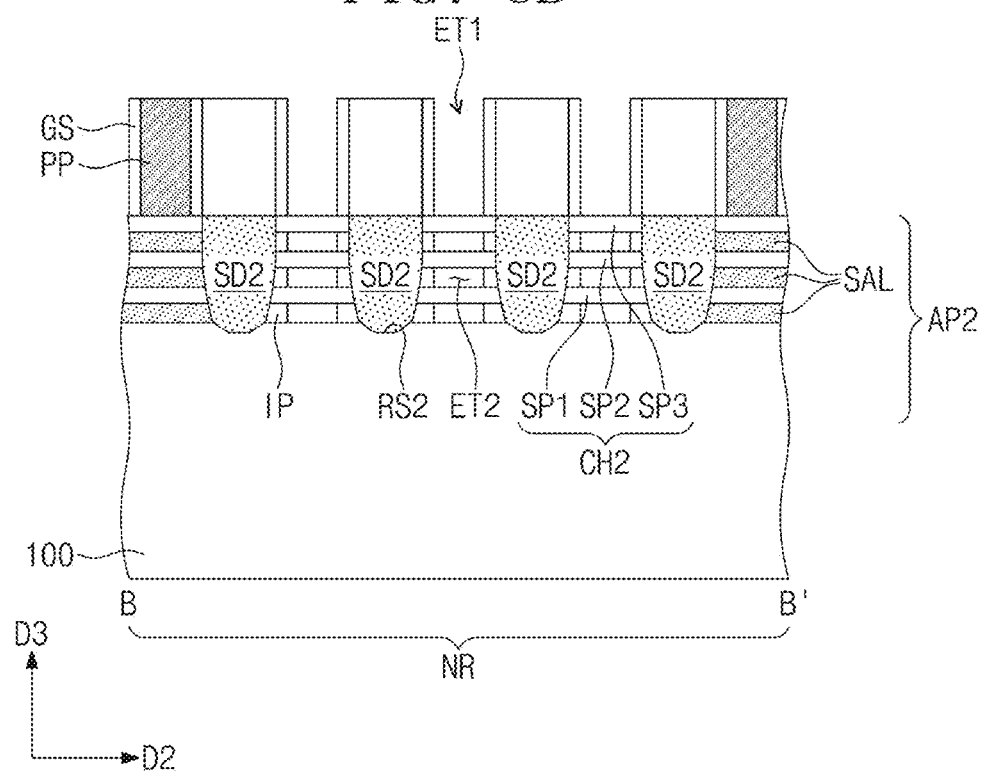
Figure 8C:
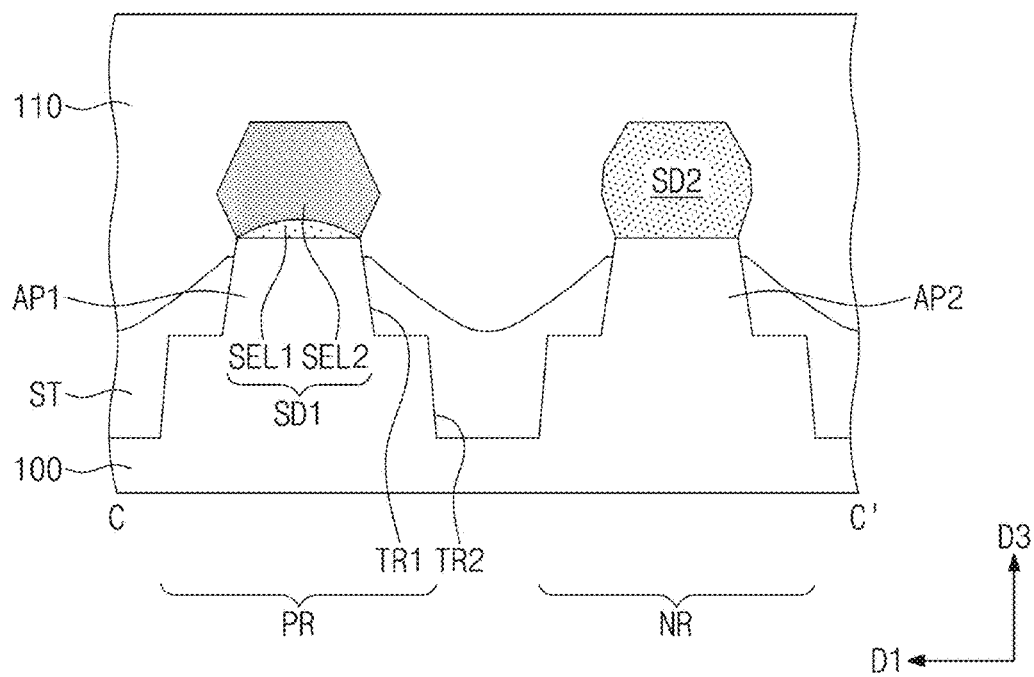
Figure 8D:
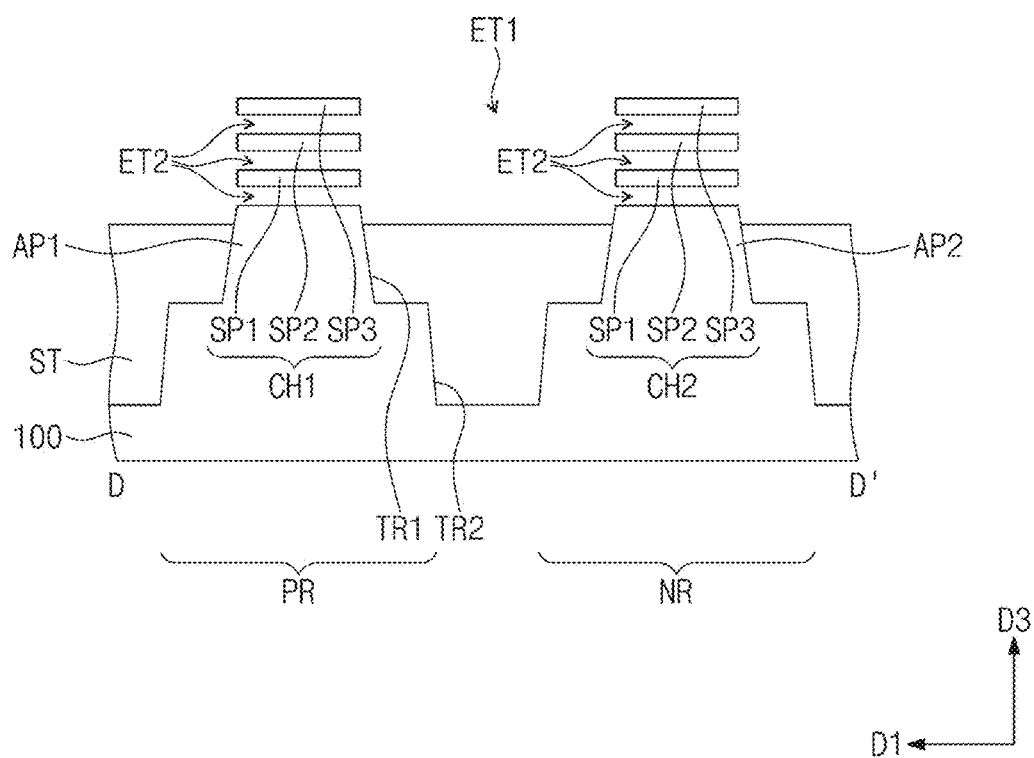

Referring to FIGS. 4A and 4B, sacrificial patterns PP may be formed on the substrate 100 to cross the first and second active patterns AP1 and AP2. Each of the sacrificial patterns PP may be a line and/or bar-shaped pattern extending in the first direction D1. The sacrificial patterns PP may be arranged, with a specific (and/or otherwise desired) pitch, in the second direction D2.

The formation of the sacrificial patterns PP may include forming a sacrificial layer on the substrate 100, forming hard mask patterns MK on the sacrificial layer, and the patterning the sacrificial layer using the hard mask patterns MK as an etch mask. The sacrificial layer patterned to form the sacrificial patterns PP may be formed of and/or include a material selected such that the sacrificial layers SAL and/or the active layers ACL have an etch selectivity with respect to the sacrificial patterns PP, and/or include a conductive and/or semiconductive material. For example, the sacrificial patterns PP may be formed of and/or include polysilicon.

A pair of the gate spacers GS may be formed on opposite side surfaces of each of the sacrificial patterns PP. The formation of the gate spacers GS may include conformally forming a gate spacer layer on the substrate 100 and anisotropically etching the gate spacer layer. The gate spacer layer may be formed of and/or include an insulating material having an etch selectivity with respect to the sacrificial layers SAL and/or the active layers ACL. For example, the gate spacers may be formed of and/or include at least one of SiCN, SiCON, and/or SiN. The gate spacer layer may include one layer and/or at least two layers, each of which is formed of at least one of SiCN, SiCON, or SiN. For example, the gate spacer layer may have a multi-layered structure.

Referring to FIGS. 5A to 5D, the first recesses RS1 may be formed in an upper portion of the first active pattern APE The second recesses RS2 may be formed in upper portions of the second active pattern AP2. During the formation of the first and second recesses RS1 and RS2, the device isolation layer ST may be recessed at both sides of each of the first and second active patterns AP1 and AP2 (e.g., see FIG. 5C).

For example, the first recesses RS1 may be formed by etching the upper portion of the first active pattern AP1 using the hard mask patterns MK and the gate spacers GS as an etch mask. Each of the first recesses RS1 may be formed between each pair of the sacrificial patterns PP. The second recesses RS2 in the upper portion of the second active pattern AP2 may be formed by the same method as that for the first recesses RS1. The first semiconductor pattern SP1, the second semiconductor pattern SP2, and the third semiconductor pattern SP3 may be formed by (and/or defined by) the first and second recesses RS1 and RS2.

Referring to FIGS. 6A to 6D, a first selective epitaxial growth (SEG) process, in which an inner side surface of the first recess RS1 is used as a seed layer, may be performed to form the first semiconductor layer SEL1. The first semiconductor layer SEL1 may be grown using first to third semiconductor patterns SP1, SP2, and SP3 and the substrate 100, which are exposed through the first recesses RS1, as the seed layer. As an example, the first SEG process may include a chemical vapor deposition (CVD) process and/or a molecular beam epitaxy (MBE) process.

The first semiconductor layer SEL1 may be formed of and/or include a semiconductor material (e.g., SiGe) having a lattice constant greater than that of the substrate 100. The first semiconductor layer SEL1 may be formed to have a relatively low germanium concentration. In other example embodiments, the first semiconductor layer SEL1 may contain only silicon (Si) and not germanium (Ge). For example, the germanium concentration of the first semiconductor layer SEL1 may range from 0 at % to 10 at %.

The second semiconductor layer SEL2 may be formed by performing a second SEG process on the first semiconductor layer SELL For example, the first semiconductor layer SEL1 may be used as a seed layer for the formation of the second semiconductor layer SEL2. The second semiconductor layer SEL2 may be formed to completely fill the first recess RS1. The second semiconductor layer SEL2 may be formed to have a relatively high germanium concentration. As an example, the germanium concentration of the second semiconductor layer SEL2 may range from 30 at % to 70 at %.

The first and second semiconductor layers SEL1 and SEL2 may constitute the first source/drain pattern SD1. The first and second semiconductor layers SEL1 and SEL2 may be doped with impurities during the first and second SEG processes (e.g., in situ). Additionally and/or alternatively, the first source/drain pattern SD1 may be doped with impurities after the formation of the first source/drain pattern SD1. The first source/drain pattern SD1 may be doped to have the first conductivity type (e.g., a p-type). For example, the impurities may be selected to include elements with fewer valence electrons compared to the semiconductor material included in the first and second semiconductor layers SEL1 and SEL2.

The second source/drain patterns SD2 may be formed in an upper portion of the second active pattern AP2. For example, a selective epitaxial growth process, in which an inner side surface of the second recess RS2 is used as a seed layer, may be performed to form the second source/drain pattern SD2. The second source/drain patterns SD2 may be formed of and/or include the same semiconductor material (e.g., Si) as the substrate 100. The second source/drain patterns SD2 may be doped to have the second conductivity type (e.g., an n-type). For example, the impurities may be selected to include elements with more valence electrons compared to the semiconductor material included in the second source/drain patterns SD2.

The sacrificial layers SAL, which are exposed through the second recess RS2, may be partially removed before the formation of the second source/drain pattern SD2. The inner spacer IP may be formed by filling the region which was formed by partially removing the sacrificial layers SAL with an insulating material. For example, the inner spacers IP may be formed by partially replacing the sacrificial layers SAL with the insulating materials.

Referring to FIGS. 7A to 7D, the first interlayer insulating layer 110 may be formed to cover the first and second source/drain patterns SD1 and SD2, the hard mask patterns MK, and the gate spacers GS. As an example, the first interlayer insulating layer 110 may include an insulator. For example, the first interlayer insulating layer 110 may be formed of and/or include a silicon oxide layer.

The first interlayer insulating layer 110 may be planarized to expose the top surfaces of the sacrificial patterns PP. For example, the planarization of the first interlayer insulating layer 110 may be performed using an etch-back and/or chemical mechanical polishing (CMP) process. All of the hard mask patterns MK may be removed during the planarization process. Accordingly, the first interlayer insulating layer 110 may have a top surface that is coplanar with the top surfaces of the sacrificial patterns PP and the top surfaces of the gate spacers GS.

In some example embodiments, the exposed sacrificial patterns PP may be selectively removed. As a result of the removal of the sacrificial patterns PP, first empty spaces ET1 may be formed to expose the first and second active patterns AP1 and AP2 (e.g., see FIG. 7D).

In some example embodiments, some of the sacrificial patterns PP may not be removed. For example, the sacrificial pattern PP located on a cell boundary may not be removed. For example, a mask layer may be formed on the sacrificial patterns PP that should not be removed to prevent the masked sacrificial patterns PP (e.g., the unintended ones of the sacrificial patterns PP) from being removed. As a result of the removal of the sacrificial pattern PP, the first and second active patterns AP1 and AP2 may be exposed through the first empty space ET1. The sacrificial layers SAL of each of the first and second active patterns AP1 and AP2 may be exposed through the first empty space ET1.

Referring to FIGS. 8A to 8D, the sacrificial layers SAL exposed through the first empty space ET1 may be selectively removed. For example, an etching process of selectively etching only the sacrificial layers SAL may be performed to remove only the sacrificial layers SAL and to leave the active layers ACL and thereby forming the first to third semiconductor patterns SP1, SP2, and SP3. Due to the inner spacers IP, it may be possible to prevent a defect from occurring in the second source/drain pattern SD2 during this process.

Second empty spaces ET2 may be formed as a result of the removal of the sacrificial layers SAL. The second empty spaces ET2 may be defined between the first to third semiconductor patterns SP1, SP2, and SP3.

Figure 9A:
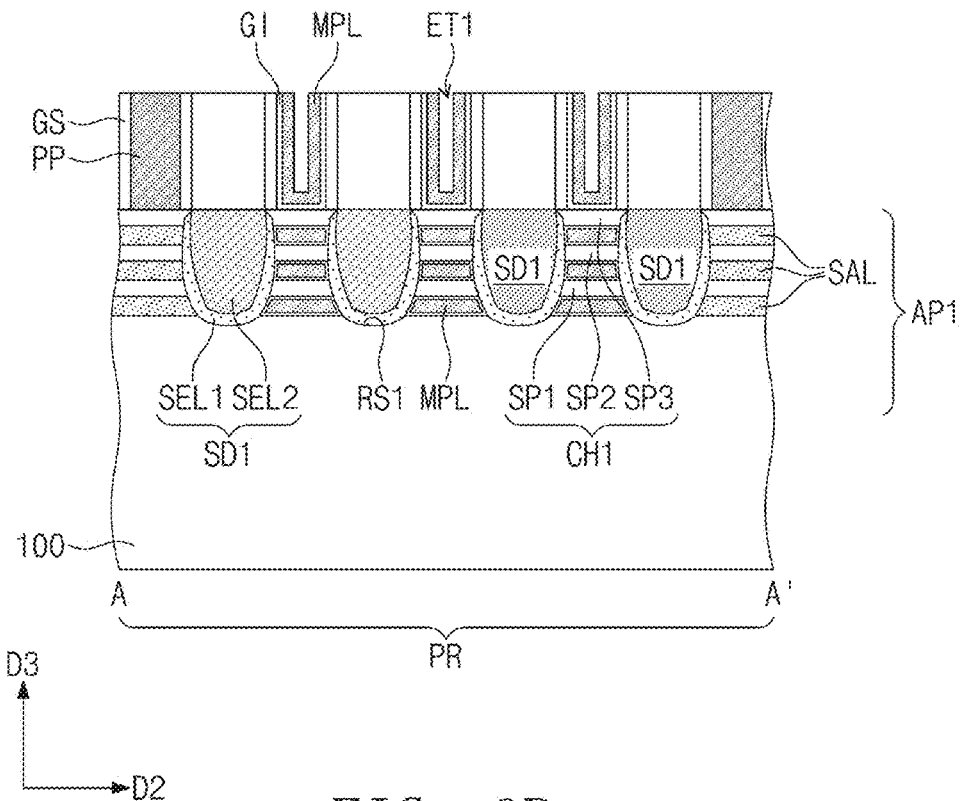
Figure 9B:
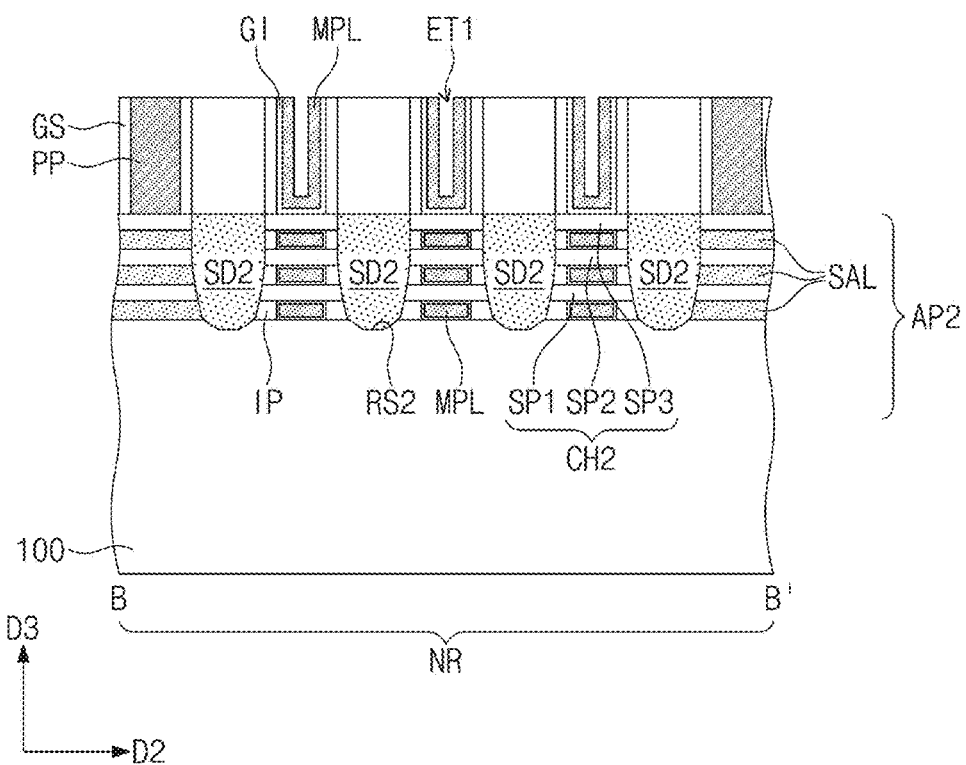
Figure 9C:
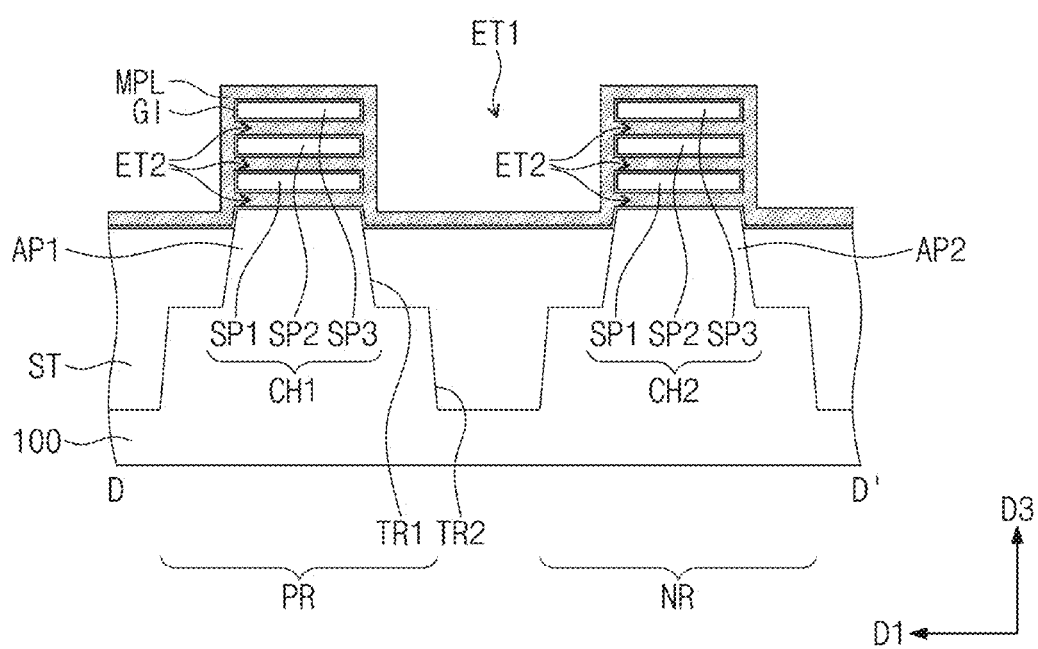

Referring to FIGS. 9A to 9C, the gate insulating layer GI may be conformally formed in the first and second empty spaces ET1 and ET2. The gate insulating layer GI may cover the first to third semiconductor patterns SP1, SP2, and SP3. The gate insulating layer GI may be extended to cover an inner side surface of the gate spacer GS.

A first metal layer MPL may be formed on the gate insulating layer GI. In some example embodiments, the first metal layer MPL may be conformally formed on the gate insulating layer GI. The first metal layer MPL may be formed to completely fill a remainder of the second empty spaces ET2. The first metal layer MPL may partially fill the first empty space ET1. In some example embodiments, the first metal layer MPL may include a metal nitride layer.

Figure 10A:
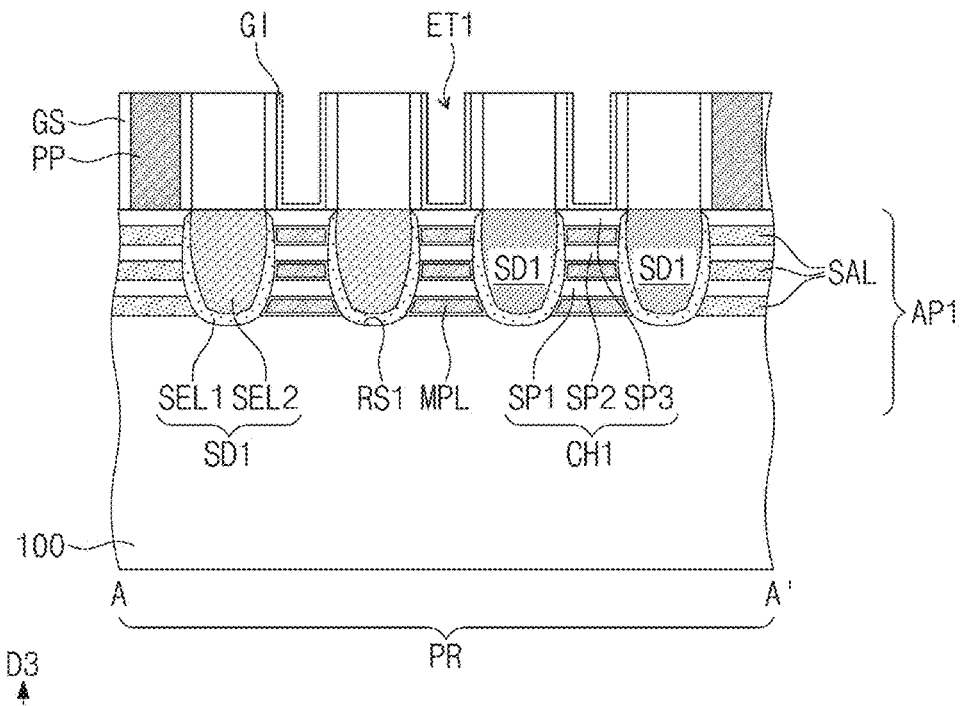
Figure 10B:
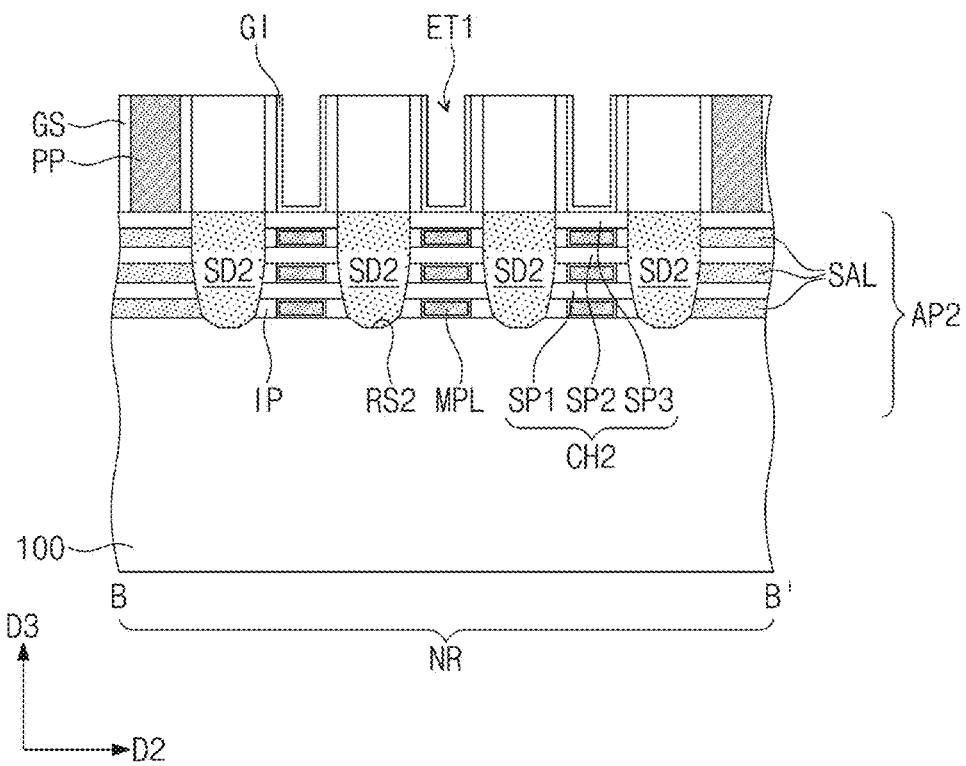
Figure 10C:
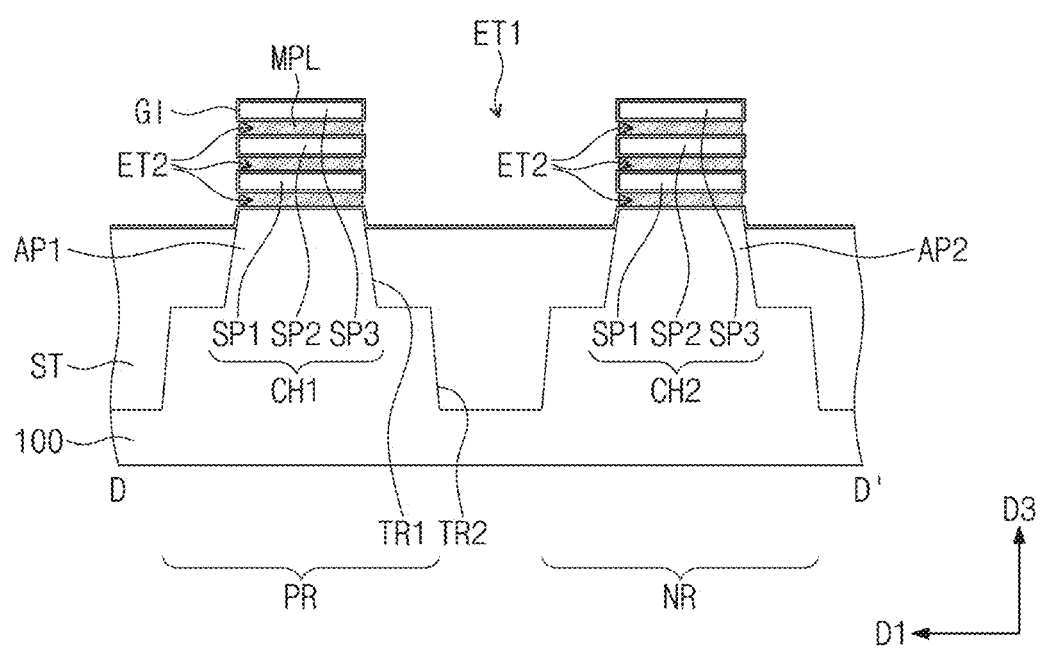

Referring to FIGS. 10A to 10C, a portion of the first metal layer MPL may be removed by an etching process. The etching process may be a wet etching process. In some example embodiments, the etching process may be performed to remove the first metal layer MPL from the first empty space ET1. In addition, the etching process may be performed to leave the first metal layer MPL in the second empty spaces ET2.

Figure 11A:
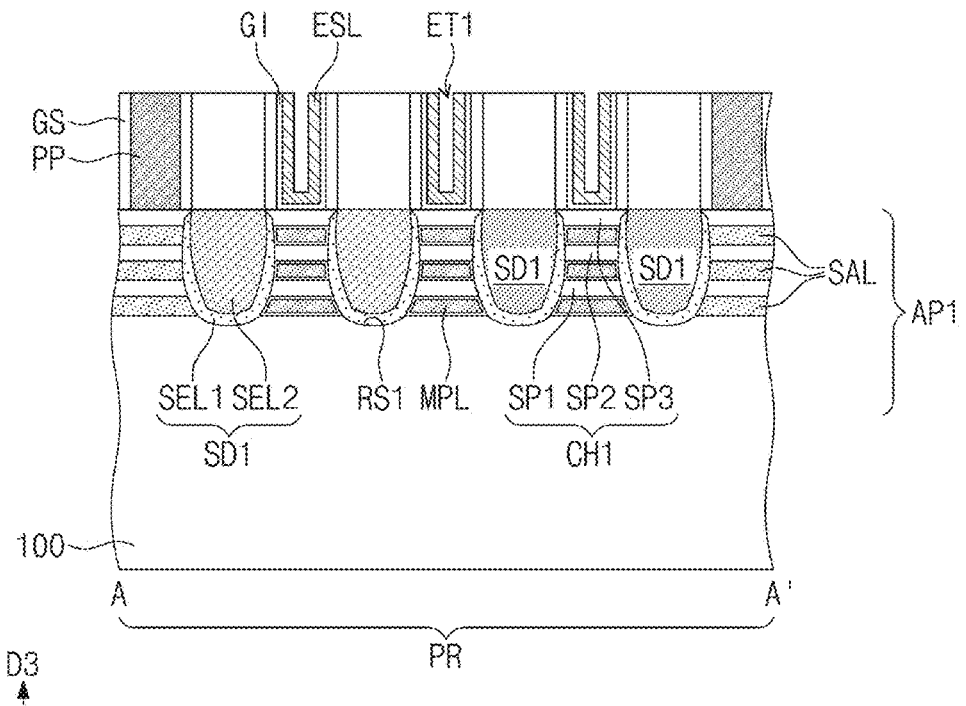
Figure 11B:
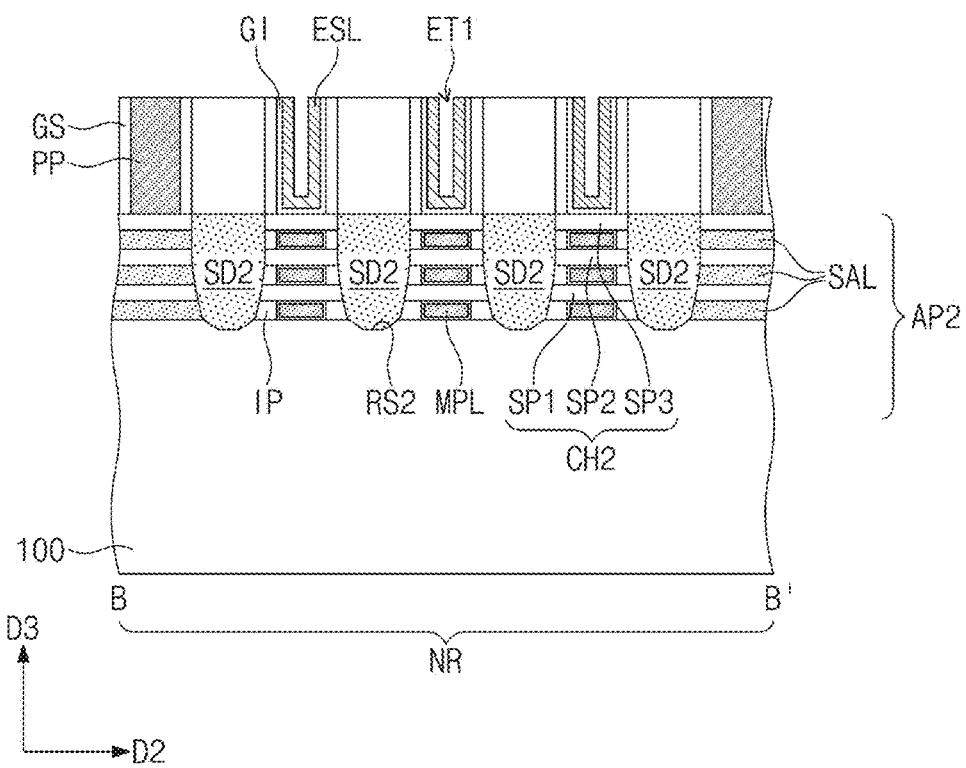
Figure 11C:
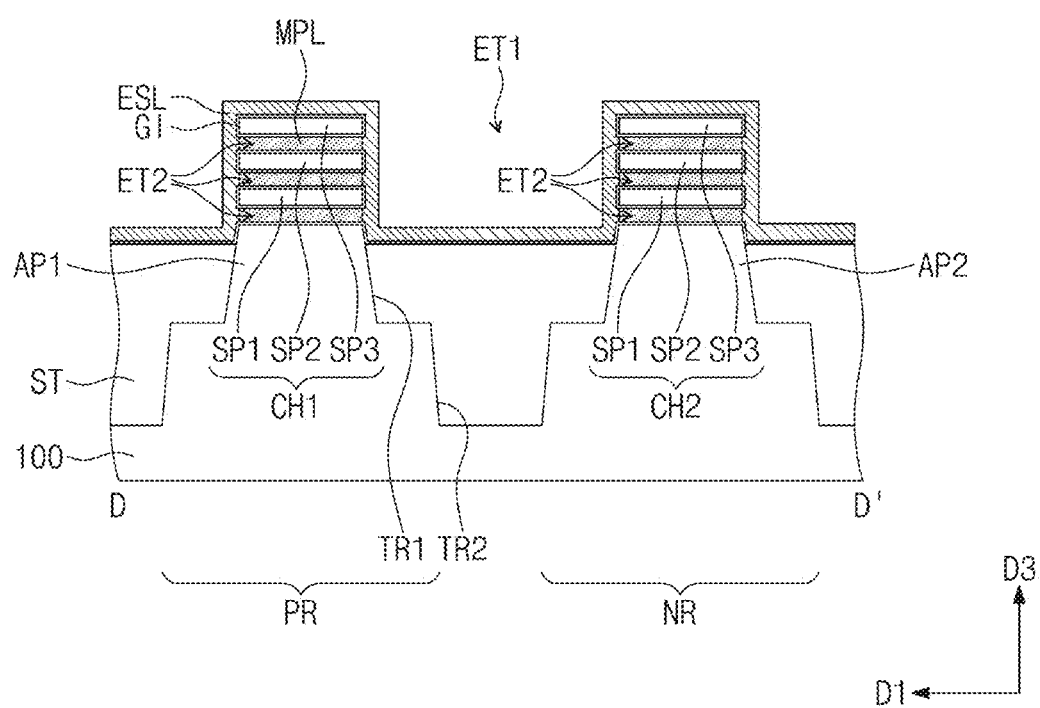

Referring to FIGS. 11A to 11C, an etch stop layer ESL may be formed to cover the gate insulating layer GI and the first metal layer MPL. The etch stop layer ESL may be formed to conformally cover the gate insulating layer GI and the first metal layer MPL. The etch stop layer ESL may be formed to partially fill a remainder of the first empty space ET1. The etch stop layer ESL may be formed of and/or include a material having an etch selectivity with respect to the first metal layer MPL. For example, the etch stop layer ESL may be formed of and/or include at least one of tantalum nitride or polysilicon. The etch stop layer ESL may be extended to a region on the device isolation layer ST between the first and second active regions PR and NR.

Figure 12A:
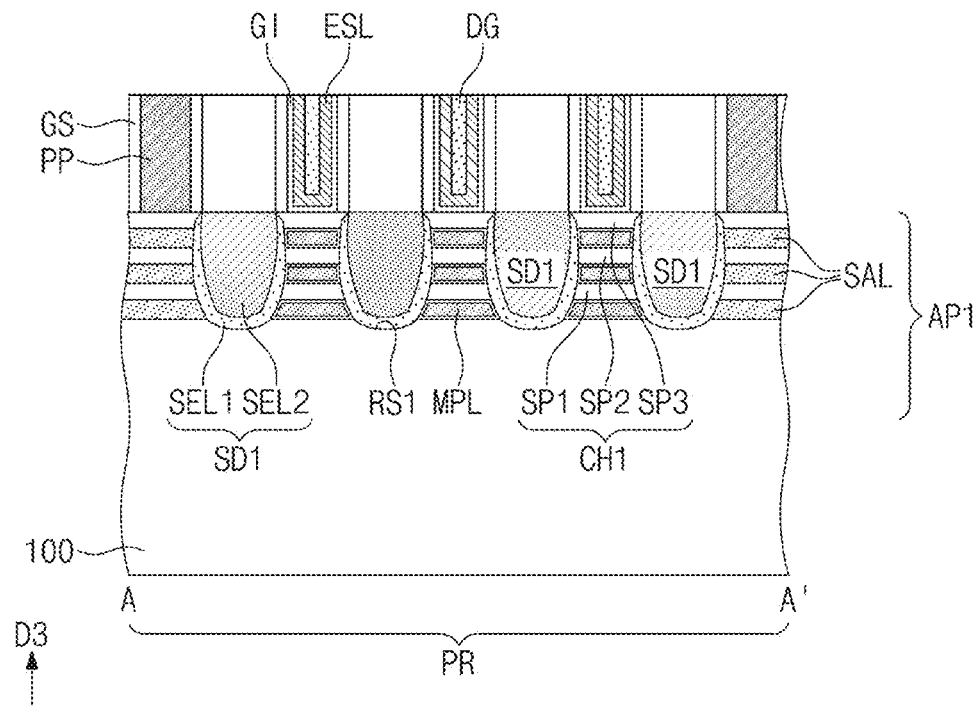
Figure 12B:
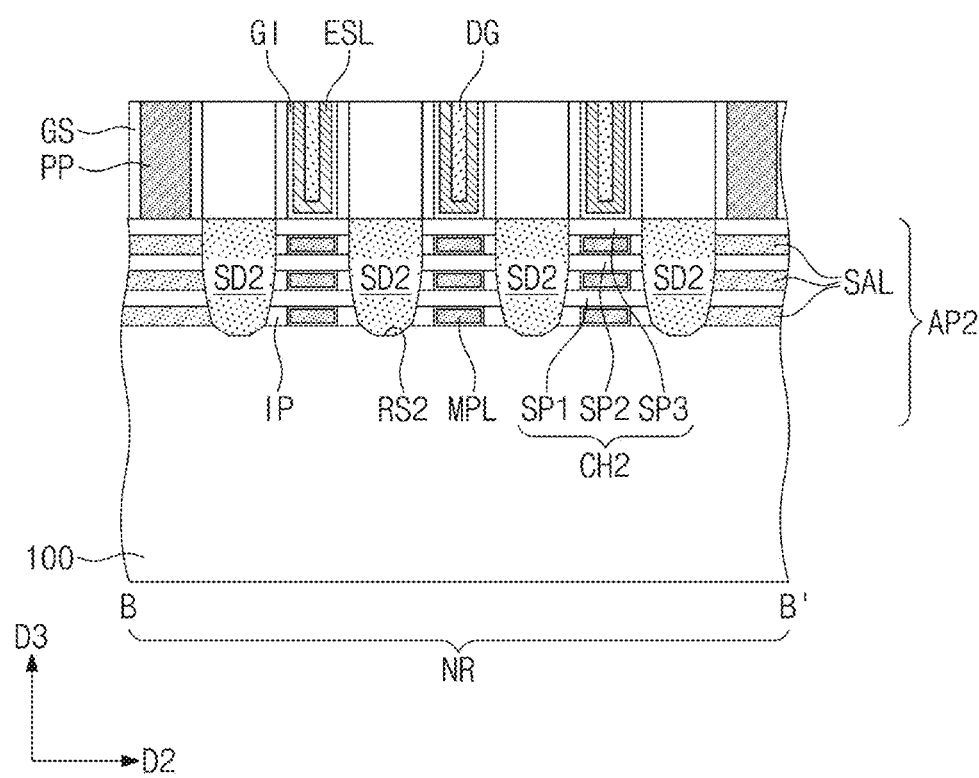
Figure 12C:
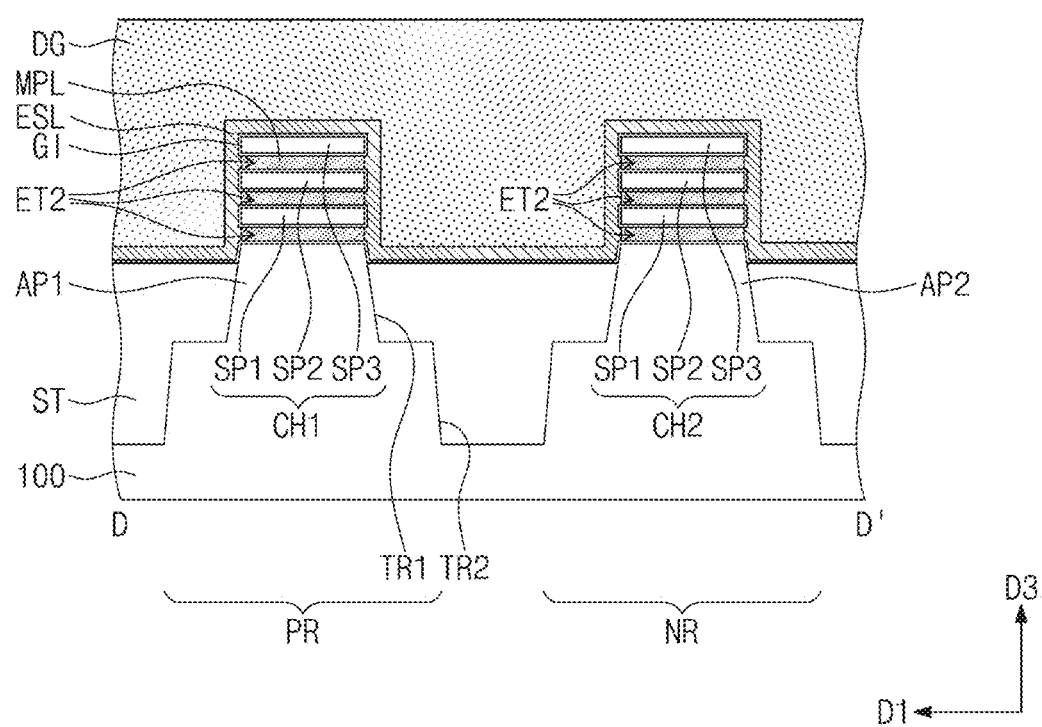

Referring to FIGS. 12A to 12C, a dummy gate DG may be formed on the etch stop layer ESL. The dummy gate DG may be formed to completely fill the remainder of the first empty space ET1. In some example embodiments, the dummy gate DG may be formed of and/or include a material having an etch selectivity with respect to the first metal layer MPL and the etch stop layer ESL. For example, the dummy gate DG may be formed of and/or include polysilicon. A planarization process may be performed on the dummy gate DG, and as a result, the dummy gate DG may have a flat top surface.

Figure 13A:
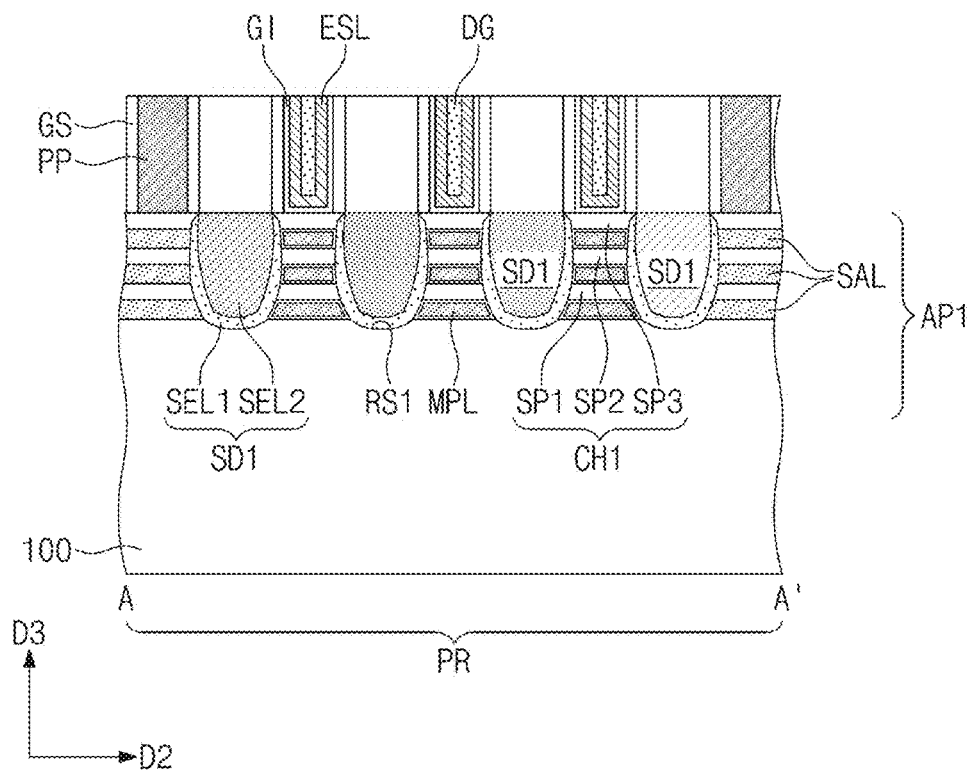
Figure 13B:
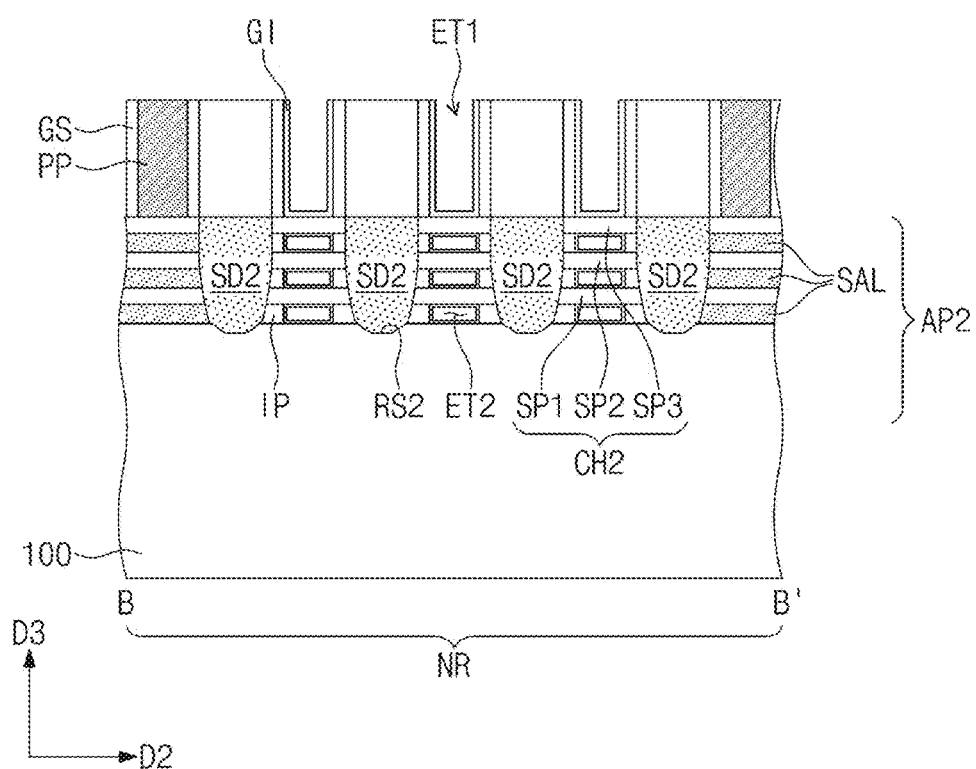
Figure 13C:
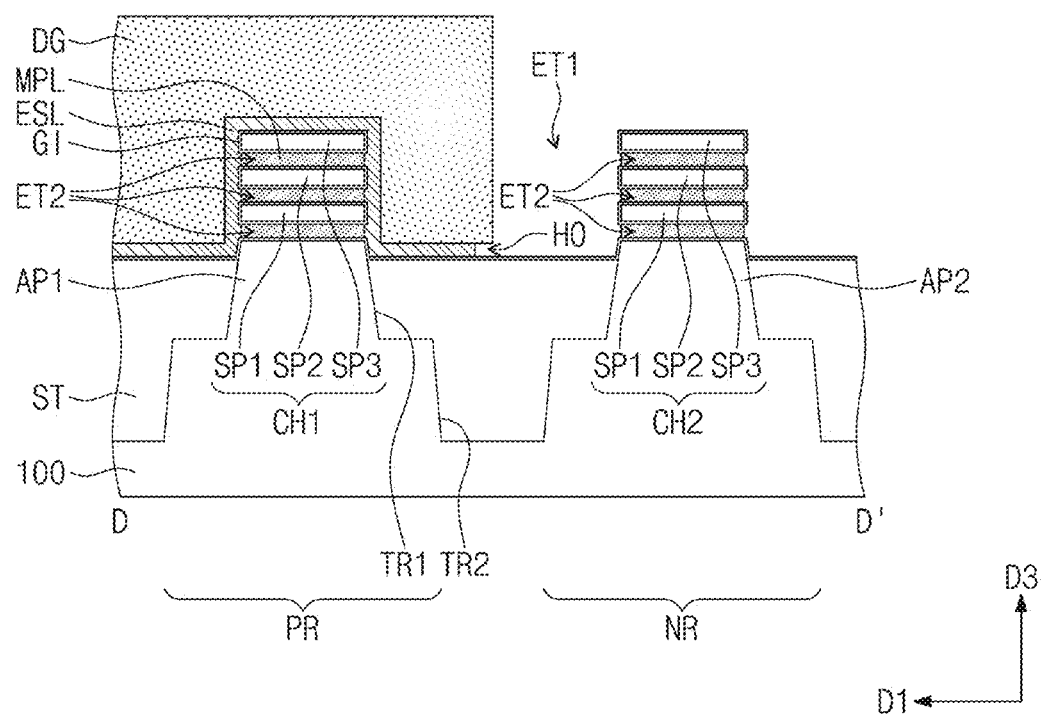

Referring to FIGS. 13A to 13C, the dummy gate DG may be patterned. For example, the patterning of the dummy gate DG may include forming a mask layer on the second active region NR and performing a dry etching process on the dummy gate DG using the mask layer as an etch mask. As a result of the patterning process, the dummy gate DG may be left on only the first active region PR.

An etching process may be performed to partially remove the etch stop layer ESL and the first metal layer MPL using the dummy gate DG as an etch mask. For example, the etch stop layer ESL and the first metal layer MPL may be removed from the second active region NR. The etching process may be a wet etching process. During the etching process, a portion of the etch stop layer ESL, which is disposed below the dummy gate DG, may be laterally recessed to form a hole HO between the dummy gate DG and the gate insulating layer GI. In addition, the second empty spaces ET2 may be formed (e.g., reformed) on the second active region NR and between the first to third semiconductor patterns SP1, SP2, and SP3.

Figure 14A:
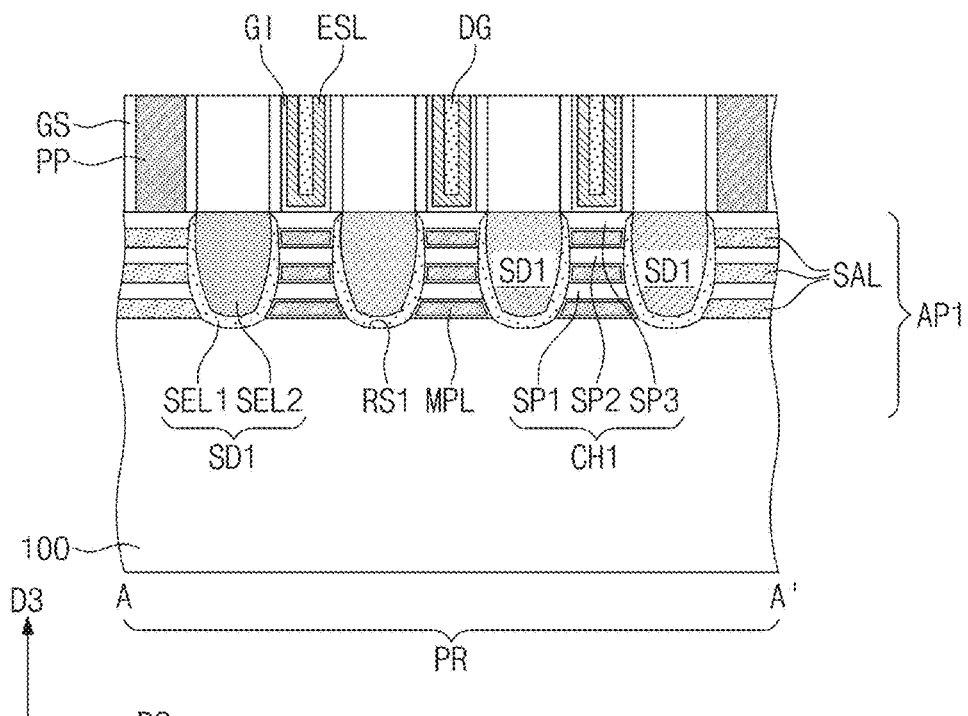
Figure 14B:
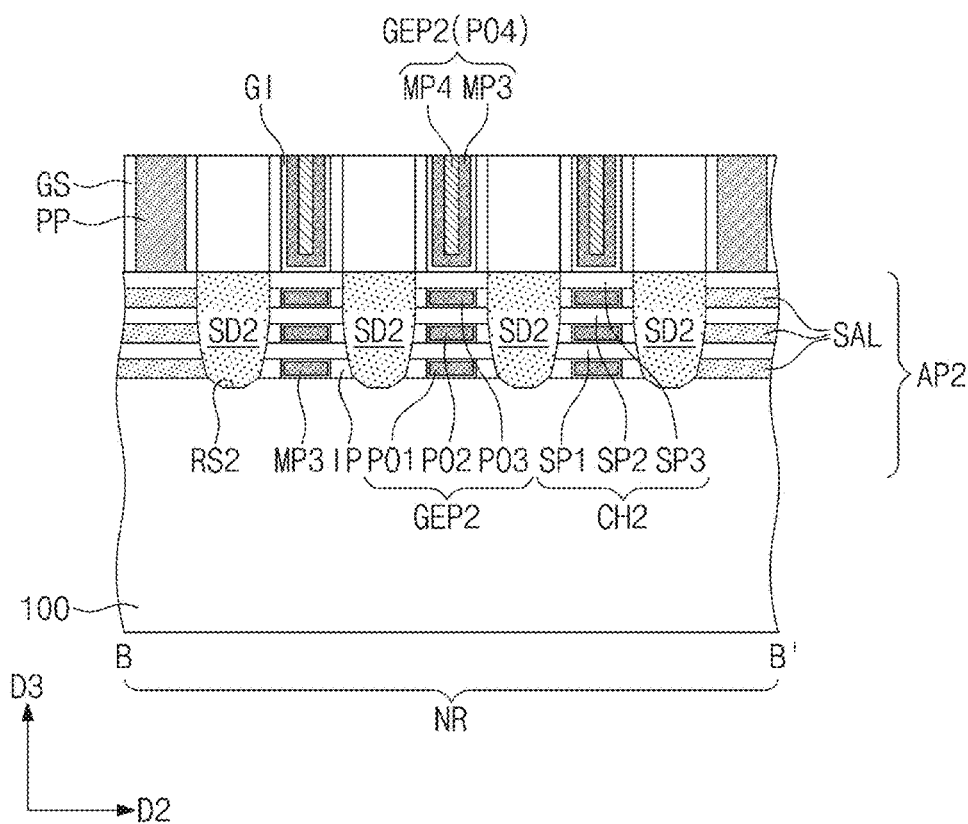
Figure 14C:
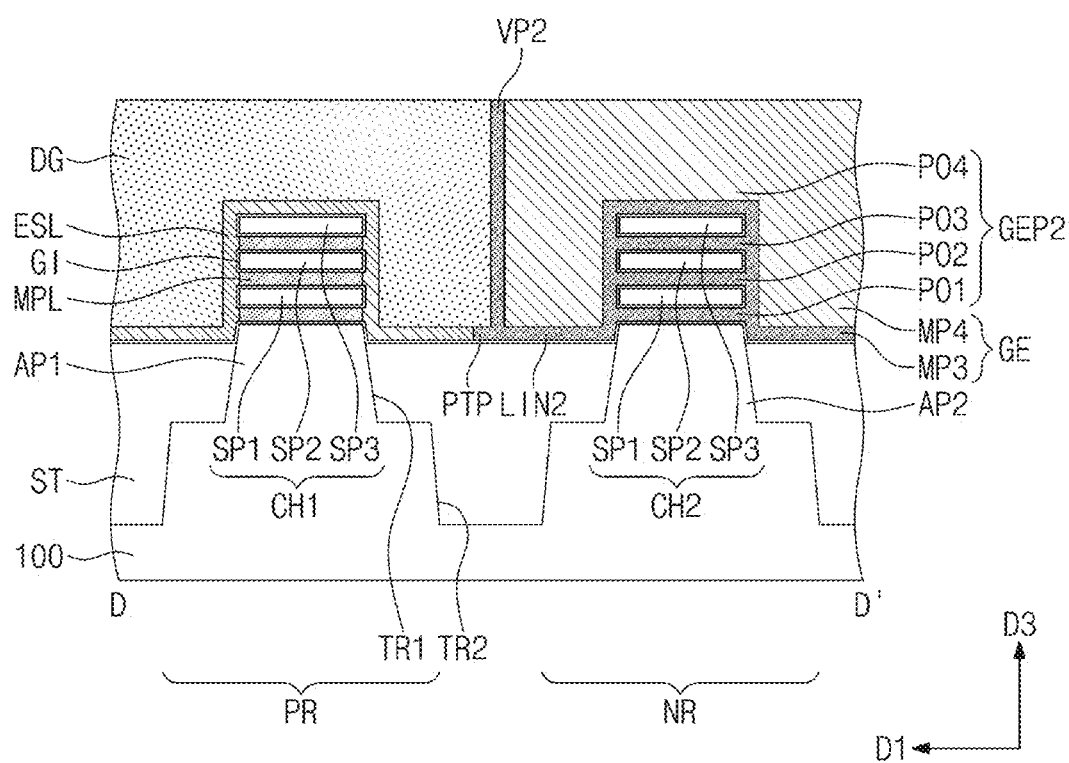

Referring to FIGS. 14A to 14C, the third metal pattern MP3 may be formed on the gate insulating layer GI exposed by the dummy gate DG. For example, the third metal pattern MP3 may be formed on the second active region NR. The third metal pattern MP3 may be conformally formed on the second active region NR. In addition, the third metal pattern MP3 may be formed on the second active region NR to fill the second empty spaces ET2 between the first to third semiconductor patterns SP1, SP2, and SP3. The third metal pattern MP3 may include the second line portion LIN2, which is extended to a region on the device isolation layer ST between the first and second active regions PR and NR. The second line portion LIN2 may be extended parallel to the top surface of the device isolation layer ST.

The third metal pattern MP3 may further include the protruding portion PTP, which protrudes from the second line portion LIN2 toward the first metal pattern MP1. For example, the protruding portion PTP may fill the hole HO described with reference to FIG. 13C. The protruding portion PTP may be in contact with the etch stop layer ESL.

The third metal pattern MP3 may include the second vertical portion VP2 which is extended from the second line portion LIN2 vertically (e.g., in the third direction D3). The second vertical portion VP2 may be extended along a side surface of the dummy gate DG. The fourth metal pattern MP4 may be formed on the third metal pattern MP3. Accordingly, the second electrode portion GEP2 on the second active region NR may be formed.

The third metal pattern MP3 may include a metal nitride layer. The third metal pattern MP3 may be formed of and/or include the same material as the first metal layer MPL, and/or the third metal pattern MP3 may be formed of and/or include a material different from the first metal layer MPL.

The fourth metal pattern MP4 may be formed on the third metal pattern MP3. For example, the fourth metal pattern MP4 may be formed on the second active region NR. The fourth metal pattern MP4 may be formed to fill the remainder of the first empty space ET1 (see, e.g., FIG. 13C). Accordingly, the second electrode portion GEP2 may be formed on the second active region NR. A planarization process may be performed on the fourth metal pattern MP4 such that the fourth metal pattern MP4 has a top surface that is coplanar with that of the second vertical portion VP2.

According to some example embodiments, by using the dummy gate DG and the etch stop layer ESL, the work function metal (e.g., the third metal pattern MP3) may be formed in a manner of filling an empty space. The first metal pattern MP1, which will be described below, may be formed in the same manner as the third metal pattern MP3. Accordingly, it may be possible to prevent the third metal pattern MP3 from being improperly (e.g., excessively and/or insufficiently) etched by an etching process and to prevent the third metal pattern MP3 from being misaligned to the first metal pattern MP1 to be described below. As a result, the semiconductor device may have improved electric characteristics.

Figure 15A:
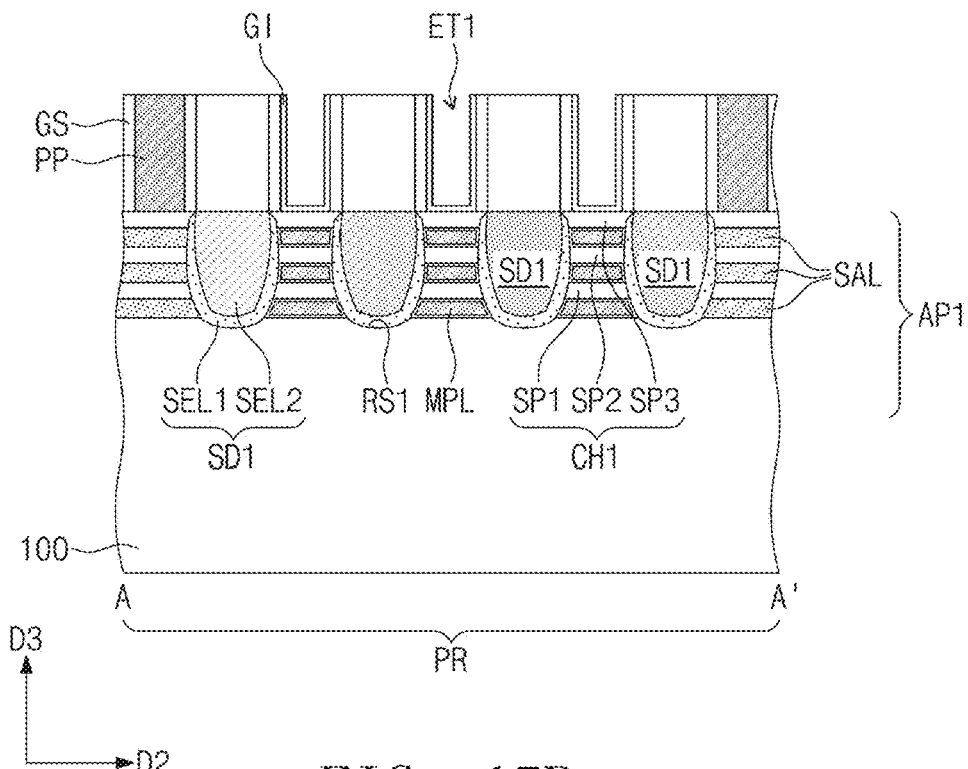
Figure 15B:
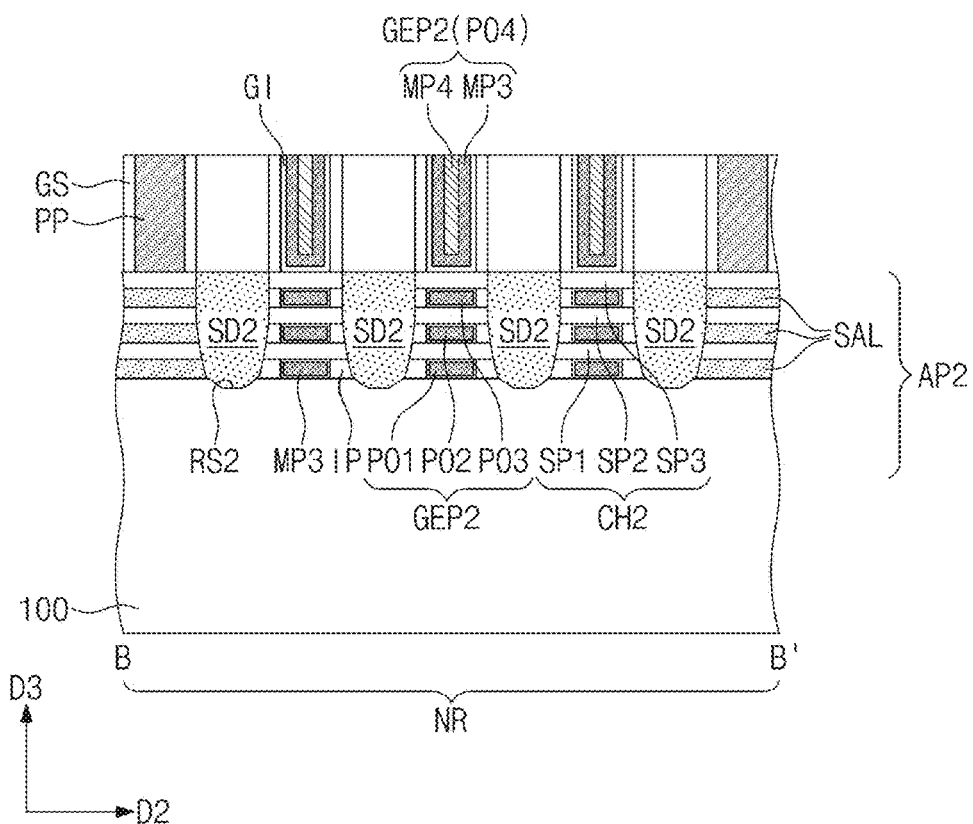
Figure 15C:
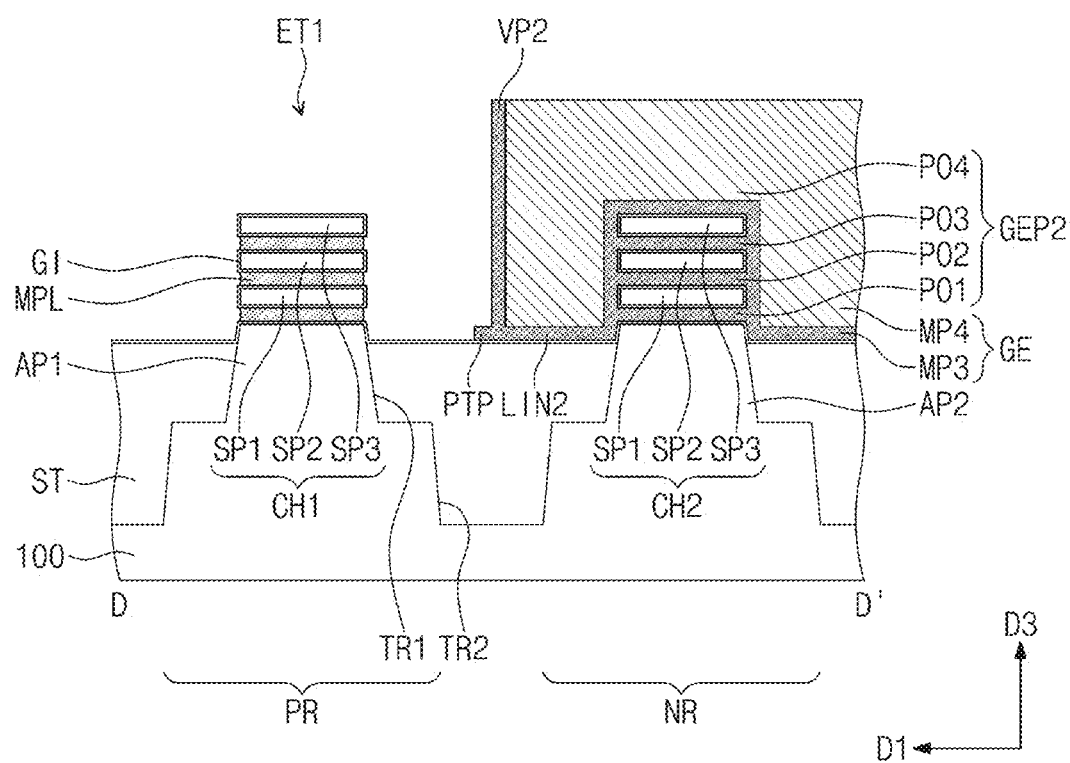

Referring to FIGS. 15A to 15C, the dummy gate DG may be selectively removed. In some example embodiments, the dummy gate DG may be removed using at least one of a dry etching process and/or a wet etching process. Since the dummy gate DG is removed, the first empty space ET1 on the first active region PR may be exposed.

Figure 16A:
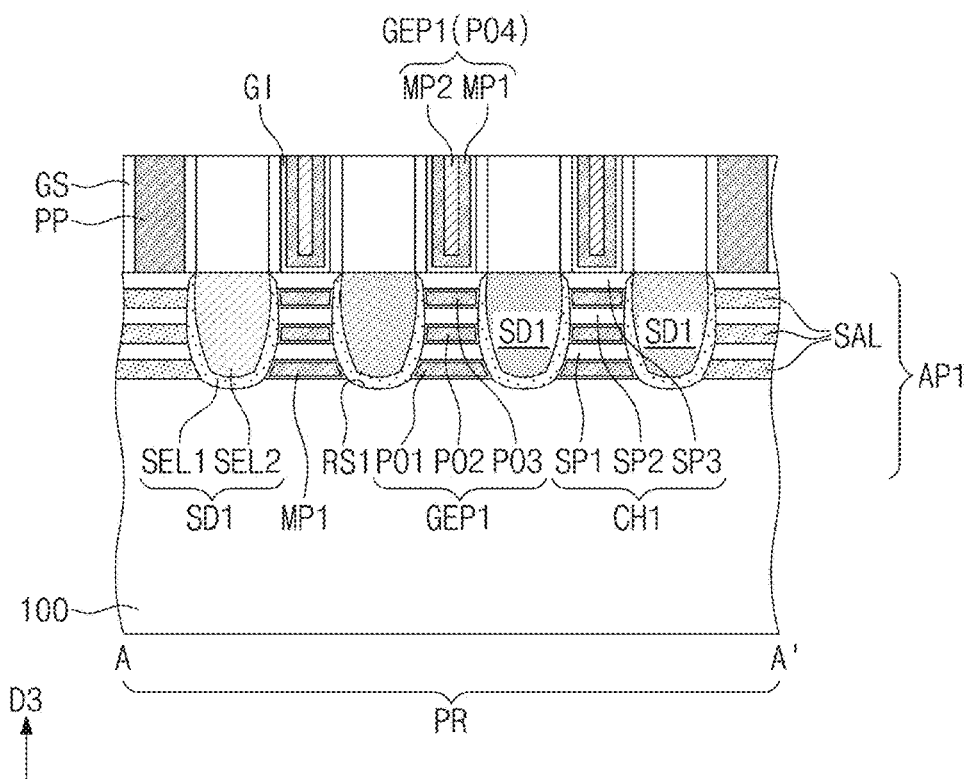
Figure 16B:
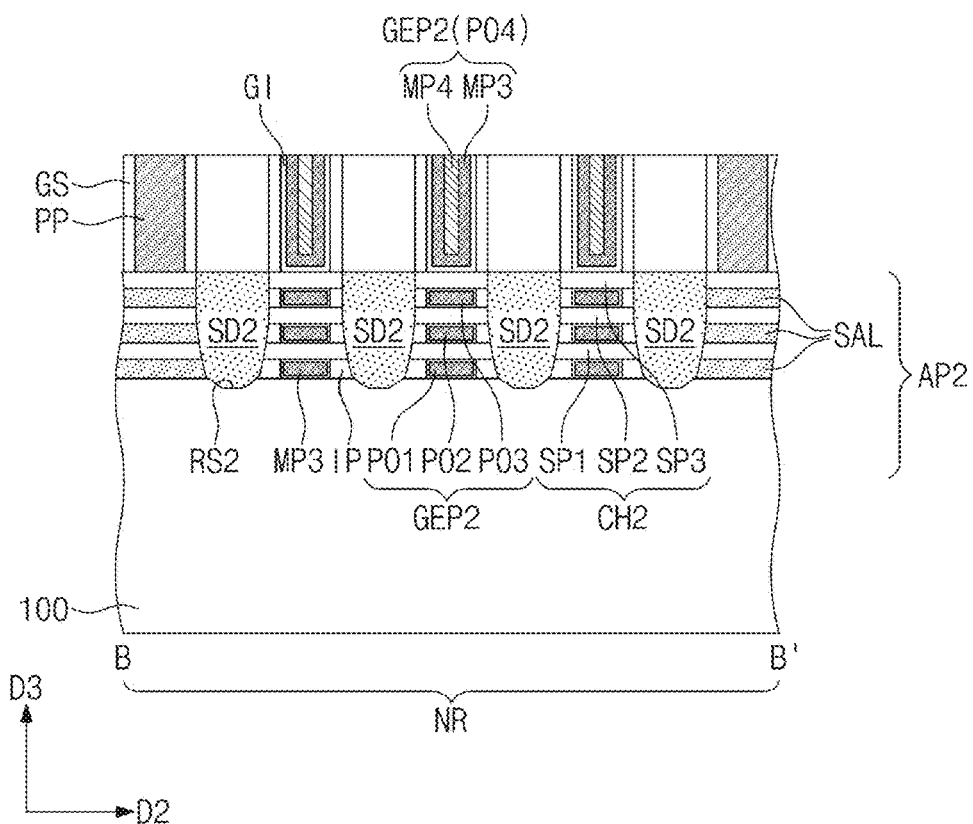
Figure 16C:
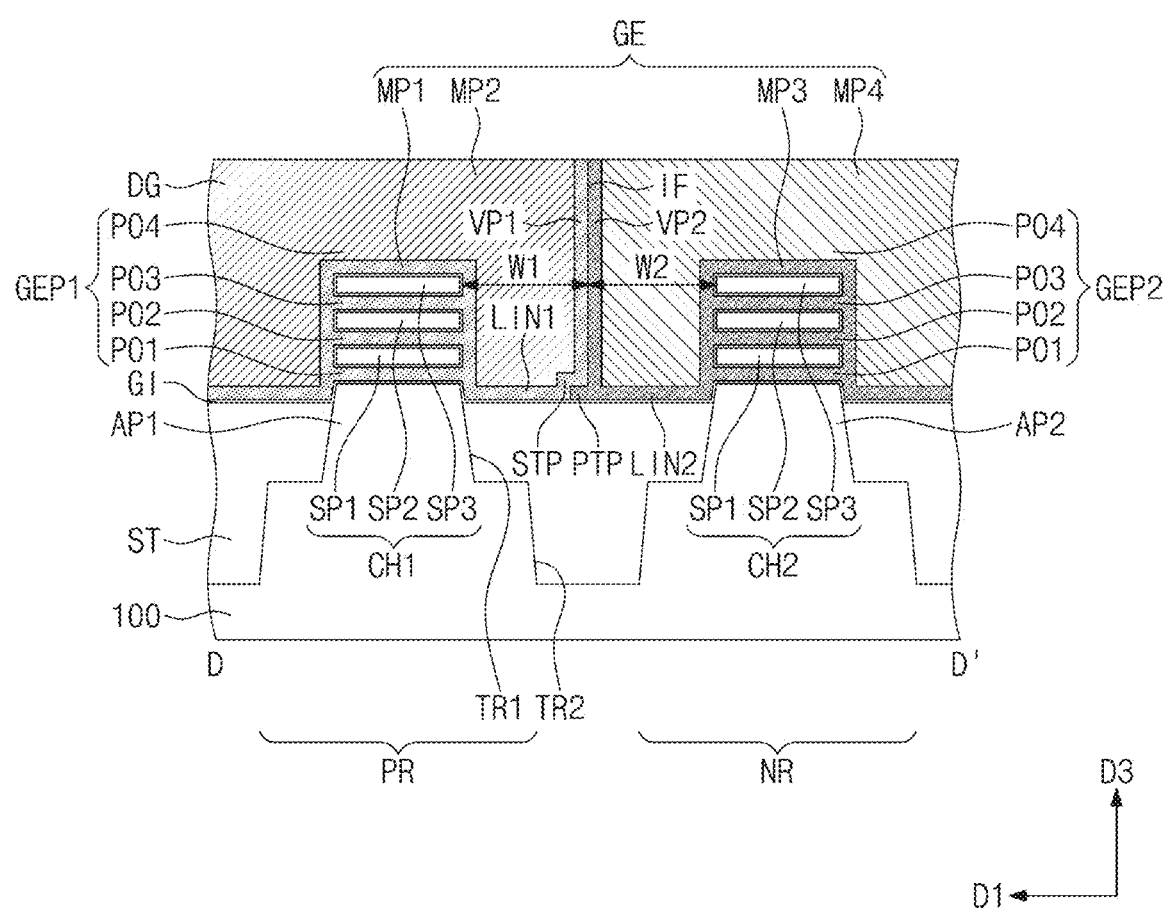

Referring to FIGS. 16A to 16C, a second metal layer (not shown) may be formed on the first metal layer MPL. The second metal layer may be formed of or include the same material as the first metal layer MPL. The second metal layer may be formed to conformally cover the gate insulating layer GI and the first metal layer MPL. The first metal layer MPL and the second metal layer may constitute the first metal pattern MP1.

The first metal pattern MP1 may include the first line portion LIN1, which is extended to a region on the device isolation layer ST between the first and second active regions PR and NR. The first line portion LIN1 may be extended parallel to the top surface of the device isolation layer ST. The first line portion LIN1 may be in contact with the protruding portion PTP.

The first metal pattern MP1 may further include the stepwise portion STP covering the protruding portion PTP. The stepwise portion STP may be extended from the first line portion LIN1 to cover the protruding portion PTP. The stepwise portion STP may be located at a level higher than the first line portion LIN1.

The first metal pattern MP1 may further include the first vertical portion VP1 which is extended from the first line portion LIN1 and the stepwise portion STP vertically (e.g., in the third direction D3). Each of the first vertical portion VP1 and the stepwise portion STP may be vertically overlapped with the protruding portion PTP.

The second metal pattern MP2 may be formed on the first metal pattern MP1. The second metal pattern MP2 may be formed to fill the remainder of the first empty space ET1 (see, e.g., FIG. 15C). Accordingly, the first electrode portion GEP1 may be formed on the first active region PR. A planarization process may be performed on the second metal pattern MP2 such that the second metal pattern MP2 has a top surface coplanar with the first vertical portion VP1. Since the first electrode portion GEP1 is formed, a process of forming the gate electrode GE may be finished.

According to some example embodiments, the first electrode portion GEP1 and the second electrode portion GEP2 may be independently formed. Accordingly, it may be possible to easily control a material, composition, thickness, and/or the like of each of the first and third metal patterns MP1 and MP3 and a material, composition, and/or the like of each of the second and fourth metal patterns MP2 and MP4. As a result, the transistors on the first and second active regions PR and NR may be more easily fabricated to have their respective desired threshold voltages.

Referring back to FIGS. 1 and 2A to 2D, the gate capping pattern GP may be formed on the gate electrode GE. For example, the formation of the gate capping pattern GP may include etching an upper portion of the gate electrode GE and forming the gate capping pattern GP on the etched gate electrode GE.

The second interlayer insulating layer 120 may be formed on the first interlayer insulating layer 110. The second interlayer insulating layer 120 may include an insulator, and may, for example, be formed of and/or include silicon oxide layer. The active contacts AC may be formed to penetrate the second interlayer insulating layer 120 and the first interlayer insulating layer 110 and to be electrically connected to the first and second source/drain patterns SD1 and SD2. The gate contact GC may be formed to penetrate the second interlayer insulating layer 120 and the gate capping pattern GP and to be electrically connected to the gate electrode GE.

A pair of the division structures DB may be formed at both sides of the logic cell LC. The division structure DB may be formed to penetrate the second interlayer insulating layer 120, a remaining portion of the sacrificial pattern PP, and an upper portion of the active pattern AP1 or AP2 below the sacrificial pattern PP. The division structure DB may be formed of or include at least one insulating material (e.g., silicon oxide and/or silicon nitride).

The third interlayer insulating layer 130 may be formed on the active contacts AC and the gate contacts GC. The first metal layer M1 may be formed in the third interlayer insulating layer 130. The fourth interlayer insulating layer 140 may be formed on the third interlayer insulating layer 130. The second metal layer M2 may be formed in the fourth interlayer insulating layer 140.

Figure 17:
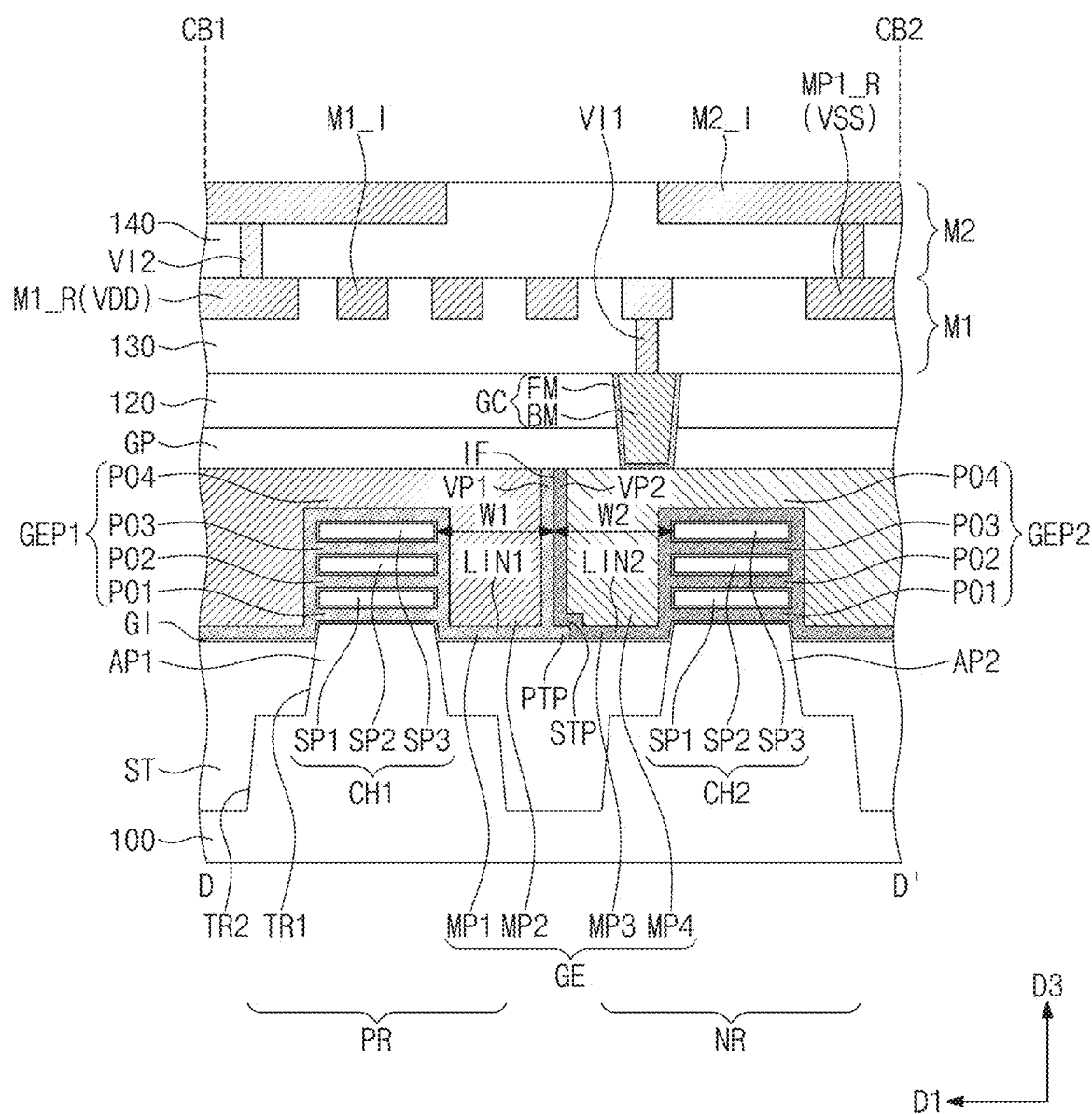
FIG. 17 is a sectional view, which is taken along the line D-D' of FIG. 1 to illustrate a semiconductor device according to some example embodiments.

FIG. 17 is a sectional view, which is taken along the line D-D' of FIG. 1 to illustrate a semiconductor device according to some example embodiments. For concise description, an element previously described with reference to FIGS. 1 and 2A to 2D may be identified by the same reference number without repeating an overlapping description thereof.

Referring to FIGS. 1 and 17, the first metal pattern MP1 may include the first line portion LIN1, which is extended to a region on the device isolation layer ST between the first and second active regions PR and NR, the first vertical portion VP1, which is vertically extended from the first line portion LIN1, and the protruding portion PTP, which is extended from the first line portion LIN1 toward the third metal pattern MP3.

The third metal pattern MP3 may include the second line portion LIN2, which is extended to a region on the device isolation layer ST between the first and second active regions PR and NR, the stepwise portion STP, which is extended from the second line portion LIN2 to cover the protruding portion PTP, and the second vertical portion VP2, which is vertically extended to be in contact with the first vertical portion VP1.

Figure 18:
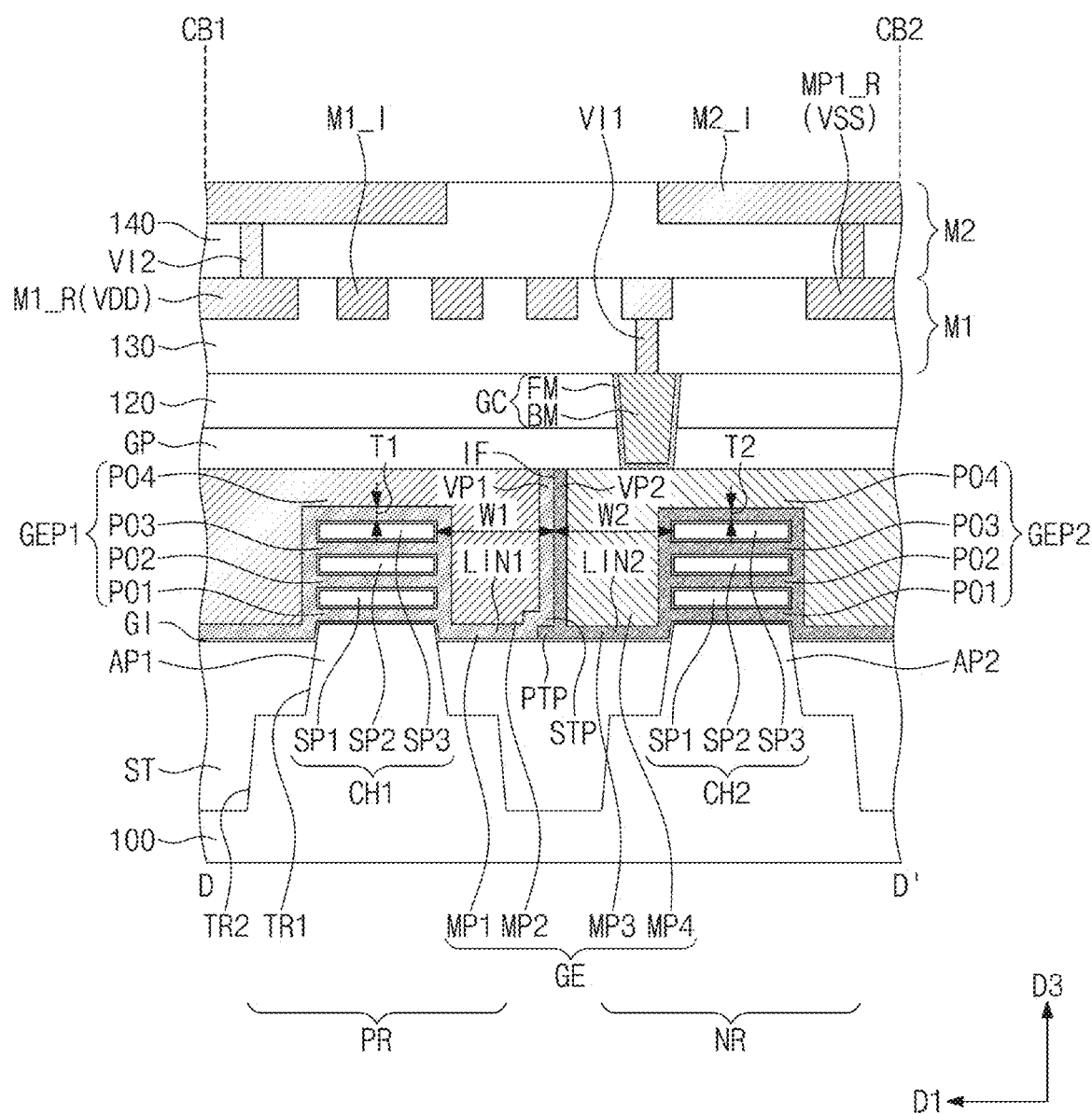
FIG. 18 is a sectional view, which is taken along the line D-D' of FIG. 1 to illustrate a semiconductor device according to some example embodiments.

FIG. 18 is a sectional view, which is taken along the line D-D' of FIG. 1 to illustrate a semiconductor device according to some example embodiments. For concise description, an element previously described with reference to FIGS. 1 and 2A to 2D may be identified by the same reference number without repeating an overlapping description thereof.

Referring to FIGS. 1 and 18, the first and third metal patterns MP1 and MP3 may be formed of and/or include the same material. A thickness of the first metal pattern MP1 may be a first thickness T1. A thickness of the third metal pattern MP3 may be a second thickness T2. The first thickness T1 may be larger than the second thickness T2.

According to some example embodiments, it may be possible to independently form the first and third metal patterns MP1 and MP3. In other words, it may be possible to respectively form the first and third metal patterns MP1 and MP3 to different thicknesses and thereby to control the threshold voltages of the transistors more easily.

FIGS. 19A to 19D are sectional views, which are respectively taken along the lines A-A', B-B', C-C', and D-D' of FIG. 1 to illustrate a semiconductor device according to some example embodiments. For concise description, an element previously described with reference to FIGS. 1 and 2A to 2D may be identified by the same reference number without repeating an overlapping description thereof.

Figure 19A:
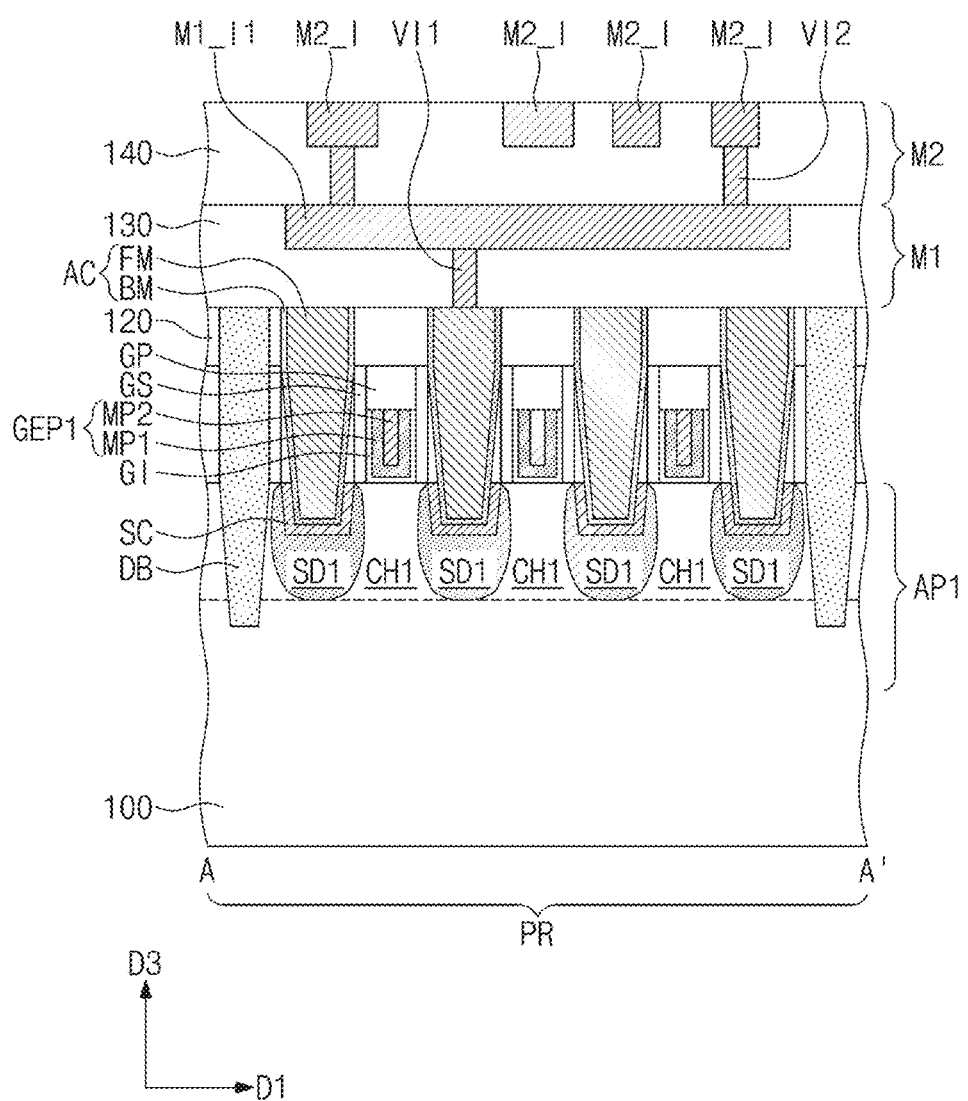
FIGS. 19A to 19D are sectional views, which are respectively taken along the lines A-A', B-B', C-C', and D-D' of FIG. 1 to illustrate a semiconductor device according to some example embodiments.
Figure 19B:
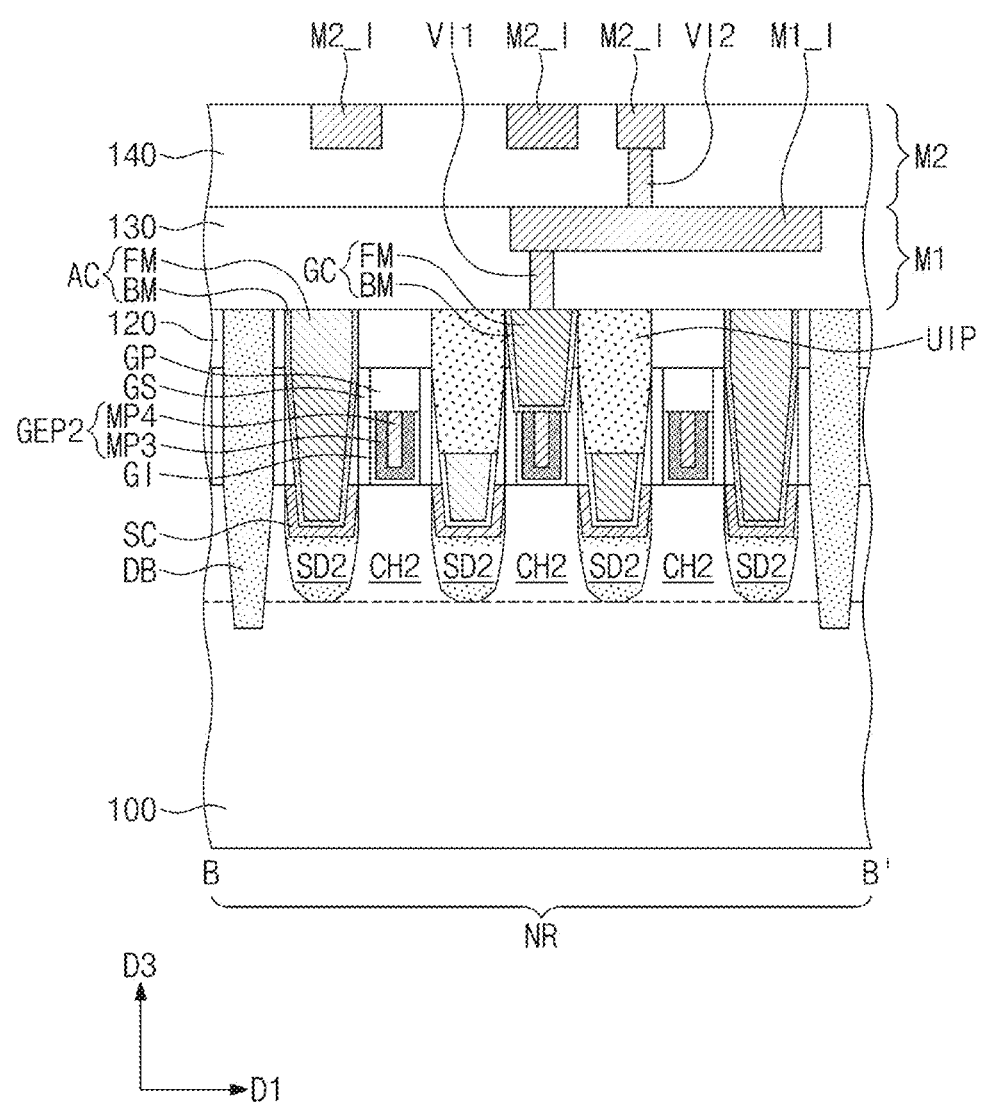
Figure 19C:
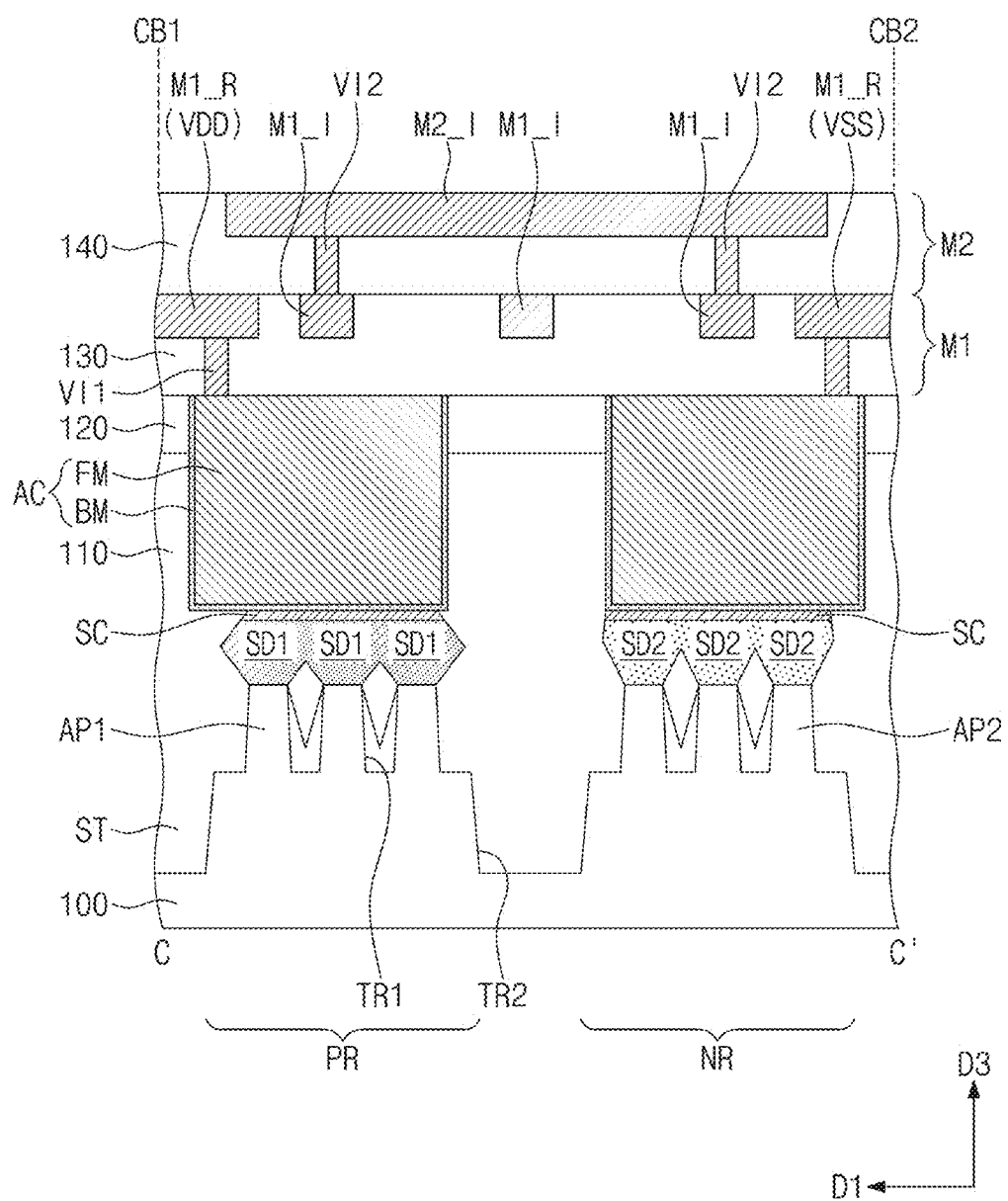
Figure 19D:
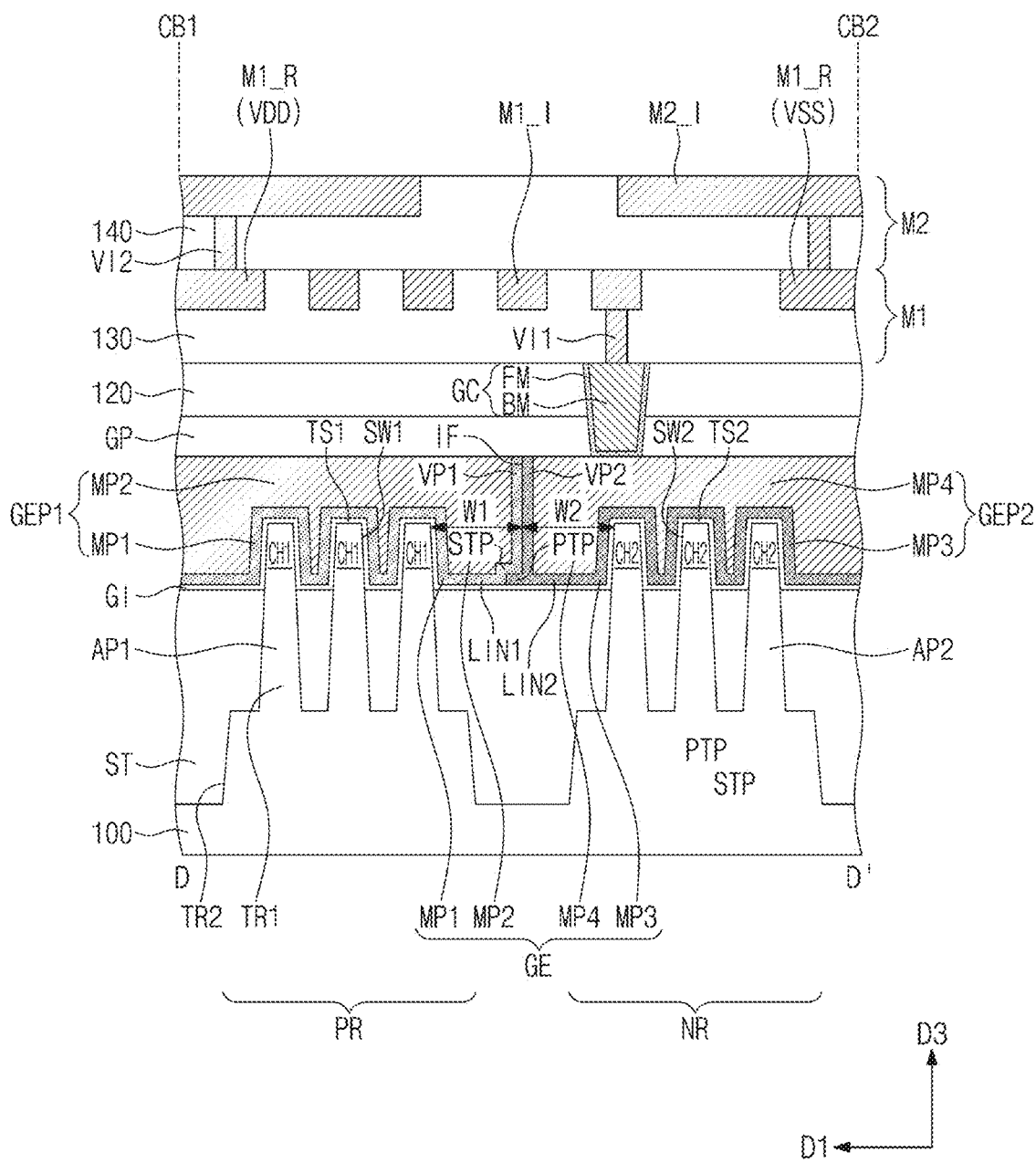

Referring to FIGS. 1 and 19A to 19D, upper portions of the first and second active patterns AP1 and AP2 may protrude vertically above the device isolation layer ST (e.g., see FIG. 19D). Each of the upper portions of the first and second active patterns AP1 and AP2 may be a fin-shaped pattern. The device isolation layer ST may not cover the upper portions of the first and second active patterns AP1 and AP2. The device isolation layer ST may cover lower side surfaces of the first and second active patterns AP1 and AP2.

The first source/drain patterns SD1 may be provided in the upper portions of the first active patterns AP1. The first source/drain patterns SD1 may be impurity regions of the first conductivity type (e.g., a p-type). The first channel pattern CH1 may be interposed between each pair of the first source/drain patterns SD1. The second source/drain patterns SD2 may be provided in the upper portions of the second active patterns AP2. The second source/drain patterns SD2 may be impurity regions of the second conductivity type (e.g., an n-type). The second channel pattern CH2 may be interposed between each pair of the second source/drain patterns SD2.

The first and second source/drain patterns SD1 and SD2 may be epitaxial patterns, which are formed by a selective epitaxial growth process. As an example, the first and second source/drain patterns SD1 and SD2 may have top surfaces that are coplanar with top surfaces of the first and second channel patterns CH1 and CH2. Alternatively, the top surfaces of the first and second source/drain patterns SD1 and SD2 may be higher than the top surfaces of the first and second channel patterns CH1 and CH2.

The gate electrodes GE may be provided to cross the first and second active patterns AP1 and AP2 and to extend in the first direction D1. The gate electrodes GE may be arranged with a first pitch in the second direction D2. The gate electrodes GE may be vertically overlapped with the first and second channel patterns CH1 and CH2. Each of the gate electrodes GE may be provided to face a top surface and opposite side surfaces of each of the first and second channel patterns CH1 and CH2.

Referring back to FIG. 2D, the gate electrode GE may be provided on a first top surface TS1 of the first channel pattern CH1 and on at least one first side surface SW1 of the first channel pattern CH1. The gate electrode GE may be provided on a second top surface TS2 of the second channel pattern CH2 and on at least one second side surface SW2 of the second channel pattern CH2. For example, the transistor according to the example embodiments may be a three-dimensional field-effect transistor (e.g., FinFET), in which the gate electrode GE is provided to three-dimensionally surround the channel pattern CH1 or CH2.

The gate insulating layer GI may be provided between the gate electrode GE and the first active pattern AP1 and between the gate electrode GE and the second active pattern AP2. The gate insulating layer GI may be extended along a bottom surface of the gate electrode GE. As an example, the gate insulating layer GI may cover the first top surface TS1 and the first side surfaces SW1 of the first channel pattern CH1. The gate insulating layer GI may cover the second top surface TS2 and the second side surface SW2 of the second channel pattern CH2. The gate insulating layer GI may cover the top surface of the device isolation layer ST below the gate electrode GE.

The gate electrode GE may include the first electrode portion GEP1 on the first active region PR and the second electrode portion GEP2 on the second active region NR. The first electrode portion GEP1 may include the first metal pattern MP1 covering the first active pattern AP1 and the second metal pattern MP2 on the first metal pattern MP1. The second electrode portion GEP2 may include the third metal pattern MP3 covering the second active pattern AP2 and the fourth metal pattern MP4 on the third metal pattern MP3. The first to fourth metal patterns MP1 to MP4 may be provided to have substantially the same features as those in the embodiment previously described with reference to FIGS. 1 and 2A to 2D and/or with reference to FIGS. 17 and 18.

According to some example embodiments of the inventive concepts, by using a dummy gate and an etch stop layer, it may be possible to form a work function metal (e.g., a first and/or third metal pattern) in a manner of filling an empty space. Accordingly, it may be possible to prevent the first metal pattern and the third metal pattern from being improperly (e.g., excessively and/or insufficiently) etched by an etching process and to prevent the first metal pattern and the third metal pattern from being misaligned to each other. As a result, the semiconductor device may have improved electric characteristics.

In addition, according to some example embodiments of the inventive concepts, a first electrode portion, which includes a first metal pattern and a second metal pattern, and a second electrode portion, which includes a third metal pattern and a fourth metal pattern, may be independently formed. Accordingly, it may be possible to easily control a material, composition, thickness, and/or the like of each of the first and third metal patterns and a material, composition, and/the like of each of the second and fourth metal patterns. As a result, the transistors on the first and second active regions may be more easily fabricated to have their respective desired threshold voltages.

While some example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
   a substrate including a first active region, a second active region adjacent to the first active region, and trench between the first active region and the second active region;
   a device isolation layer filling the trench;
   a first active pattern on the first active region;
   a second active pattern on the second active region;
   a gate electrode extending to cross the first active pattern and the second active pattern, the gate electrode comprising a first electrode portion on the first active region and a second electrode portion on the second active region; and a gate capping pattern including an insulating material on a top surface of the gate electrode, wherein the first electrode portion comprises a first metal pattern covering the first active pattern and a second metal pattern on the first metal pattern, the second electrode portion comprises a third metal pattern covering the second active pattern and a fourth metal pattern on the third metal pattern, the first metal pattern comprises a first line portion and a first vertical portion, the first line portion extending parallel to a top surface of the device isolation layer, and the first vertical portion extending vertically from the first line portion, the third metal pattern comprises a second line portion and second vertical portion, the second line portion extending parallel to the top surface of the device isolation layer, and the second vertical portion extending vertically from the second line portion, the first vertical portion having a first side surface facing a second side surface of the second vertical portion, the first side surface of the first vertical portion physically contacts the second side surface of the second vertical portion, the first vertical portion is electrically connected to the second vertical portion through an electrical path traversing directly through the first side surface and the second side surface, and a bottom surface of the gate capping pattern physically contacts a top surface of the first vertical portion and a top surface of the second vertical portion.

2. The semiconductor device of claim 1, further comprising:

a first source/drain pattern on the first active pattern;
a second source/drain pattern on the second active pattern;
a first channel pattern connected to the first source/drain pattern; and
a second channel pattern connected to the second source/drain pattern,
wherein a smallest distance between the first channel pattern and the second vertical portion is substantially equal to a smallest distance between the second channel pattern and the first vertical portion.

3. The semiconductor device of claim 2, wherein the first channel pattern and the second channel pattern each comprise a plurality of semiconductor patterns, which are vertically spaced apart from each other.

4. The semiconductor device of claim 3, wherein
the first metal pattern fills a space between the plurality of semiconductor patterns of the first channel pattern, and
the third metal pattern fills a space between the plurality of semiconductor patterns of the second channel pattern.

5. The semiconductor device of claim 1, wherein
the third metal pattern further comprises a protruding portion, the protruding portion protruding from the second line portion toward the first metal pattern, and
the first metal pattern further comprises a stepwise portion, the stepwise portion extending from the first line portion to cover the protruding portion.

6. The semiconductor device of claim 5, wherein the first vertical portion is vertically overlapping with the protruding portion.

7. The semiconductor device of claim 1, wherein the first metal pattern comprises a different material from the third metal pattern.

8. The semiconductor device of claim 1, wherein
a thickness of the first metal pattern is larger than a thickness of the third metal pattern, and
the first metal pattern and the third metal pattern comprise the same material.

9. The semiconductor device of claim 1, wherein the first vertical portion and the second vertical portion are between the second metal pattern and the fourth metal pattern.

10. The semiconductor device of claim 1, wherein
the first active region is a p-type metal-oxide-semiconductor field effect transistor ("PMOSFET") region, and
the second active region is an n-type metal-oxide-semiconductor field effect transistor ("NMOSFET") region.

11. A semiconductor device, comprising:
a first active pattern and a second active pattern on a substrate;
a device isolation layer filling a trench between the first active pattern and the second active pattern;
a first source/drain pattern on the first active pattern;
a second source/drain pattern on the second active pattern;
a first channel pattern connected to the first source/drain pattern;
a second channel pattern connected to the second source/drain pattern;
a gate electrode extending to cross the first channel pattern and the second channel pattern, the gate electrode comprises a first electrode portion on the first active pattern and a second electrode portion on the second active pattern; and
a gate capping pattern including an insulating material on a top surface of the gate electrode,
wherein the first electrode portion comprises a first metal pattern covering the first active pattern and a second metal pattern on the first metal pattern,
the second electrode portion comprises a third metal pattern covering the second active pattern and a fourth metal pattern on the third metal pattern,
the first metal pattern comprises a first line portion, a first vertical portion, and a protruding portion, the first line portion extending parallel to a top surface of the device isolation layer, the first vertical portion extending vertically from the first line portion, and the protruding portion protruding from the first line portion toward the third metal pattern,
the third metal pattern comprises a second line portion, a second vertical portion, and a stepwise portion, the second line portion extending parallel to the top surface of the device isolation layer, the stepwise portion covering the protruding portion, and the second vertical portion extending vertically from the stepwise portion and vertically overlapping the protruding portion,
the first vertical portion having a first side surface facing a second side surface of the second vertical portion,
the first side surface of the first vertical portion physically contacts the second side surface of the second vertical portion,
the first vertical portion is electrically connected to the second vertical portion through an electrical path traversing directly through the first side surface and the second side surface, and
a bottom surface of the gate capping pattern physically contacts a top surface of the first vertical portion and a top surface of the second vertical portion.

12. The semiconductor device of claim 11, wherein a smallest distance between the first channel pattern and the second vertical portion is substantially equal to a smallest distance between the second channel pattern and the first vertical portion.

13. The semiconductor device of claim 11, wherein the first metal pattern comprises a different material from the third metal pattern.

14. The semiconductor device of claim 11, wherein the second metal pattern comprises a different material from the fourth metal pattern.

15. A semiconductor device, comprising:
a substrate including a first active region, a second active region adjacent to the first active region in a first direction, and a trench between the first active region and the second active region;
a device isolation layer filling the trench;
a first active pattern on the first active region;
a second active pattern on the second active region;
a first source/drain pattern on the first active pattern;
a second source/drain pattern on the second active pattern;
a first channel pattern connected to the first source/drain pattern, the first channel pattern comprising a first semiconductor pattern, a second semiconductor pattern, and a third semiconductor pattern vertically spaced apart from each other;
a second channel pattern connected to the second source/drain pattern, the second channel pattern comprising a first semiconductor pattern, a second semiconductor pattern, and a third semiconductor pattern which are vertically spaced apart from each other;
a gate electrode extending in the first direction to cross the first channel pattern and the second channel pattern, the gate electrode comprising a first electrode portion on the first active region, and a second electrode portion on the second active region, the gate electrode comprising, for at least one of the first channel pattern or the second channel pattern, a first portion between the substrate and the first semiconductor pattern, a second portion between the first semiconductor pattern and the second semiconductor pattern, a third portion between the second semiconductor pattern and the third semiconductor pattern, and a fourth portion on the third semiconductor pattern;
a gate insulating layer interposed between the first channel pattern and the gate electrode and between the second channel pattern and the gate electrode;
a gate spacer on a side surface of the gate electrode;
a gate capping pattern including an insulating material on a top surface of the gate electrode;
a first interlayer insulating layer on the gate capping pattern;
active contacts penetrating the first interlayer insulating layer and coupled to the first source/drain pattern and the second source/drain pattern, respectively;
a gate contact penetrating the first interlayer insulating layer and coupled to the gate electrode;
a second interlayer insulating layer on the first interlayer insulating layer;
a first metal layer in the second interlayer insulating layer, the first metal layer comprising lower interconnection lines electrically connected to the active contacts and the gate contact, respectively;
a third interlayer insulating layer on the second interlayer insulating layer; and
a second metal layer provided in the third interlayer insulating layer, the second metal layer comprising upper interconnection lines electrically connected to the lower interconnection lines, respectively,
wherein the first electrode portion comprises a first metal pattern covering the first active pattern and a second metal pattern on the first metal pattern,
the second electrode portion comprises a third metal pattern covering the second active pattern and a fourth metal pattern on the third metal pattern,
the first metal pattern comprises a first line portion and first vertical portion, the first line portion extending parallel to a top surface of the device isolation layer, and the first vertical portion extending vertically from the first line portion,
the third metal pattern comprises a second line portion and a second vertical portion, the second line portion extending parallel to the top surface of the device isolation layer, and the second vertical portion extending vertically from the second line portion,
the first vertical portion of the first metal pattern having a first side surface facing a second side surface of the second vertical portion of the third metal pattern,
the first side surface of the first vertical portion physically contacts the second side surface of the second vertical portion,
the first vertical portion of the first metal pattern is electrically connected to the second vertical portion of the third metal pattern through an electrical path traversing directly through the first side surface and the second side surface of the first vertical portion and the second vertical portion, and
a bottom surface of the gate capping pattern physically contacts a top surface of the first vertical portion and a top surface of the second vertical portion.

16. The semiconductor device of claim 15, wherein the first portion, the second portion, and the third portion of the gate electrode each comprise one of the first metal pattern or the third metal pattern.

17. The semiconductor device of claim 15, wherein
the first active region is a p-type metal-oxide-semiconductor field effect transistor ("PMOSFET") region,
the second active region is an n-type metal-oxide-semiconductor field effect transistor ("NMOSFET") region,
a thickness of the first metal pattern is larger than a thickness of the third metal pattern, and
the first metal pattern and the third metal pattern comprise the same material.

18. The semiconductor device of claim 15, wherein
the first metal pattern further comprises a protruding portion protruding from the first line portion toward the third metal pattern, and
the third metal pattern further comprises a stepwise portion extending from the second line portion to cover the protruding portion.

19. The semiconductor device of claim 15, wherein the second metal pattern is spaced apart from the fourth metal pattern by the first vertical portion and the second vertical portion.

* * * * *